United States Patent
Li et al.

(10) Patent No.: US 12,174,763 B2
(45) Date of Patent: Dec. 24, 2024

(54) MEMORY TRAINING METHOD, MEMORY CONTROLLER, PROCESSOR, AND ELECTRONIC DEVICE

(71) Applicant: HUAWEI TECHNOLOGIES CO., LTD., Guangdong (CN)

(72) Inventors: Nianbing Li, Shenzhen (CN); Yongyao Li, Shenzhen (CN); Zhongjian Chen, Hangzhou (CN); Shibin Xu, Dongguan (CN); Liangyi Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/192,019

(22) Filed: Mar. 29, 2023

(65) Prior Publication Data

US 2023/0244617 A1 Aug. 3, 2023

Related U.S. Application Data

(63) Continuation of application No. PCT/CN2021/116509, filed on Sep. 3, 2021.

(30) Foreign Application Priority Data

Sep. 30, 2020 (CN) .......................... 202011063745.4

(51) Int. Cl.
G06F 13/16 (2006.01)
(52) U.S. Cl.
CPC .................. *G06F 13/1689* (2013.01)
(58) Field of Classification Search
None
See application file for complete search history.

(56) References Cited

U.S. PATENT DOCUMENTS

2004/0123207 A1* 6/2004 Zumkehr ............. G11C 7/1066
714/744
2007/0226529 A1* 9/2007 Huang ...................... G06F 5/06
713/401

(Continued)

FOREIGN PATENT DOCUMENTS

| CN | 108646984 A | 10/2018 |
|---|---|---|
| JP | H0764850 A | 3/1995 |

(Continued)

OTHER PUBLICATIONS

Japanese Office Action Notice of Reasons for Rejection for Application No. 2023-519763 dated Jun. 26, 2024, 11 pages.

(Continued)

*Primary Examiner* — Farley Abad
*Assistant Examiner* — Dayton Lewis-Taylor

(57) ABSTRACT

This application provides a memory training method, a memory controller, a processor, and an electronic device. The memory controller keeps transmission delays of N DQs unchanged, adjusts a transmission delay of a DQS, and determines a maximum DQS transmission delay and/or a minimum DQS transmission delay of the DQS when all data carried in the N DQs is correctly transmitted. The memory controller adjusts the transmission delay of the DQS to a target DQS transmission delay between the maximum DQS transmission delay and the minimum DQS transmission delay. The method helps quickly align relative timing positions between the DQS and the N DQs. Therefore, memory training may be repeatedly performed in a working process of the processor, so that the N DQs keep long enough timing margins.

20 Claims, 25 Drawing Sheets

(56) References Cited

U.S. PATENT DOCUMENTS

| | | | |
|---|---|---|---|
| 2009/0085647 A1 | 4/2009 | Hwang | |
| 2020/0265881 A1* | 8/2020 | Jeter | .................... G11C 29/028 |
| 2021/0065757 A1* | 3/2021 | Li | ........................ G11C 7/1066 |

FOREIGN PATENT DOCUMENTS

| | | |
|---|---|---|
| JP | 2010157113 A | 7/2010 |
| JP | 2011059762 A | 3/2011 |
| JP | 2011253250 A | 12/2011 |
| JP | 2020030521 A | 2/2020 |
| JP | 2020046918 A | 3/2020 |
| JP | 2020104337 A | 7/2020 |
| KR | 20200077077 A | 6/2020 |

OTHER PUBLICATIONS

Extended European Search Report for Application No. 21874185.8 dated Feb. 5, 2024, 12 pages.
Chinese Office Action for Application No. 202011063745 dated May 27, 2024, 8 pages.
Korean Office Action for Application No. 2023-7014261 dated Jul. 24, 2024, 20 pages.

* cited by examiner

MEMORY TRAINING METHOD, MEMORY CONTROLLER, PROCESSOR, AND ELECTRONIC DEVICE

CROSS-REFERENCE TO RELATED APPLICATIONS

This application is a continuation of International Application No. PCT/CN2021/116509 filed on Sep. 3, 2021, which claims priority to Chinese Patent Application No. 202011063745.4, filed on Sep. 30, 2020. The disclosures of the aforementioned applications are hereby incorporated by reference in their entireties.

TECHNICAL FIELD

This application relates to the field of memory training technologies, and in particular, to a memory training method, a memory controller, a processor, and an electronic device.

BACKGROUND

In most of the current electronic devices, a processor and a memory chip are integrated. The memory chip is an operation basis for the processor, and the processor may be coupled to the memory chip through a memory controller. The memory controller is connected to the memory chip through a memory bus. The memory bus mainly includes at least one data signal line and a timing signal line. Each data signal line may transmit a data signal. In this application, DQ is used to represent the data signal. DQ is short for a data signal defined in a double data rate synchronous dynamic random access memory (DDR SDRAM) protocol, which is also referred to as a DDR protocol. A timing signal line may transmit a data strobe signal. In this application, DQS is used to represent the data strobe signal. DQS is short for a data strobe signal defined in the DDR protocol. Both DQ and DQS are periodic signals, and generally have a same period length.

In most cases, the processor may read data from the memory chip through the memory controller, or write data to the memory chip through the memory controller. In a process of reading, by the memory controller, data from the memory chip, the memory controller may instruct the memory chip to send a DQ and a DQS to the memory controller. The DQ may carry data that is to be read by the memory controller in the memory chip. The DQS may trigger the memory controller to identify a level status of the DQ. The memory controller may further obtain, based on the level status of the DQ signal, the data carried in the DQ signal.

In a process of writing, by the memory controller, data to the memory chip, the memory controller may send a DQ and a DQS to the memory chip. The DQ may carry data that is to be written to the memory chip by the memory controller. The DQS may trigger the memory chip to identify a level status of the DQ. Further, the data carried in the DQ may be written to the memory chip.

It can be learned from the foregoing process of reading data by the memory controller from the memory chip and the process of writing data by the memory controller to the memory chip that accuracy of data transmission between the memory controller and the memory chip depends on alignment of relative timing positions between a DQS and a DQ. In other words, only when the DQ has a long enough timing margin relative to the DQS, a receiving end of the DQ can have a low bit error rate, thereby ensuring the accuracy of data transmission.

Although most electronic devices perform, after being powered on, memory initialization that includes complex memory training and may accurately align relative timing positions between the DQS and the DQ, the relative timing positions between the DQS and the DQ may still be offset after the electronic devices complete the memory initialization due to objective factors such as ambient temperature and error accumulation. However, a current method used for memory training takes an excessively long time. Therefore, memory training cannot be repeatedly performed in a working process of the electronic device. As a working time of the electronic device is prolonged, a relative timing position offset between the DQS and the DQ is gradually increased. In the electronic device, a bit error rate of data transmission between the memory controller and the memory chip is gradually increased, and the accuracy of data transmission is reduced accordingly.

SUMMARY

In view of this, this application provides a memory training method, which helps align relative timing positions between DQSs and DQs transmitted in the same direction within a short time. Therefore, memory training may be repeatedly performed in a working process of a processor, so that DQs transmitted between a memory controller and a memory chip keep sufficient timing margins.

According to a first aspect, embodiments of this application provide a memory training method. The method may be applied to a memory controller, and mainly includes the following steps: The memory controller keeps transmission delays of N DQs unchanged, adjusts a transmission delay of a DQS, and determines a maximum DQS transmission delay and/or a minimum DQS transmission delay of the DQS when all data carried in the N DQs is correctly transmitted. The memory controller adjusts the transmission delay of the DQS to a target DQS transmission delay between the maximum DQS transmission delay and the minimum DQS transmission delay. An interval between the target DQS transmission delay and the maximum DQS transmission delay is not less than a target hold time applicable to a receiving end, and/or an interval between the target DQS transmission delay and the minimum DQS transmission delay is not less than a target setup time applicable to a receiving end.

In embodiments of this application, the N DQs and the DQS are signals transmitted in the same direction. For example, the N DQs and the DQS are all transmitted from the memory controller to the memory chip, or the N DQs and the DQS are all transmitted from the memory chip to the memory controller. The DQS may trigger the receiving end of the N DQs to identify level statuses of the N DQs. Adjustment of the transmission delay of the DQS by the memory controller is used to adjust a phase of the DQS.

Specifically, when the N DQs and the DQS are transmitted from the memory controller to the memory chip, the receiving end of the N DQs is the memory chip, and the transmission delay of the DQS is a sending delay of the DQS. The memory controller adjusts the sending delay of the DQS to a target DQS sending delay between a maximum DQS sending delay and a minimum DQS sending delay. An interval between the target DQS sending delay and the maximum DQS sending delay is not less than a target hold time applicable to the memory chip, and/or an interval between the target DQS sending delay and the minimum DQS sending delay is not less than a target setup time applicable to the memory chip. In this case, the condition that all data carried in the N DQs is correctly transmitted may be understood as that the memory chip can correctly identify the level statuses of the N DQs, so that all data carried in the N DQs may be correctly written to the memory chip.

When the N DQs and the DQS are transmitted from the memory chip to the memory controller, the receiving end of the N DQs is the memory controller, and the transmission delay of the DQS is a receiving delay of the DQS. The memory controller adjusts the receiving delay of the DQS to a target DQS receiving delay between a maximum DQS receiving delay and a minimum DQS receiving delay. An interval between the target DQS receiving delay and the maximum DQS receiving delay is not less than a target hold time applicable to the memory controller, and/or an interval between the target DQS receiving delay and the minimum DQS receiving delay is not less than a target setup time applicable to the memory controller. In this case, the condition that all data carried in the N DQs is correctly transmitted may be understood as that the memory controller can correctly identify the level statuses of the N DQs, so that data carried in the N DQs may be correctly read.

In the technical solution provided in embodiments of this application, the memory controller may align relative timing positions between the N DQs and the DQS by adjusting the transmission delay of the DQS, so that the N DQs have sufficient timing margins. Compared with a memory training solution in which transmission delays of the DQS and the N DQs are respectively adjusted, a transmission delay adjustment step is reduced in embodiments of this application, thereby helping quickly align relative timing positions between the DQS and the N DQs. Therefore, memory training may be repeatedly performed in a working process of the processor, so that the N DQs keep sufficient timing margins.

Next, a specific implementation in which the memory controller determines a minimum DQS transmission delay is further described by example.

In a possible implementation, the memory controller may gradually reduce the transmission delay of the DQS starting from an initial DQS transmission delay until an error occurs in transmission of data carried in at least one DQ. In this case, the transmission delay of the DQS may be used as a minimum DQS transmission delay.

In another possible implementation, the memory controller may first reduce the transmission delay of the DQS to a first DQS transmission delay. An interval between the first DQS transmission delay and the transmission delay of the DQS before reduction is the target setup time applicable to the receiving end. When an error occurs in transmission of data carried in at least one DQ, the memory controller gradually increases the transmission delay of the DQS, and determines that the corresponding transmission delay of the DQS is the minimum DQS transmission delay of the DQS when all data carried in the N DQs is correctly transmitted.

The transmission delay of the DQS before reduction may be an initial DQS transmission delay, for example, may be the transmission delay of the DQS before the memory controller starts to perform this memory training or when the memory controller starts to perform this memory training.

Since the target setup time applicable to the receiving end is usually less than duration of a half-period of the DQ, an interval between the reduced transmission delay of the DQS and the minimum transmission delay does not exceed the target setup time applicable to the receiving end. With this implementation, steps of adjusting the transmission delay of the DQS can be reduced, and the minimum DQS transmission delay can be quickly determined.

For example, when gradually increasing the transmission delay of the DQS, the memory controller may gradually increase the transmission delay of the DQS in a manner of increasing a first DQS adjustment amplitude each time. The first DQS adjustment amplitude is less than the target setup time applicable to the receiving end. For example, the first DQS adjustment amplitude may be a minimum adjustment amplitude of the transmission delay of the DQS by the memory controller.

Next, a specific implementation in which the memory controller determines a maximum DQS transmission delay is further described by example.

In a possible implementation, the memory controller may gradually increase the transmission delay of the DQS starting from an initial DQS transmission delay until an error occurs in transmission of data carried in at least one DQ. In this case, the transmission delay of the DQS may be used as a maximum DQS transmission delay.

In another possible implementation, the memory controller may increase the transmission delay of the DQS to a second DQS transmission delay. An interval between the second DQS transmission delay and the transmission delay of the DQS before increase is a target hold time applicable to the receiving end. When an error occurs in transmission of data carried in at least one DQ, the memory controller gradually reduces the transmission delay of the DQS, and determines that the corresponding transmission delay of the DQS is a maximum DQS transmission delay of the DQS when all data carried in the N DQs is correctly transmitted.

The transmission delay of the DQS before increase may be an initial DQS transmission delay, for example, may be the transmission delay of the DQS before the memory controller starts to perform this memory training or when the memory controller starts to perform this memory training.

This implementation helps reduce a count of adjusting the transmission delay of the DQS, and thus helps quickly determine the maximum DQS transmission delay. A specific analysis is similar to the foregoing determining of a minimum DQS transmission delay, and details are not described herein again.

For example, when gradually reducing the transmission delay of the DQS, the memory controller may gradually reduce the transmission delay of the DQS by reducing a second DQS adjustment amplitude each time. The second DQS adjustment amplitude is less than the target hold time applicable to the receiving end. For example, the second DQS adjustment amplitude may be a minimum adjustment amplitude of the transmission delay of the DQS by the memory controller.

According to a second aspect, embodiments of this application provide a memory training method. The method may be applied to a memory controller, and mainly includes the following steps: The memory controller keeps a transmission delay of a DQS unchanged, adjusts a transmission delay of a first DQ, and determines a maximum DQ transmission delay and/or a minimum DQ transmission delay of the first DQ when data carried in the first DQ is correctly transmitted. The memory controller adjusts the transmission delay of the first DQ to a target DQ transmission delay between the maximum DQ transmission delay and the minimum DQ transmission delay. An interval between the target DQ transmission delay and the maximum DQ transmission delay is not less than a target setup time applicable to the receiving end, and/or an interval between the target DQ transmission delay and the minimum DQ transmission delay is not less than a target hold time applicable to the receiving end.

In embodiments of this application, the DQS and the first DQ are signals transmitted in the same direction. For example, the DQS and the first DQ may be both transmitted from the memory controller to the memory chip, or both transmitted from the memory chip to the memory controller. The DQS may trigger a receiving end of the first DQ to identify a level status of the first DQ. Adjustment of the transmission delay of the first DQ by the memory controller is used to adjust a phase of the first DQ.

Specifically, when the first DQ and the DQS are transmitted from the memory controller to the memory chip, the receiving end of the first DQ is the memory chip, the transmission delay of the first DQ is a sending delay of the first DQ, and the memory controller adjusts the sending delay of the first DQ to a target DQ sending delay between a maximum DQ sending delay and a minimum DQ sending delay. An interval between the target DQ sending delay and the maximum DQ sending delay is not less than a target setup time applicable to the memory chip, and/or an interval between the target DQ sending delay and the minimum DQ sending delay is not less than a target setup time applicable to a target chip.

When the first DQ and the DQS are transmitted from the memory chip to the memory controller, the receiving end of the first DQ is the memory controller, the transmission delay of the first DQ is a receiving delay of the first DQ, and the memory controller adjusts the receiving delay of the first DQ to a target DQ receiving delay between a maximum DQ receiving delay and a minimum DQ receiving delay. An interval between the target DQ receiving delay and the maximum DQ receiving delay is not less than a target setup time applicable to the memory controller, and/or an interval between the target DQ receiving delay and the minimum DQ receiving delay is not less than a target hold time applicable to the memory controller.

In embodiments of this application, the DQS may correspond to N DQs, that is, the DQS may trigger a receiving end of the N DQs to identify level statuses of the N DQs. In embodiments of this application, the first DQ is located in the N DQs, and may be one of the DQs. In this case, before adjusting the transmission delay of the first DQ, the memory controller may further determine, according to a round-robin rule, that a next DQ following a DQ on which memory training is previously completed in the N DQs is the first DQ.

In embodiments of this application, the memory controller adjusts a transmission delay of only one DQ (first DQ) in each memory training process. Compared with a memory training solution in which transmission delays of a DQS and a DQ are respectively adjusted, embodiments of this application reduce a transmission delay adjustment step, thereby helping quickly align relative timing positions between the DQS and the first DQ. In addition, when a transmission delay of one DQ is adjusted, the processor may still access the memory chip through another DQ, thereby further reducing impact of memory training on working of the processor. Therefore, memory training may be repeatedly performed in a working process of the processor, so that the N DQs keep sufficient timing margins.

Next, a manner in which the control circuit determines a minimum DQ transmission delay is further described:

In a possible implementation, the memory controller may gradually reduce the transmission delay of the first DQ starting from an initial DQ transmission delay until an error occurs in transmission of data carried in the first DQ. In this case, the transmission delay of the first DQ may be used as a minimum DQ transmission delay.

In another possible implementation, the memory controller may reduce the transmission delay of the first DQ to a first DQ transmission delay. An interval between the first DQ transmission delay and the transmission delay of the first DQ before reduction is the target hold time applicable to the receiving end. When an error occurs in transmission of data carried in the first DQ, the memory controller may gradually increase the transmission delay of the first DQ, and determine that the corresponding transmission delay of the first DQ is a minimum DQ transmission delay when data carried in the first DQ is correctly transmitted.

The transmission delay of the first DQ before reduction may be an initial DQ transmission delay, for example, may be the transmission delay of the first DQ before the memory controller may start to perform this memory training or when the memory controller may start to perform this memory training.

The target hold time applicable to the receiving end is usually less than a half-period of the first DQ, and an interval between the reduced transmission delay of the first DQ and the minimum DQ transmission delay does not exceed the target hold time applicable to the receiving end. Therefore, this implementation helps reduce a count of adjusting the first DQ transmission delay, so that the minimum DQ transmission delay may be quickly determined.

For example, when gradually increasing the transmission delay of the first DQ, the memory controller may gradually increase the transmission delay of the first DQ in a manner of increasing a first DQ adjustment amplitude each time. The first DQ adjustment amplitude is less than the target hold time applicable to the receiving end. For example, the first DQ adjustment amplitude is a minimum adjustment amplitude of the transmission delay of the first DQ by the delay circuit.

Next, a manner in which the memory controller determines a maximum DQ transmission delay is further described:

In a possible implementation, the memory controller may gradually increase the transmission delay of the first DQ starting from an initial DQ transmission delay until an error occurs in transmission of data carried in the first DQ. In this case, the transmission delay of the first DQ may be used as a maximum DQ transmission delay.

In another possible implementation, the memory controller may increase the transmission delay of the first DQ to a second DQ transmission delay. An interval between the second DQ transmission delay and the transmission delay of the first DQ before increase is the target hold time applicable to the receiving end. When an error occurs in transmission of data carried in the first DQ, the control circuit may control the delay circuit to gradually reduce the transmission delay of the first DQ, and determine that the corresponding transmission delay of the first DQ is a maximum DQ transmission delay when data carried in the first DQ is correctly transmitted.

The transmission delay of the first DQ before increase may be an initial DQ transmission delay, for example, may be the transmission delay of the first DQ before the control circuit starts to perform this memory training or when the control circuit starts to perform this memory training.

This implementation helps reduce a count of adjusting the first DQ transmission delay, and thus helps quickly determine the maximum DQ transmission delay. A specific analysis is similar to the foregoing determining of a minimum DQ transmission delay, and details are not described herein again.

For example, the control circuit may control the delay circuit to gradually reduce the transmission delay of the first DQ by reducing a second DQ adjustment amplitude each time. The second DQ adjustment amplitude is less than the target setup time applicable to the receiving end. For example, the second DQ adjustment amplitude may be a minimum adjustment amplitude of the transmission delay of the first DQ by the delay circuit.

According to a third aspect, embodiments of this application provide a memory controller. The memory controller may implement the memory training method provided in any one of the first aspect. For technical effects of the corresponding solution in the third aspect, reference may be made to technical effects that may be obtained by the corresponding solution in the first aspect. Repetitions are not described in detail.

For example, the memory controller mainly includes a delay circuit and a control circuit. The delay circuit may generate a transmission delay of a DQS under the control of the control circuit. The delay circuit adjusts the transmission delay of the DQS, and may adjust a phase of the DQS. The control circuit may control the delay circuit to keep transmission delays of N DQs unchanged, control the delay circuit to adjust a transmission delay of a DQS, and thus determine a maximum DQS transmission delay and/or a minimum DQS transmission delay of the DQS when all data carried in the N DQs is correctly transmitted. The foregoing N DQs and DQS are all transmitted from the memory controller to the memory chip, or all transmitted from the memory chip to the memory controller, and the DQS may trigger the receiving end of the N DQs to identify level statuses of the N DQs. When the N DQs and the DQS are transmitted from the memory controller to the memory chip, the receiving end of the N DQs is the memory chip. When the N DQs and the DQS are transmitted from the memory chip to the memory controller, the receiving end of the N DQs is the memory controller. The control circuit controls the delay circuit to adjust the transmission delay of the DQS to a target DQS transmission delay between the maximum DQS transmission delay and the minimum DQS transmission delay. An interval between the target DQS transmission delay and the maximum DQS transmission delay is not less than a target hold time applicable to the receiving end, and/or an interval between the target DQS transmission delay and the minimum DQS transmission delay is not less than a target setup time applicable to the receiving end.

Specifically, the N DQs and the DQS may be transmitted from the memory controller, and the transmission delay of the DQS is a sending delay of the DQS. In this case, the control circuit may control the delay circuit to adjust the sending delay of the DQS to a target DQS sending delay between a maximum DQS sending delay and a minimum DQS sending delay.

The N DQs and the DQS may also be transmitted from the memory chip to the memory controller, and the transmission delay of the DQS is a receiving delay of the DQS. In this case, the control circuit may control the delay circuit to adjust the receiving delay of the DQS to a target DQS receiving delay between a maximum DQS receiving delay and a minimum DQS receiving delay.

Next, a manner in which the control circuit determines a minimum DQS transmission delay is further described:

In a possible implementation, the control circuit may control the delay circuit to gradually reduce the transmission delay of the DQS starting from an initial DQS transmission delay until an error occurs in transmission of data carried in at least one DQ. In this case, the transmission delay of the DQS may be used as a minimum DQS transmission delay.

In another possible implementation, the control circuit may control the delay circuit to reduce the transmission delay of the DQS to a first DQS transmission delay. An interval between the first DQS transmission delay and the transmission delay of the DQS before reduction is a target setup time applicable to the receiving end. When an error occurs in transmission of data carried in at least one DQ, the control circuit controls the delay circuit to gradually increase the transmission delay of the DQS, and determine that the corresponding transmission delay of the DQS is the minimum DQS transmission delay of the DQS when all data carried in the N DQs is correctly transmitted.

The transmission delay of the DQS before reduction may be an initial DQS transmission delay, for example, may be the transmission delay of the DQS before the control circuit starts to perform this memory training or when the control circuit starts to perform this memory training.

For example, when controlling the delay circuit to gradually increase the transmission delay of the DQS, the control circuit may control the delay circuit to gradually increase the transmission delay of the DQS in a manner of increasing a first DQS adjustment amplitude each time. The first DQS adjustment amplitude is less than the target setup time applicable to the receiving end. For example, the first DQS adjustment amplitude may be a minimum adjustment amplitude of the transmission delay of the DQS by the delay circuit.

Next, a manner in which the control circuit determines a maximum DQS transmission delay is further described:

In a possible implementation, the control circuit may control the delay circuit to gradually increase the transmission delay of the DQS starting from an initial DQS transmission delay until an error occurs in transmission of data carried in at least one DQ. In this case, the transmission delay of the DQS may be used as a maximum DQS transmission delay.

In another possible implementation, the control circuit may control the delay circuit to increase the transmission delay of the DQS to a second DQS transmission delay. An interval between the second DQS transmission delay and the transmission delay of the DQS before increase is a target hold time applicable to the receiving end. When an error occurs in transmission of data carried in at least one DQ, the control circuit controls the delay circuit to gradually reduce the transmission delay of the DQS, and determine that the corresponding transmission delay of the DQS is a maximum DQS transmission delay of the DQS when all data carried in the N DQs is correctly transmitted.

The transmission delay of the DQS before increase may be an initial DQS transmission delay, for example, may be the transmission delay of the DQS before the control circuit starts to perform this memory training or when the control circuit starts to perform this memory training.

For example, when controlling the delay circuit to gradually reduce the transmission delay of the DQS, the control circuit may control the delay circuit to gradually reduce the transmission delay of the DQS by reducing a second DQS adjustment amplitude each time. The second DQS adjustment amplitude is less than the target hold time applicable to the receiving end. For example, the second DQS adjustment amplitude may be a minimum adjustment amplitude of the transmission delay of the DQS by the delay circuit.

According to a fourth aspect, embodiments of this application provide a memory controller. The memory controller may implement the memory training method provided in any one of the second aspect. For technical effects of the corresponding solution in the fourth aspect, refer to technical effects that can be obtained by the corresponding solution in the second aspect. Repetitions are not described in detail. For example:

The delay circuit may generate a transmission delay of a first DQ under the control of the control circuit. The delay circuit adjusts the transmission delay of the first DQ, and may adjust a phase of the first DQ. The control circuit may control the delay circuit to keep a transmission delay of a DQS unchanged, control the delay circuit to adjust the transmission delay of the first DQ, and thus determine a maximum DQ transmission delay and/or a minimum DQ transmission delay of the first DQ when data carried in the first DQ is correctly transmitted. The DQS and the first DQ are both transmitted from the memory controller to the memory chip, or both transmitted from the memory chip to the memory controller. The DQS may trigger the receiving end of the first DQ to identify a level status of the first DQ. When the first DQ and the DQS are transmitted from the memory controller to the memory chip, the receiving end of the first DQ is the memory chip. When the first DQ and the DQS are transmitted from the memory chip to the memory controller, the receiving end of the first DQ is the memory controller. The control circuit controls the delay circuit to adjust the transmission delay of the first DQ to a target DQ transmission delay between the maximum DQ transmission delay and the minimum DQ transmission delay. An interval between the target DQ transmission delay and the maximum DQ transmission delay is not less than a target setup time applicable to the receiving end, and/or an interval between the target DQ transmission delay and the minimum DQ transmission delay is not less than a target hold time applicable to the receiving end.

The DQS may correspond to N DQs, and the first DQ is located in the N DQs. Before controlling the delay circuit to keep the transmission delay of the DQS unchanged and controlling the delay circuit to adjust the transmission delay of the first DQ, the control circuit may further first determine, according to a round-robin rule, that a next DQ following a DQ on which memory training is previously completed in the N DQs is the first DQ.

Specifically, the first DQ and the DQS may be both transmitted from the memory controller to the memory chip, and the transmission delay of the first DQ is a sending delay of the first DQ. In this case, the control circuit may control the delay circuit to adjust the sending delay of the first DQ to a target DQ sending delay between a maximum DQ sending delay and a minimum DQ sending delay.

The first DQ and the DQS may also be both transmitted from the memory chip to the memory controller, and the transmission delay of the first DQ is a receiving delay of the first DQ. In this case, the control circuit may control the delay circuit to adjust the receiving delay of the first DQ to a target DQ receiving delay between a maximum DQ receiving delay and a minimum DQ receiving delay.

Next, a manner in which the control circuit determines a minimum DQ transmission delay is further described:

In a possible implementation, the control circuit may control the delay circuit to gradually reduce the transmission delay of the first DQ starting from an initial DQ transmission delay until an error occurs in transmission of data carried in the first DQ. In this case, the transmission delay of the first DQ may be used as a minimum DQ transmission delay.

In another possible implementation, the control circuit may control the delay circuit to reduce the transmission delay of the first DQ to a first DQ transmission delay. An interval between the first DQ transmission delay and the transmission delay of the first DQ before reduction is a target hold time applicable to the receiving end. When an error occurs in transmission of data carried in the first DQ, the control circuit may control the delay circuit to gradually increase the transmission delay of the first DQ, and determine that the corresponding transmission delay of the first DQ is a minimum DQ transmission delay when data carried in the first DQ is correctly transmitted.

The transmission delay of the first DQ before reduction may be an initial DQ transmission delay, for example, may be the transmission delay of the first DQ before the control circuit starts to perform this memory training or when the control circuit starts to perform this memory training.

For example, when controlling the delay circuit to gradually increase the transmission delay of the first DQ, the control circuit may control the delay circuit to gradually increase the transmission delay of the first DQ in a manner of increasing a first DQ adjustment amplitude each time. The first DQ adjustment amplitude is less than the target hold time applicable to the receiving end. For example, the first DQ adjustment amplitude is a minimum adjustment amplitude of the transmission delay of the first DQ by the delay circuit.

Next, a manner in which the control circuit determines a maximum DQ transmission delay is further described:

In a possible implementation, the control circuit may control the delay circuit to gradually increase the transmission delay of the first DQ starting from an initial DQ transmission delay until an error occurs in transmission of data carried in the first DQ. In this case, the transmission delay of the first DQ may be used as a maximum DQ transmission delay.

In another possible implementation, the control circuit may control the delay circuit to increase the transmission delay of the first DQ to a second DQ transmission delay. An interval between the second DQ transmission delay and the transmission delay of the first DQ before increase is a target hold time applicable to the receiving end. When an error occurs in transmission of data carried in the first DQ, the control circuit may control the delay circuit to gradually reduce the transmission delay of the first DQ, and determine that the corresponding transmission delay of the first DQ is a maximum DQ transmission delay when data carried in the first DQ is correctly transmitted.

The transmission delay of the first DQ before increase may be an initial DQ transmission delay, for example, may be the transmission delay of the first DQ before the control circuit starts to perform this memory training or when the control circuit starts to perform this memory training.

For example, the control circuit may control the delay circuit to gradually reduce the transmission delay of the first DQ by reducing a second DQ adjustment amplitude each time. The second DQ adjustment amplitude is less than the target setup time applicable to the receiving end. For example, the second DQ adjustment amplitude may be a minimum adjustment amplitude of the transmission delay of the first DQ by the delay circuit.

According to a fifth aspect, embodiments of this application provide a memory training apparatus. The memory training apparatus may be a memory controller. For example, the memory training apparatus may perform the memory training method provided in any one of the first aspect or the second aspect. Specifically, the second communications apparatus may include a module configured to perform the method in the second aspect or any one of the possible implementations, for example, including a control unit and a delay unit.

For example, the delay unit may apply a transmission delay to the DQS or the first DQ, and the control unit may adjust the transmission delay of the DQS or the first DQ by controlling the delay unit, so that the memory training apparatus can perform the memory training method provided in any one of the first aspect or the second aspect.

According to a sixth aspect, embodiments of this application further provide a processor. The processor may include a processor core and the memory controller provided in any one of the third aspect or the fourth aspect. The processor core may send a trigger instruction to the memory controller. The memory controller may perform memory training after receiving the trigger instruction.

For example, the processor core may send a trigger instruction to the memory controller when determining that a difference between a current ambient temperature and a historical ambient temperature exceeds a temperature fluctuation threshold. The historical ambient temperature is an ambient temperature at which the processor core sends the trigger instruction previously.

For example, the processor core may send a trigger instruction to the memory controller when determining that a time interval between a current time point and a time point at which the processor core previously completes the memory training exceeds a time threshold.

According to a seventh aspect, this application provides an electronic device. The electronic device may include the processor provided in the sixth aspect and a memory chip. The memory chip is connected to the memory controller in the processor.

According to an eighth aspect, embodiments of this application provide an electronic device. The electronic device mainly includes a processor, a memory chip, and a memory controller. The memory controller may be the memory controller provided in any one of the third aspect or the fourth aspect. The memory controller is connected to the processor and the memory chip, respectively.

The processor may send a trigger instruction to the memory controller. The memory controller may perform memory training after receiving the trigger instruction.

For example, the processor may send a trigger instruction to the memory controller when determining that a difference between a current ambient temperature and a historical ambient temperature exceeds a temperature fluctuation threshold. The historical ambient temperature is an ambient temperature at which the processor sends the trigger instruction previously.

For another example, the processor may send a trigger instruction to the memory controller when determining that a time interval between a current time point and a time point at which the trigger instruction is previously sent exceeds a time threshold.

According to a ninth aspect, embodiments of this application further provide a computer-readable storage medium. The computer-readable storage medium stores instructions. When the instructions are run on a memory controller, the memory controller is enabled to perform the methods in the foregoing aspects.

According to a tenth aspect, embodiments of this application further provide a computer program product including an instruction. When the instructions are run on a memory controller, the memory controller is enabled to perform the methods in the foregoing aspects.

These aspects or other aspects of this application are clearer and more comprehensible in descriptions of the following embodiments.

DESCRIPTION OF EMBODIMENTS

To make objectives, technical solutions, and advantages of this application clearer, the following further describes this application in detail with reference to the accompanying drawings. A specific operation method in a method embodiment may also be applied to an apparatus embodiment or a system embodiment. It should be noted that, in the description of this application, "at least one" means one or more, and "a plurality of" means two or more. In view of this, in embodiments of this invention, "a plurality of" may also be understood as "at least two". The term "and/or" describes an association relationship for describing associated objects and represents that three relationships may exist. For example, A and/or B may represent the following three cases: Only A exists, both A and B exist, and only B exists. In addition, the character "/" generally indicates an "or" relationship between the associated objects. In addition, it should be understood that in description of this application, terms such as "first" and "second" are merely used for distinguishing and description, but should not be understood as indicating or implying relative importance, or should not be understood as indicating or implying a sequence.

The following clearly describes the technical solutions in embodiments of this application with reference to the accompanying drawings in embodiments of this application.

In electronic devices (for example, smart phones, tablet computers, base stations, smart cameras, self-driving vehicles, and the like), a memory chip is an operation basis for a processor. The processor may be coupled to the memory chip through a memory controller. The memory controller may be connected to the processor, or may be integrated inside the processor.

Figure 1:
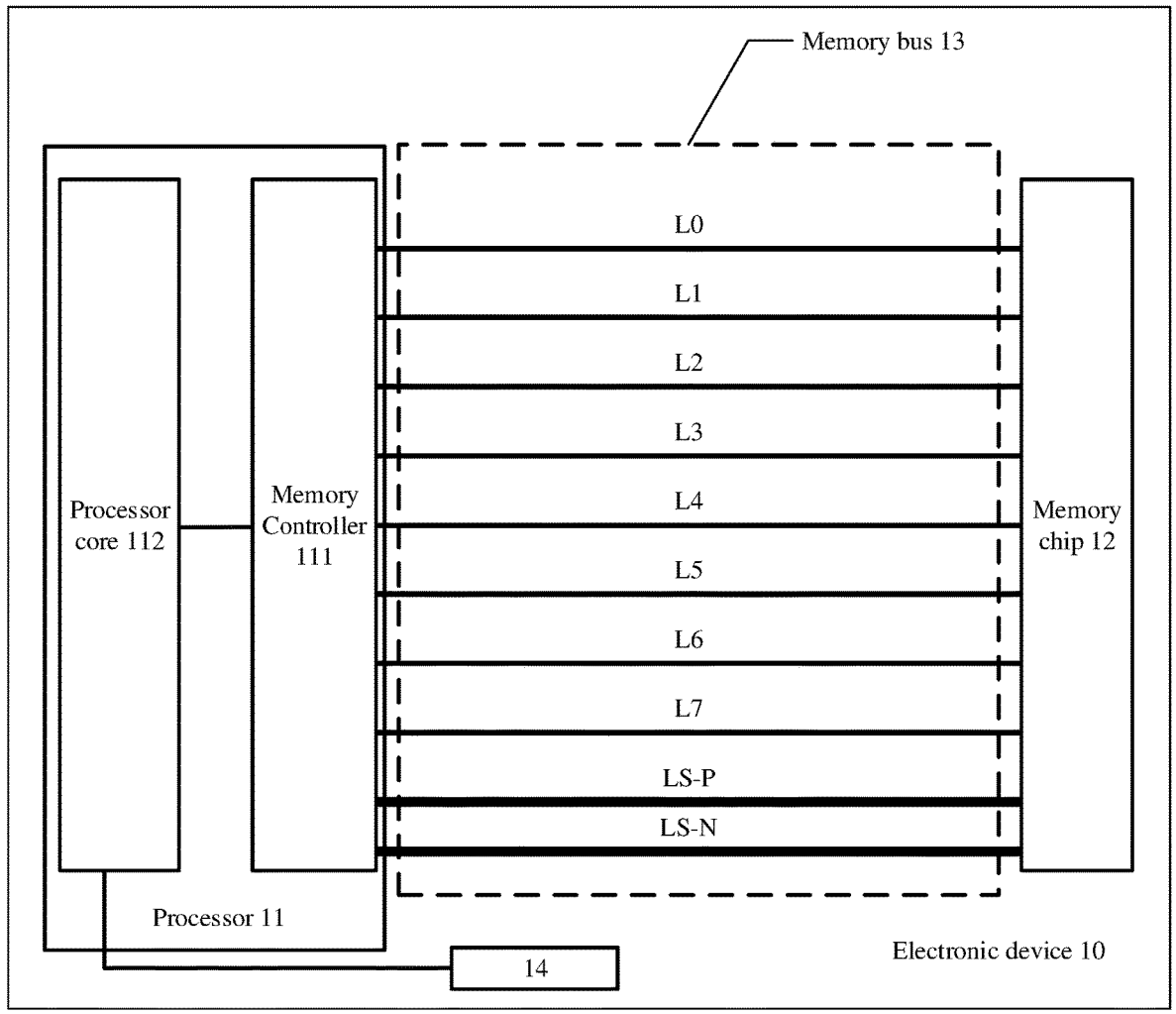
FIG. 1 is a schematic diagram of a structure of an electronic device.

For example, as shown in FIG. 1, an electronic device 10 mainly includes a processor 11 and a memory chip 12. The processor 11 includes a processor core 112 and a memory controller 111. In another possible architecture, the memory controller 111 is located outside the processor 11. Details are not described herein again.

In embodiments of this application, the processor core 112 may be a logic circuit that has a logic operation capability. The memory chip 12 may be a memory chip that supports a DDR SDRAM. DDR SDRAM is usually referred to as DDR for short. For example, the memory chip 12 may support a fifth-generation DDR (DDR5), such as a low power DDR5 (LPDDR5). The memory chip 12 may also support a fourth-generation DDR (DDR4), such as a low power DDR4 (LPDDR4).

In FIG. 1, the memory controller 111 and the memory chip 12 are connected through a memory bus 13. The memory bus 13 mainly includes a plurality of data signal lines (data signal lines L0 to L7 in FIG. 1) and a plurality of timing signal lines (timing signal lines LS-P and LS-N in FIG. 1).

The data signal line L0 to the data signal line L7 may transmit eight data signals (DQ) in parallel. For example, the data signal line L0 may transmit DQ0, the data signal line L1 may transmit DQ1, . . . , and the data signal line L7 may transmit DQ7. It should be understood that the DQ is a periodic digital signal, and therefore can carry data. For example, the DQ may transmit one-bit data in a period. One-bit data "0" may be transmitted in a low-level period, and one-bit data "1" may be transmitted in a high-level period. Since the data signal line L0 to the data signal line L7 may transmit eight DQs in parallel, the data signal line L0 to the data signal line L7 transmit eight bits of data in total in a period.

It may be understood that, since the DQ is a digital signal, a receiving end of the DQ can correctly distinguish a period of the DQ by using a clock signal having a same period as the DQ, to correctly identify a level status of the DQ, thus correctly obtaining data carried in the DQ. In view of this, the memory bus 13 may further include a timing signal line LS-N and a timing signal line LS-P. The timing signal line LS-N and the timing signal line LS-P may transmit a data strobe signal (DQS).

Specifically, the timing signal line LS-N may transmit a DQS-N, and the timing signal line LS-P may transmit a DQS-P. The DQS-N and the DQS-P are inverted signals. For example, the DQS-N and the DQS-P may be shown in FIG. 2. The DQS includes the DQS-N and the DQS-P. The DQS may be used as a clock signal corresponding to the DQ, has same sending end and receiving end as those of the DQ, and may trigger the receiving end of the DQ to identify a level status of the DQ. For ease of description, in embodiments of this application, DQS represents DQS-N and DQS-P in the following.

It should be noted that bidirectional data transmission between the memory controller 111 and the memory chip 12 can be implemented through the memory bus 13. For example, in a process of writing, by the memory controller 111, data to the memory chip 12, the memory controller 111 may be used as the sending end of the DQS and the DQ, and the memory chip 12 may be used as the receiving end of the DQS and the DQ. In a process of reading, by the memory controller 111, data from the memory chip 12, the memory chip 12 may be used as the sending end of the DQS and the DQ, and the memory controller 111 may be used as the receiving end of the DQS and the DQ.

For ease of description, in embodiments of this application, a write DQ and a write DQS are used to respectively indicate a DQ and a DQS that are sent by the memory controller 111 to the memory chip 12 in the process of writing, by the memory controller 111, data to the memory chip 12. A read DQ and a read DQS are used to respectively indicate a DQ and a DQS that are sent by the memory chip 12 to the memory controller 111 in the process of reading, by the memory controller 111, data from the memory chip 12. The write DQ includes a write DQ0 to a write DQ7, and the read DQ includes a read DQ0 to a read DQ7.

Next, specific implementations of data writing and data reading are respectively described:

Scenario 1: The memory controller 111 writes data to the memory chip 12.

In a running process of the processor 11, the processor core 112 may invoke the memory controller 111 to write data to the memory chip 12. For a specific implementation of invoking the memory controller 111 by the processor core 112, refer to the prior art. This is not limited in embodiments of this application.

The memory controller 111 may write data to the memory chip 12 when being invoked by the processor core 112. Specifically, the memory controller 111 may send the write DQ0 to the write DQ7 to the memory chip 12 through the data signal line L0 to the data signal line L7. The write DQ0 to the write DQ7 sent by the memory controller 111 may carry target write data that needs to be written to the memory chip 12.

In the process of writing, by the memory controller 111, data to the memory chip 12, the memory controller 111 further sends a write DQS to the memory chip 12. The write DQS may trigger the memory chip 12 to identify level statuses of the write DQ0 to the write DQ7. The memory chip 12 may further store, based on the identified level statuses, data carried in the write DQ0 to the write DQ7, so that data is written to the memory chip 12.

Figure 2:
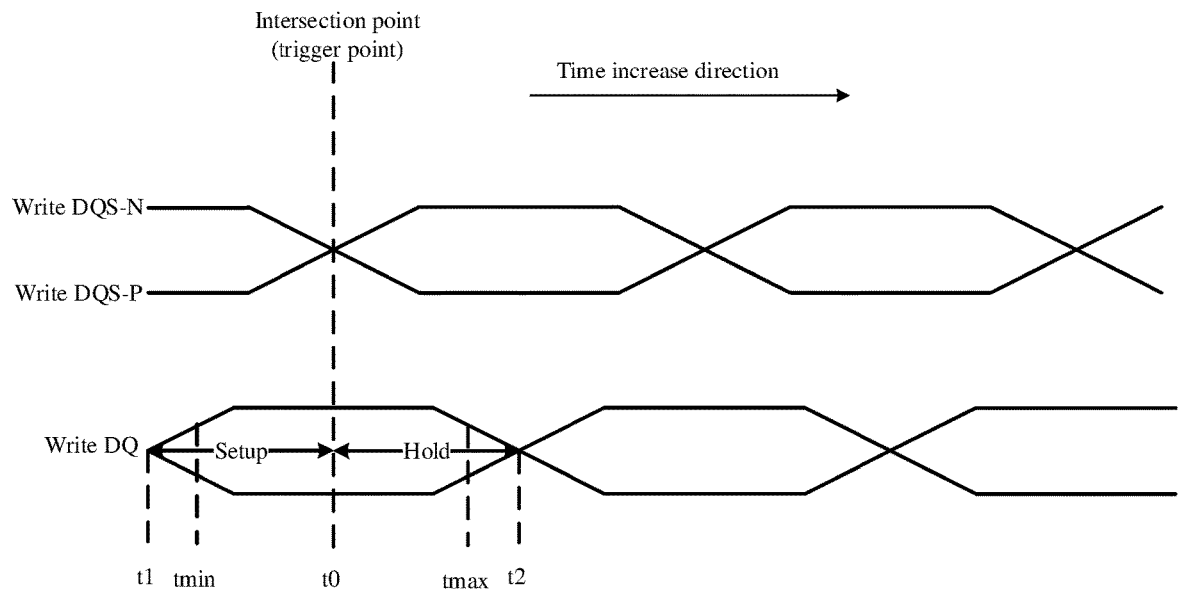
FIG. 2 is a schematic diagram of a corresponding relationship between a DQ and a DQS.

Generally, in the write DQS sent by the memory controller 111 to the memory chip 12, an intersection point (as shown in FIG. 2) between a write DQS-N and a write DQS-P may be used as a trigger point that triggers the memory chip 12 to identify a level status of the write DQ. In other words, when the memory chip 12 determines that the received write DQS is at an intersection point, the memory chip 12 may identify current level statues of the write DQ0 to the write DQ7. Therefore, target write data carried in the write DQ0 to the write DQ7 may be written to the memory chip 12.

For example, if the target write data is 11010011, the data corresponds to a same intersection point in the write DQS. In this case, data respectively carried in the write DQ0 to the write DQ7 is as follows. The write DQ0 may carry "1". The write DQ1 may carry "1". The write DQ2 may carry "0". The write DQ3 may carry "1". The write DQ4 may carry "0". The write DQ5 may carry "0". The write DQ6 may carry "1". The write DQ7 may carry "1".

When determining that the received write DQS is at an intersection point, the memory chip 12 may identify the level statuses of the received write DQ0 to the write DQ7. In the preceding example, the write DQ0 is at a high level (carrying "1"), the write DQ1 is at a high level (carrying "1"), the write DQ2 is at a low level (carrying "0"), the write DQ3 is at a high level (carrying "1"), the write DQ4 is at a low level (carrying "0"), the write DQ5 is at a low level (carrying "0"), the write DQ6 is at a high level (carrying "1"), and the write DQ7 is at a high level (carrying "1"). The memory chip 12 may further store the target write data "11010011" based on the identified level statuses of the write DQ0 to the write DQ7.

Scenario 2: The memory controller 111 reads data from the memory chip 12.

In a running process of the processor 11, the processor core 112 may invoke the memory controller 111 to read data from the memory chip 12. For a specific implementation of invoking the memory controller 111 by the processor core 112, refer to the prior art. This is not limited in embodiments of this application.

When being invoked by the processor core 112, the memory controller 111 may instruct the memory chip 12 to send target read data to the memory controller 111, so that the memory controller 111 reads the target read data in the memory chip 12. For a specific implementation of instructing, by the memory controller 111, the memory chip 12, refer to the prior art. This is not limited in embodiments of this application.

The memory chip 12 may send the read DQ0 to the read DQ7 to the memory controller 111 through the data signal line L0 to the data signal line L7. The read DQ0 to the read DQ7 may carry the target read data sent to the memory controller 111. When the memory chip 12 sends the read DQ0 to the read DQ7 to the memory controller 111, the memory chip 12 further sends the read DQS to the memory controller 111. The memory controller 111 may identify level statuses of the read DQ0 to the read DQ7 according to the read DQS, and obtain, based on the identified level statuses, the target read data carried in the read DQ0 to the read DQ7, thereby implementing data reading from the memory chip 12.

Specific implementations of the read DQS and the read DQ0 to the read DQ7 are similar to the foregoing scenario 1, and details are not described herein again. A difference lies in that in the read DQS sent by the memory chip 12 to the memory controller 111, an intermediate point between two adjacent intersection points may usually be used as a trigger point that triggers the memory controller 111 to identify the level statuses of the read DQ0 to the read DQ7. In other words, when the memory chip 12 determines that the received read DQS is at an intermediate point, the memory controller 111 may identify current level statuses of the read DQ0 to the read DQ7, to obtain the target read data carried in the read DQ0 to the read DQ7.

It can be learned from the foregoing scenario 1 and scenario 2, whether data can be accurately transmitted between the memory controller 111 and the memory chip 12 is closely related to whether relative timing positions between the DQS and the DQ transmitted in the same direction are aligned. The DQS and the DQ transmitted in the same direction may be understood as a read DQS and a read DQ, or may be understood as a write DQS and a write DQ.

The write DQS and the write DQ shown in FIG. 2 are used as an example. The write DQ may be any write DQ in the write DQ0 to the write DQ7. An intersection point of the write DQS is used as a trigger point, and a period of the write DQ corresponding to the intersection point refers to a certain write DQ period in which a moment of occurrence of the intersection point falls. It can be learned from FIG. 2 that, a trigger point (intersection point) of the write DQS may divide a period of a write DQ corresponding to the trigger point into two parts. The part before the trigger point is a setup time, and the part after the trigger point is a hold time. It is assumed that a start time point of any write DQ period received by the memory chip 12 is t1, an end time point of the write DQ period is t2, and a time point at which the write DQS received by the memory chip 12 is at the trigger point is to between t1 and t2. In this case, a time period between t1 and t0 may be referred to as a setup time, and a time period between t0 and t2 may be referred to as a hold time.

The setup time of the write DQ being long enough improves accuracy of data transmission. Specifically, since the write DQ is a digital signal, a level status of the write DQ is usually changing, that is, the write DQ may be at a low level or a high level in any period. The level status of the write DQ may remain unchanged, may change from a low level to a high level, or may change from a high level to a low level, between two adjacent periods.

Generally, the high level and the low level are relative to a reference level. In other words, if the level of the write DQ is lower than the reference level, the write DQ is at a low level. If the level of the write DQ is higher than the reference level, the write DQ is at a high level. When the level status of the write DQ changes, it usually takes a certain delay to complete level status switching. For example, as shown in FIG. 2, the level of the write DQ reaches the reference level at tmin and tmax.

For example, when a low level in a previous period is switched to a high level in a current period, if the setup time is not long enough, for example, t0 is between t1 and tmin, the level of the write DQ at t0 may not rise to a high level higher than the reference level. In this case, the memory chip 12 may mistakenly consider that the write DQ is at a low level in the current period. In other words, the write DQ in the current period should be at a high level, but since t0 is located between t1 and tmin and the level is not increased to be greater than the reference level, the write DQ in the current period is mistakenly identified as a low level. As a result, an error occurs in data written to the memory chip 12. Therefore, to ensure accuracy of data transmission between the memory controller 111 and the memory chip 12, it is necessary to ensure that the setup time is long enough.

The hold time of the write DQ being long enough also improves the accuracy of data transmission. Specifically, the memory chip 12 can identify the level status of the write DQ with a certain delay. For example, when a high level in a current period is switched to a low level in a next period, the memory chip 12 starts to identify the level status of the write DQ at t0. If the hold time is not enough, for example, t0 is between tmax and t2, the level of the write DQ may be reduced to be below the reference level during the period when the memory chip 12 identifies the level status of the write DQ (the write DQ is at a low level in the next period), so that the memory chip 12 mistakenly identifies the level of the current period as a low level, and further, an error occurs in data written to the memory chip 12. In other words, the write DQ in the current period should be at a high level, but is mistakenly considered to be at a low level since t0 is between tmax and t2 and the level is reduced to be below the reference level. Therefore, to ensure accuracy of data transmission between the memory controller 111 and the memory chip 12, it is necessary to ensure that the hold time is long enough.

In conclusion, to improve accuracy of data transmission between the memory controller 111 and the memory chip 12, both the hold time and the setup time of the write DQ need to have long duration. When duration of the hold time or the setup time of the write DQ is not long enough, the accuracy of data transmission between the memory controller 111 and the memory chip 12 is reduced, and a bit error rate is increased.

Generally, reference voltages in the memory controller 111 and the memory chip 12 have a same magnitude. In other words, for the write DQS and the write DQ shown in FIG. 2, a time interval between tmin and t1 may also be referred to as a minimum setup time applicable to the memory chip 12. A time interval between tmax and t2 may also be referred to as a minimum hold time applicable to the memory chip 12.

In a period of a write DQ, a difference between the setup time of the write DQS and the minimum setup time applicable to the memory chip 12 may be referred to as a timing margin of the setup time of the write DQ. A difference between the hold time of the write DQS and the minimum hold time applicable to the memory chip 12 may be referred to as a timing margin of the hold time of the write DQ. A minimum value of the timing margin of the setup time of the write DQ and the timing margin of the hold time may be understood as a timing margin of the write DQ. For example, in FIG. 2, the timing margin of the write DQ is a minimum value of a difference between t0 and tmin and a difference between tmax and t0.

Generally, a time interval between tmin and tmax is mainly determined by performance of the memory chip 12. In other words, for the memory controller 111, the sum of the timing margin of the setup time and the timing margin of the hold time of the write DQ is not adjustable. In this case, the memory controller 111 may adjust the time point to corresponding to an intersection point of the write DQS to an intermediate position of tmin and tmax, that is, the timing margin of the setup time of the write DQ is equal to the timing margin of the hold time. Therefore, the timing margin of the write DQ may reach a maximum value, so that accuracy of transmitting data by the memory controller 111 to the memory chip 12 can be optimized from the perspective of a timing margin.

Based on a same reason, in the process of reading, by the memory controller 111, data from the memory chip 12, a difference between the hold time of the read DQ sent by the memory chip 12 to the memory controller 111 and the minimum hold time applicable to the memory controller 111 may also be referred to as a timing margin of the hold time of the read DQ. A difference between the setup time of the read DQ and the minimum setup time applicable to the memory controller 111 may also be referred to as a timing margin of the setup time of the read DQ. The timing margin of the read DQ may be understood as a minimum value of the timing margin of the hold time of the read DQ and the timing margin of the setup time of the read DQ. When the timing margin of the hold time in the read DQ sent by the memory chip 12 to the memory controller 111 is equal to the timing margin of the setup time, the timing margin of the read DQ may reach a maximum value. In this case, accuracy of transmitting data by the memory chip 12 to the memory controller 111 can be optimized from the perspective of a timing margin.

To improve the timing margins of the read DQ and the write DQ to thereby improve accuracy of data transmission between the memory controller 111 and the memory chip 12, relative timing positions of the DQ and the DQS transmitted in the same direction usually need to be aligned. This process is also often referred to as memory training.

In embodiments of this application, "alignment" may be understood as that in the DQS and the DQ that are transmitted in the same direction, the timing margin of the hold time of the DQ is equal to the timing margin of the setup time. Alternatively, the timing margin of the hold time of the DQ is similar to the timing margin of the setup time, so that the DQ has a sufficient timing margin of the hold time and timing margin of the setup time. The timing margin of the setup time of the DQ is relative to the minimum setup time applicable to the receiving end, and the timing margin of the hold time of the DQ is also relative to the minimum hold time applicable to the receiving end. In other words, "alignment" may ensure that the setup time of the DQ is not less than the minimum setup time applicable to the receiving end, and that the hold time of the DQ is not less than the minimum hold time applicable to the receiving end.

The receiving end may be the memory chip 12, or may be the memory controller 111. The minimum setup time and the minimum hold time applicable to the receiving end may be obtained according to factors such as a structure and performance of the receiving end. If the setup time of the DQ is less than the minimum setup time applicable to the receiving end, or the hold time of the DQ is less than the minimum hold time applicable to the receiving end, the receiving end cannot correctly identify data carried in the DQ.

In view of this, when the electronic device 10 is powered on, memory training may be performed during initialization after the processor 11 is powered on, to align relative timing positions between the DQ and the DQS transmitted in the same direction. Currently, many complex memory training solutions appear. In most of the memory training solutions, the memory controller 111 mainly adjusts transmission delays of the DQ and the DQS, to change phases of the DQ and the DQS, thereby aligning relative timing positions of the DQ and DQS transmitted in the same direction.

Specifically, transmission delays of the write DQ and the write DQS may be referred to as sending delays. The memory controller 111 adjusts the sending delays of the write DQ and the write DQS, thereby aligning relative timing positions of the write DQ and the write DQS. The transmission delays of the read DQ and the read DQS may be referred to as receiving delays. The memory controller 111 adjusts the receiving delays of the read DQ and the read DQS, thereby aligning relative timing positions of the read DQ and the read DQS.

The sending delays of the write DQ and the write DQS may be understood as phase adjustment amplitudes applied by the memory controller 111 to the write DQ and the write DQS. Specifically, a plurality of phase adjusters respectively corresponding to a plurality of write DQs and write DQs are disposed in the memory controller 111. Taking a write DQS as an example, a write DQS signal generated by the memory controller 111 may be input to a phase adjuster corresponding to the write DQS, and the phase adjuster may apply a certain delay to the write DQS, that is, a sending delay of the write DQS. Thus, a phase of the output write DQS may be changed. The write DQS is output from the memory controller 111 only after being transmitted by the corresponding phase adjuster.

Similarly, the receiving delays of the read DQ and the read DQS may be understood as phase adjustment amplitudes applied by the memory controller 111 to the read DQ and the read DQS. Specifically, a plurality of phase adjusters respectively corresponding to a plurality of read DQs and read DQs are disposed in the memory controller 111. Taking a read DQS as an example, a read DQS signal received by the memory controller 111 may be input to a phase adjuster corresponding to the read DQS, and the phase adjuster may apply a certain delay to the read DQS, that is, a receiving delay of the read DQS. Thus, a phase of the received read DQS may be changed. After the read DQS is adjusted by the corresponding phase adjuster, the memory controller 111 further identifies a trigger point of the read DQS, and identifies a level status of the read DQ according to the identified trigger point.

Figure 3:
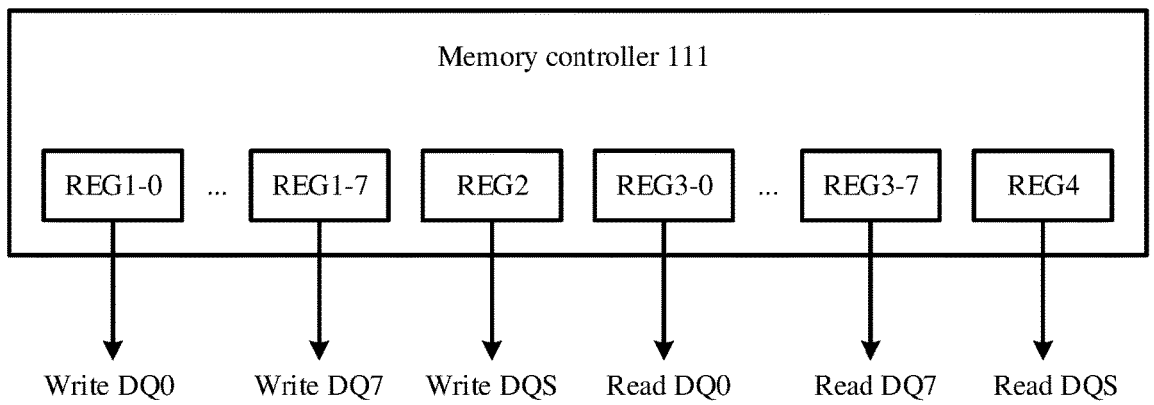
FIG. 3 is a schematic diagram of a register in a memory controller.

For example, the memory controller 111 shown in FIG. 3 mainly includes eight registers (REG) 1, specifically REG1-0 to REG1-7. The eight REGs1 are in a one-to-one correspondence with phase adjusters of a write DQ0 to a write DQ7 respectively (For example, REG1-0 corresponds to the phase adjuster of DQ0, REG1-1 corresponds to the phase adjuster of DQ1, and so on.), and may be configured to adjust sending delays of the write DQ0 to the write DQ7, respectively. For example, each REG1 may be a first input first output (FIFO) register.

Each REG1 may include 32 bits, and the 32 bits correspond to 32 types of sending delays. For example, there are 32 possible values for the sending delay of the write DQ1, the first value to the $32^{nd}$ value are successively increased, and an interval between any two adjacent values is a fixed value. The fixed value may also be referred to as a one-step sending delay, and the one-step sending delay may also be understood as a minimum adjustment amplitude that can be used by the memory controller 111 to adjust the sending delay of the write DQ.

Bit 1 to bit 32 of REG1-1 are respectively in a one-to-one correspondence with 32 possible values of the sending delay of the write DQ1. Each time one bit is added to REG1-1, the corresponding sending delay is increased by one step sending delay. For example, the memory controller 111 may set any position in REG1-1 to a high level while keeping other positions at a low level, so that the sending delay of the write DQ1 may be adjusted to a sending delay corresponding to a position at a high level.

The memory controller 111 further includes REG2. REG2 corresponds to the phase adjuster of the write DQS, and may be configured to adjust the sending delay of the write DQS. The memory controller 111 further includes eight REG3s, specifically REG3-0 to REG3-7. The eight REG3s respectively correspond to phase adjusters of a read DQ0 to a read DQ7, and may be configured to adjust receiving delays of the read DQ0 to the read DQ7, respectively. The memory controller 111 further includes REG4. REG4 corresponds to the phase adjuster of the read DQS, and may be configured to adjust the receiving delay of the read DQS.

It should be noted that, for a specific implementation in which the memory controller 111 adjusts the sending delays of the write DQ0 to the write DQ7 through REG1-0 to REG1-7, a specific implementation in which the memory controller 111 adjusts the sending delay of the write DQS through REG2, and a specific implementation in which the memory controller 111 adjusts the receiving delays of the read DQ0 to the read DQ7 through REG3-0 to REG3-7, and a specific implementation in which the memory controller 111 adjusts the receiving delay of the read DQS through REG4, refer to the prior art. Details are not described herein again.

Based on the memory controller 111 shown in FIG. 3, a currently common timing position alignment manner mainly includes the following processes:

1. Relative timing positions of the write DQ and the write DQS are aligned.

Before the memory controller 111 starts to align the relative timing positions between the write DQ and the write DQS, the memory controller 111 may first configure the sending delays of the write DQ0 to the write DQ7 and the write DQS as default sending delays. The memory controller 111 may then adjust the sending delay of the DQS and each DQ based on the default sending delays. The default sending delays of the write DQ0 to the write DQ7 and the write DQS may be the same or may be different. This is not limited in embodiments of this application.

Figure 4A:
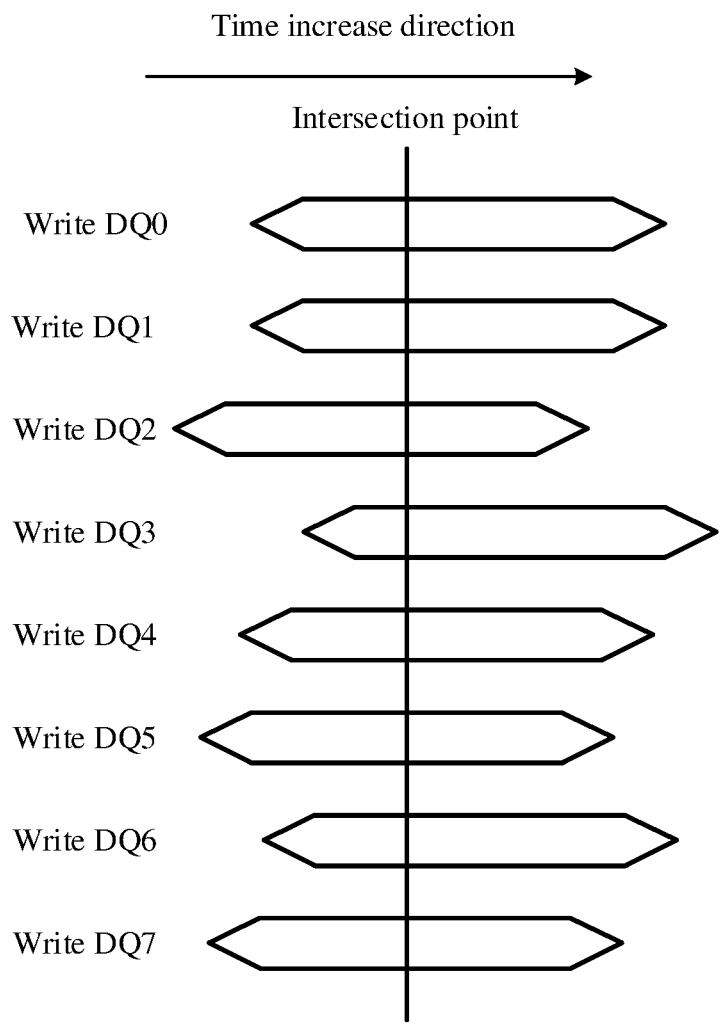
FIG. 4a to FIG. 4e are schematic diagrams of adjusting transmission delays of a DQ and a DQS in a memory training process.

For example, based on the default sending delays configured by the memory controller 111, relative timing positions between the write DQ0 to the write DQ7 and the write DQS may be shown in FIG. 4a. Relative timing positions between the write DQ0 to the write DQ7 and between the write DQS and the plurality of write DQs are greatly offset.

It should be noted that FIG. 4a shows only relative timing positions between one period of the write DQ0 to one period of the write DQ7 and an intersection point of the write DQS. Since each write DQ in the write DQ0 to the write DQ7 has a same period as the write DQS, when the memory controller 111 does not change the sending delays of the write DQ0 to the write DQ7 and the write DQS, relative timing positions between an intersection point of a write DQS in another period and a corresponding write DQ period may be shown in FIG. 4a. In other words, assuming that period duration is T, a relative timing position between an intersection point of a write DQS at t00+MT and a corresponding write DQ period may also be shown in FIG. 4a, where M is an integer greater than or equal to 0.

Figure 4B:
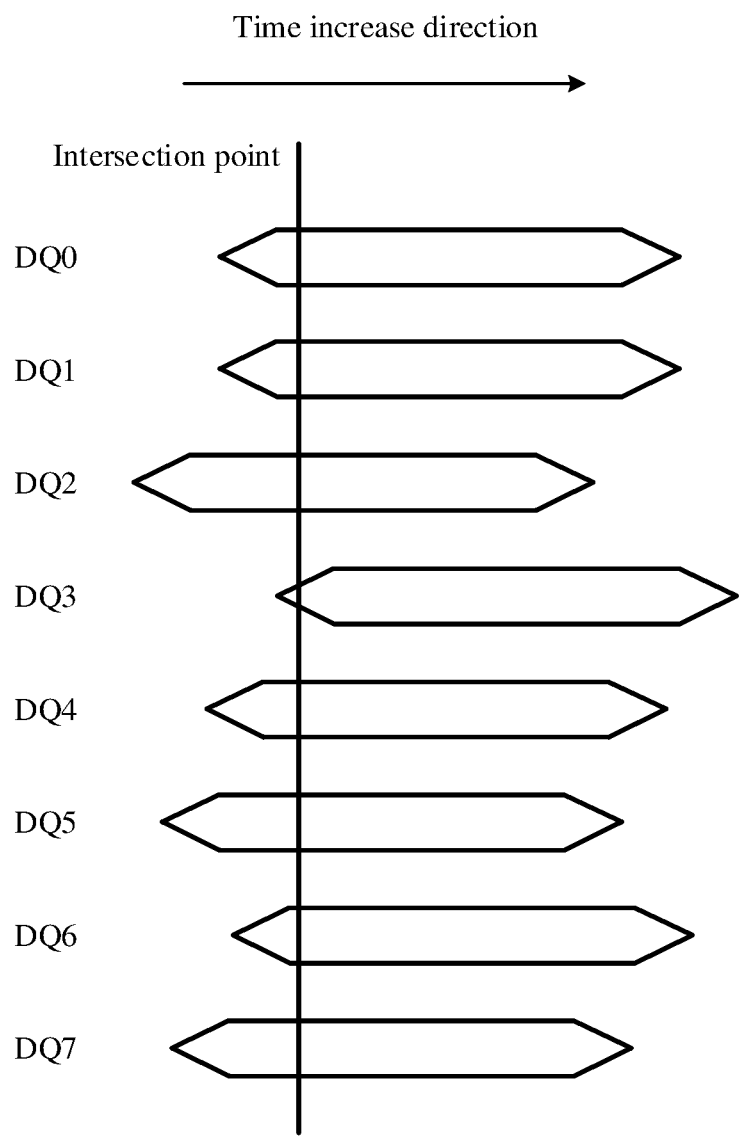

The timing position alignment process between the write DQ and the write DQS sent by the memory controller 111 shown in FIG. 4a mainly includes the following steps:

Step 1: As shown in FIG. 4b, the memory controller 111 gradually reduces the sending delay of the write DQS until data carried in at least one write DQ cannot be correctly written to the memory chip 12. In this case, an intersection point of the write DQS sent by the memory controller 111 may be shown in FIG. 4b.

It may be understood that FIG. 4b shows relative timing positions between intersection points of the write DQ0 to the write DQ7 and the write DQS of the memory controller 111. Without considering the transmission error of the memory bus 13, the relative timing positions between the intersection points of the write DQ0 to the write DQ7 and the write DQS received by the memory chip 12 may also be shown in FIG. 4*b*.

Since the memory controller 111 reduces the sending delay of the write DQS and keeps the sending delays of the write DQ0 to the write DQ7 unchanged, compared with a time point of any write DQ period from the write DQ0 to the write DQ7 sent by the memory controller 111, a time point at which the memory controller 111 sends an intersection point of the write DQS corresponding to the any write DQ period is advanced. In other words, based on a time increase direction shown in FIG. 4*b*, the intersection point of the write DQS will move in an opposite direction of a direction indicated by an arrow.

As shown in FIG. 4*b*, in this case, a setup time of the write DQ3 is too short, so that the memory chip 12 cannot correctly identify a level status of the write DQ3. Therefore, data carried in the write DQ3 cannot be correctly written to the memory chip 12. At this point, the memory controller 111 may stop reducing the sending delay of the write DQS. In this case, the current setup time of the write DQ3 is approximately equal to (slightly less than) the minimum setup time applicable to the memory chip 12.

Step 2: The memory controller 111 keeps a sending delay of a current write DQS (assuming that the sending delay of the current write DQS is D1). The memory controller 111 gradually increases the sending delays of the write DQ0 to the write DQ2 and the write DQ4 to the write DQ7, until data carried in the write DQ0 to the write DQ7 cannot be correctly written to the memory chip 12. In this case, a relative timing position between any write DQ period and the write DQS may be shown in FIG. 4*c*.

Specifically, after the memory controller 111 adjusts the sending delay of the write DQS to the sending delay D1, data carried in some write DQs (the write DQ0 to the write DQ2 and the write DQ4 to the write DQ7 in FIG. 4*b*) may be correctly written to the memory chip 12.

In this case, the memory controller 111 may successively increase the sending delays of the write DQ0 to the write DQ2 and the write DQ4 to the write DQ7. Taking the write DQ0 as an example, when the memory controller 111 keeps the sending delay of the write DQS unchanged, the memory controller 111 increases the sending delay of the write DQ0, so that compared with a time point at which the memory controller 111 sends an intersection point of the write DQS, a period time point at which the memory controller 111 sends the write DQ0 corresponding to the intersection point is delayed. In other words, based on a time increase direction shown in FIG. 4*c*, the memory controller 111 increases the sending delay of the write DQ0, so that one period of the write DQ0 may move in a direction shown by an arrow in the figure.

It can be learned that the memory controller 111 gradually increases the sending delays of the write DQ0 to the write DQ7, until data carried in the write DQ0 to the write DQ7 cannot be correctly written to the memory chip 12. The setup time of the write DQ0 to the write DQ7 will be equal and close to (slightly less than) the minimum setup time applicable to the memory chip 12.

After step 2, timing alignment between the write DQ0 and the write DQ7 is completed, which may also be understood as that phase synchronization between the write DQ0 and the write DQ7 may be kept after step 2.

Step 3: The memory controller 111 keeps the sending delays of the write DQ0 to the write DQ7 after step 2, and continues to increase the sending delay of the write DQS. Based on a time increase direction shown in FIG. 4*d*, the memory controller 111 increases the sending delay of the write DQS. Then, compared with a time point of any DQ period in which the memory controller 111 sends the write DQ0 to the write DQ7, a time point at which the memory controller 111 sends an intersection point of a DQS corresponding to the DQ period is delayed. In other words, relative to the timing position of the write DQ, the memory controller 111 increases the sending delay of the write DQS, so that the intersection point of the write DQS moves in a direction shown by an arrow in FIG. 4*d*.

The memory controller 111 gradually increases the sending delay of the write DQS until data carried in at least one write DQ cannot be correctly written to the memory chip 12. In this case, a hold time of at least one write DQ is too small, and is close to (slightly less than) the minimum hold time applicable to the memory chip 12.

Figure 4C:
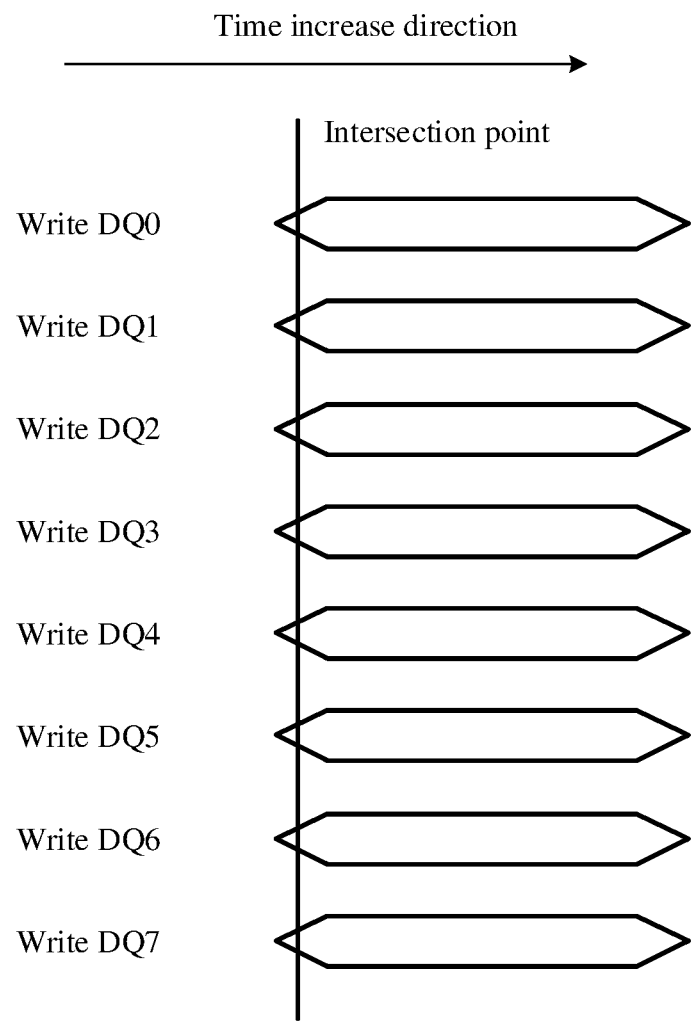
Figure 4D:
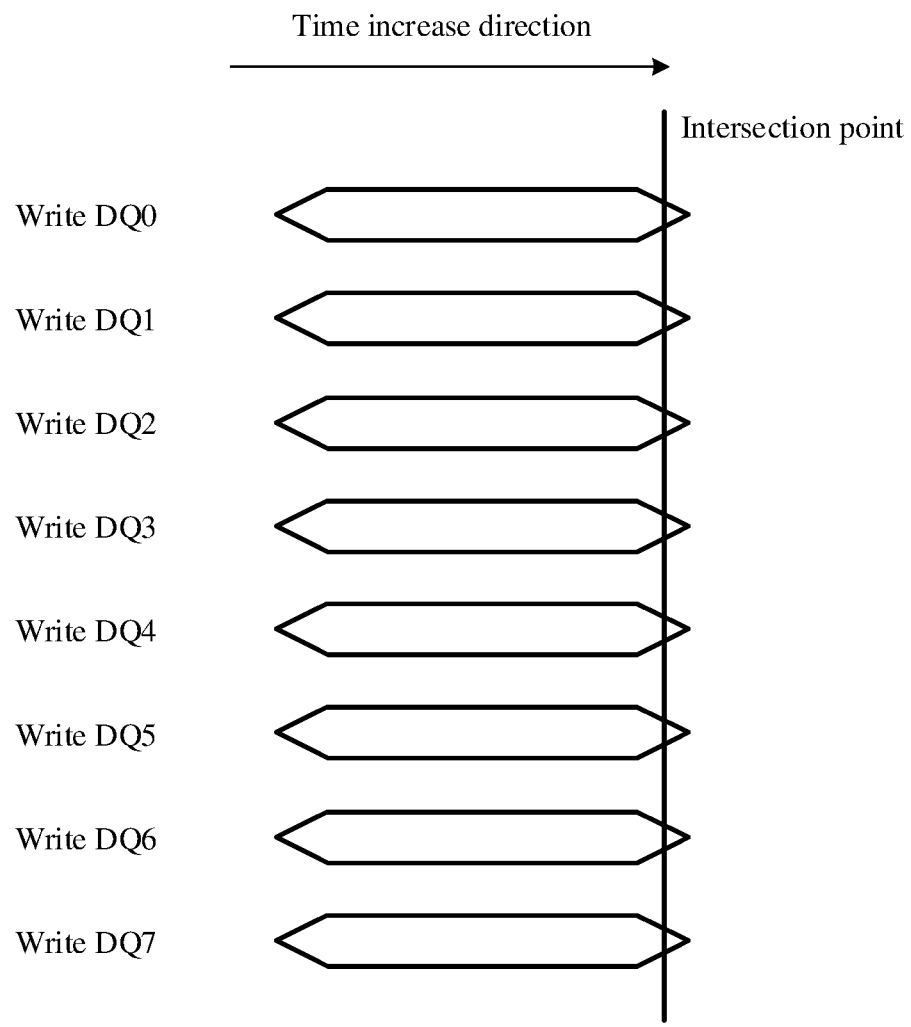
Figure 4E:
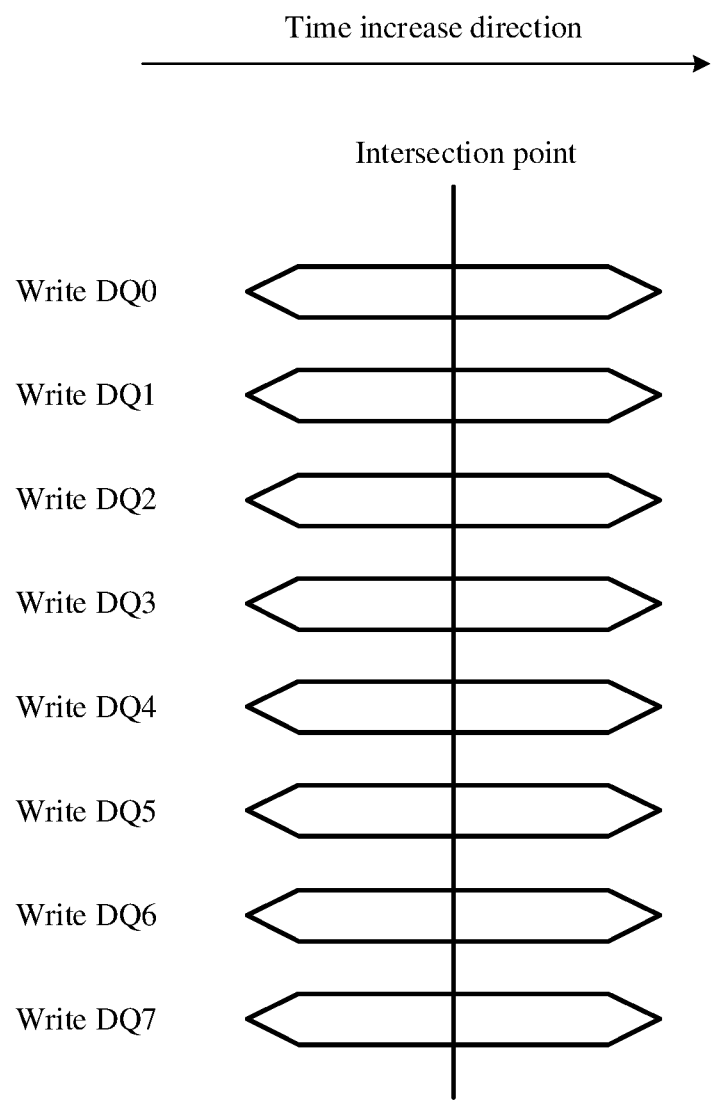

For example, the relative timing positions between the intersection points of the write DQ0 to the write DQ7 and the write DQS may be shown in FIG. 4*d*. Generally, the write DQ0 to the write DQ7 have a same write DQ period, and the write DQ0 to the write DQ7 are phase-synchronous. Therefore, the write DQ0 to the write DQ7 may have a same hold time. In other words, after the sending delay of the write DQS is adjusted in step 3, the hold time of each of the write DQ0 to the write DQ7 is close to (slightly less than) the minimum hold time applicable to the memory chip 12.

Assuming that the sending delay of the write DQS in FIG. 4*c* is D1 and the sending delay of the write DQS in FIG. 4*d* is D2, the memory controller 111 may reduce the sending delay of the write DQS from D2 to (D1+D2)/2 after step 3, so that timing margins of the write DQ0 to the write DQ7 reach a maximum value. At this point, alignment of the relative timing positions between the write DQ0 to the write DQ7 and the write DQS is completed.

2. Relative timing positions of the read DQ and the read DQS are aligned.

Similar to the write DQ and the write DQS, the read DQ and the read DQS also need to be aligned. For a specific implementation process, reference may be made to the alignment of the relative timing positions between the write DQ and the write DQS. A difference lies in that, in a specific implementation process of aligning the relative timing positions between the read DQ and the read DQS, the memory chip 12 sends the read DQ and the read DQS to the memory controller 111, and an intermediate point of the DQS triggers the memory controller 111 to identify the level status of the read DQ. The memory controller 111 adjusts receiving delays of the read DQ and the read DQS, to align the relative timing positions of the read DQ and the read DQS on a side of the memory controller 111. Details are not described herein again.

It can be learned from the foregoing description of the current timing position alignment manner that, in the current timing position alignment manner, not only the sending delay of the write DQS and the receiving delay of the read DQS need to be adjusted, but it is also necessary to adjust the sending delays of the write DQ0 to the write DQ7 and the receiving delays of the read DQ0 to the read DQ7. In this implementation, there are many adjustment steps, so that this implementation takes a long time.

In addition, since the processor 11 cannot normally access the memory chip 12 when the memory controller 111 performs timing position alignment on the DQS and the DQ transmitted in the same direction, the foregoing memory training manner can generally be applied only to memory initialization in a startup process of the electronic device 10. If memory retraining is performed in a working process of the electronic device 10, work of the electronic device 10 is interrupted since the processor 11 cannot access the memory chip 12 for a long time.

However, as an operation capability of the processor 11 in the electronic device 10 is improved, working frequencies of the processor core 112, the memory controller 111, and the memory chip 12 are also gradually increased. If the working frequency of the memory controller 111 is increased, periods of the write DQ and the write DQS sent by the memory controller 111 to the memory chip 12 are shortened. In this case, even if the relative timing positions of the write DQ and the write DQS are aligned, a timing margin of the memory chip 12 is small, and consequently, a bit error rate of data transmitted by the memory controller 111 to the memory chip 12 is unstable.

In addition, a current working scenario of the electronic device 10 becomes more complex, and more and more environmental factors may affect timing margins of the memory controller 111 and the memory chip 12. For example, an artificial intelligence (AI) chip (one of specific implementations of the processor 11) is usually disposed in a self-driving vehicle (one of specific implementations of the electronic device 10). The AI chip may be a chip in a self-driving central control platform or a chip in a smart cockpit of an automobile.

A working environment of the self-driving vehicle is complex and changeable. A temperature of a single board carrying the AI chip generally changes within a wide temperature range of −40° C. to 125° C. A large temperature change range causes a large influence on timing margins of the memory controller 111 and the memory chip 12. For an AI chip that works at a high frequency and a memory chip coupled to the AI chip, it is very likely to cause a problem of insufficient timing margins.

In view of this, embodiments of this application provide a memory training method. In the memory training method, relative timing positions of a DQS and a DQ transmitted in the same direction between the memory controller 111 and the memory chip 12 may be quickly aligned. The memory training method provided in embodiments of this application takes a short time, and therefore may be repeatedly performed in a working process of the electronic device 10. Therefore, the memory training method provided in embodiments of this application may also be referred to as a memory retraining method. In this way, the memory controller 111 and the memory chip 12 in the electronic device 10 may always keep a sufficient timing margin, thereby helping improve accuracy of data transmission between the memory controller 111 and the memory chip 12.

For example, in a working process of the electronic device 10, the processor core 112 may send a trigger instruction to the memory controller 111, to trigger the memory controller 111 to perform the memory training method provided in embodiments of this application. After performing the memory training method provided in embodiments of this application, the memory controller 111 may further feed back an execution result to the processor core 112, so that after the memory controller 111 completes aligning the relative timing positions between the DQS and the DQ transmitted in the same direction, the processor core 112 may continue to access the memory chip 12 through the memory controller 111.

In a possible implementation, the processor core 112 may periodically trigger, according to a configured memory training period, the memory controller 111 to perform the memory training method provided in embodiments of this application.

Specifically, the processor core 112 may send a trigger instruction to the memory controller 111 at intervals of a memory training period. For example, timing starts after memory initialization is completed in a startup process of the electronic device 10, and after timing duration reaches the memory training period, a trigger instruction is sent to the memory controller 111. After receiving the trigger instruction, the memory controller 111 may start to perform the memory training method provided in embodiments of this application. After the memory controller 111 completes aligning the relative timing positions between the DQS and the DQ transmitted in the same direction, the processor core 112 may zero out the foregoing timing duration and continue timing. After the timing duration reaches the foregoing memory training period again, the processor core 112 may send a trigger instruction to the memory controller 111 again, so that the memory controller 111 may perform the memory training method provided in embodiments of this application again.

In another possible implementation, as shown in FIG. 1, the electronic device 10 may further include a temperature sensor 14. For example, the temperature sensor 14 and the processor 11 and/or the memory chip 12 may be carried on a same printed circuit board (PCB). The processor core 112 may detect an ambient temperature through the temperature sensor 14. When determining that a difference between a current ambient temperature and a historical ambient temperature exceeds a temperature fluctuation threshold, the processor core 112 may send the foregoing trigger instruction to the memory controller 111, so that the memory controller 111 performs the memory training method provided in embodiments of this application. The foregoing historical ambient temperature may be understood as an ambient temperature at which the processor core 112 previously sends the trigger instruction. Specifically, it is assumed that the historical ambient temperature is 25° C. and the temperature fluctuation threshold is +20° C. Then, when the current ambient temperature is higher than 45° C. or lower than 5° C., the processor core 112 sends the foregoing trigger instruction to the memory controller 111. For example, the current ambient temperature is 47° C., and the difference between the current ambient temperature and the historical ambient temperature exceeds the temperature fluctuation threshold. Therefore, the processor core 112 may send the trigger instruction to the memory controller 111. After the memory controller 111 completes aligning the relative timing positions between the DQS and the DQ transmitted in the same direction, the processor core 112 may further update the historical ambient temperature to 47° C.

It may be understood that, due to an ambient temperature change, the relative timing positions between the DQS and the DQ transmitted in the same direction may be offset. Thus, the timing margins of the memory controller 111 and the memory chip 12 are not long enough. In embodiments of this application, an ambient temperature is used as a trigger condition for triggering the memory controller 111 to perform the memory training method, so that the memory controller 111 may calibrate, in time when the ambient temperature changes greatly, the relative timing positions between the DQS and the DQ transmitted in the same direction, thereby helping maintain that the memory controller 111 and the memory chip 12 have sufficient timing margins.

Figure 5:
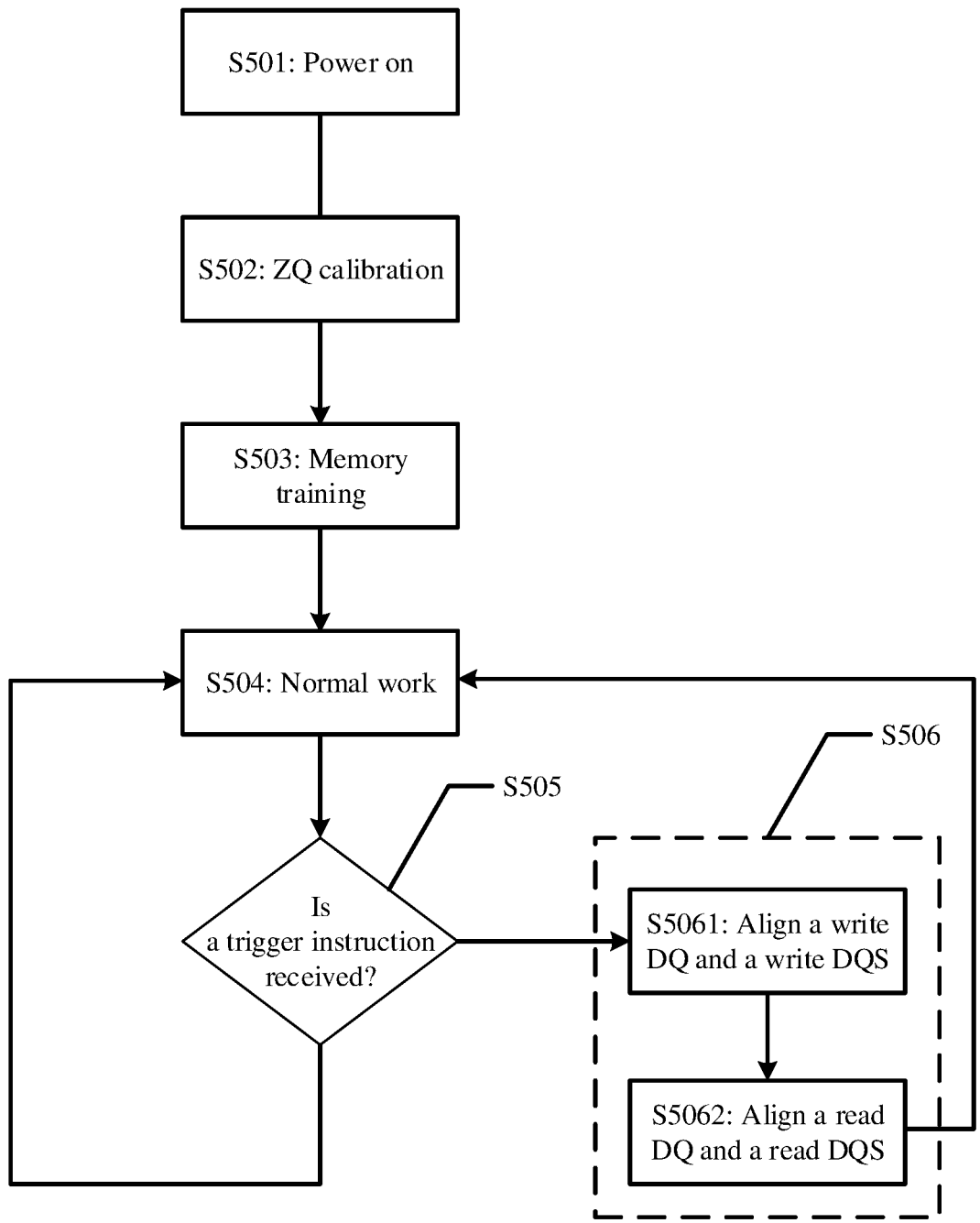
FIG. 5 is a schematic diagram of a memory initialization procedure.

For example, in the foregoing process, the memory controller 111 mainly performs the working procedure shown in FIG. 5. As shown in FIG. 5, the method mainly includes the following steps.

S501: The memory controller 111 is powered on. Generally, after the electronic device 10 or the processor 11 is powered on, the memory controller 111 may be powered on.

S502: After being powered on, the memory controller 111 performs ZQ calibration. For a specific implementation of the ZQ calibration, refer to the prior art. Details are not described herein again.

S503: The memory controller 111 receives an invocation of the processor core 112, to complete memory training. In a possible implementation, the memory controller 111 may complete memory training according to a current conventional memory training method, such as the memory training method shown in FIG. 4*a* to FIG. 4*e*.

This is because the memory controller 111 performs memory training for the first time when performing S503. In this case, the relative timing positions between the DQ and the DQS transmitted in the same direction are greatly offset. The current conventional memory training method may be used to accurately align the relative timing positions between the DQ and the DQS transmitted in the same direction. In this case, even if the relative timing positions between the DQ and the DQS transmitted in the same direction are offset subsequently, an offset degree thereof is small, which helps shorten subsequent memory training time.

S504: After completing memory training, the memory controller 111 may work normally. The memory controller 111 may access the memory chip 12 based on invocation of the processor core 112. For example, the memory controller 111 may read data from the memory chip 12, or may write data to the memory chip 12.

S505: In a normal working process, if receiving a trigger instruction sent by the processor core 112, the memory controller 111 continues to perform S506. If the trigger instruction sent by the processor core 112 is not received, normal work continues.

S506: The memory controller 111 performs the memory training method provided in embodiments of this application.

Specifically, memory training includes alignment of the relative timing positions between the write DQ and the write DQS (S5061) and alignment of the relative timing positions between the read DQ and the read DQS (S5062). It should be understood that a sequence of S5061 and S5062 is not strictly limited in embodiments of this application. The memory controller 111 may first perform S5061 and then perform S5062, or may first perform S5062 and then perform S5061.

In the memory training method provided in embodiments of this application, the memory controller 111 may complete the alignment of the relative timing positions between the write DQ and the write DQS by adjusting the sending delay of the write DQS or the write DQ, and may complete the alignment of the relative timing positions between the read DQ and read DQS by adjusting the receiving delay of the read DQS or the read DQ. Compared with the memory training processes shown in FIG. 4*a* to FIG. 4*e*, in embodiments of this application, steps of adjusting a transmission delay can be significantly reduced, to facilitate the alignment of the relative timing positions between the DQS and the DQ transmitted in the same direction in a short time period.

Next, the memory training method provided in embodiments of this application is further described by using the following Embodiment 1 to Embodiment 4. It should be understood that a DQS and corresponding N DQs are transmitted in the same direction. N is an integer greater than or equal to 1. The DQS may trigger a receiving end to identify level statuses of the N DQs. For example, based on the memory bus 13 shown in FIG. 1, a DQS and corresponding eight DQs (that is, DQ0 to DQ7) are transmitted in the same direction. For ease of understanding, the DQS and DQ0 to DQ7 transmitted in the same direction will be illustrated next in embodiments of this application.

Figure 6:
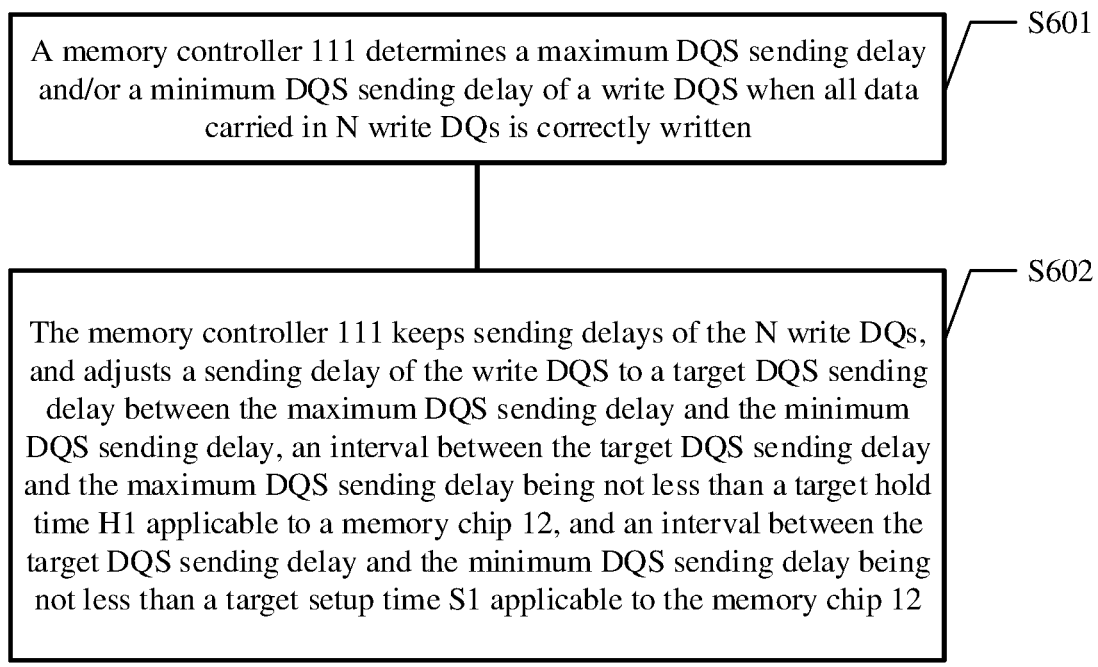
FIG. 6 is a schematic flowchart of a memory training method according to an embodiment of this application.

Embodiment 1: A Sending Delay of a Write DQS is Adjusted to Align Relative Timing Positions Between a Write DQ and the Write DQS For example, as shown in FIG. 6, Embodiment 1 mainly includes the following steps:

S601: The memory controller 111 determines a maximum DQS sending delay and/or a minimum DQS sending delay of a write DQS when all data carried in N write DQs is correctly written.

Figure 7:
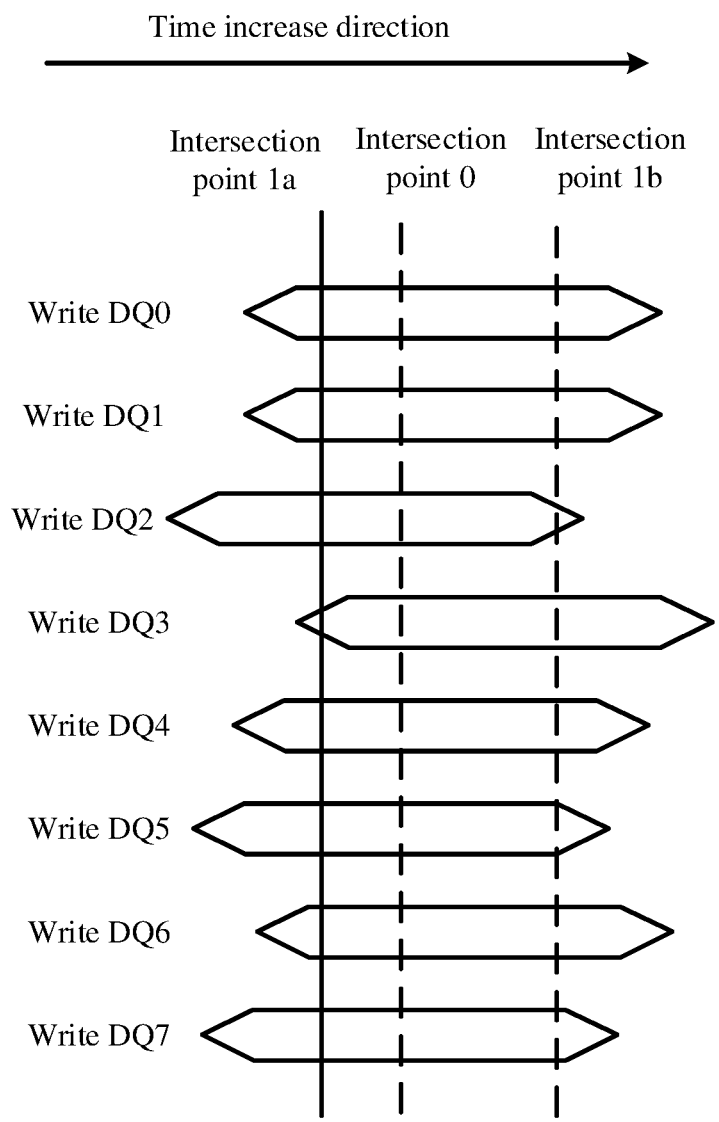
FIG. 7 is a schematic diagram of a relative timing position relationship between a DQ and a DQS according to an embodiment of this application.

For example, it is assumed that the N write DQs include a write DQ0 to a write DQ7, and relative timing positions between the write DQ0 to the write DQ7 and the write DQS are shown in FIG. 7. It may be understood that, either an excessively large or small sending delay of the write DQS may cause an error in writing data carried in the write DQ0 to the write DQ7. For example, in FIG. 7, in a case where all data carried in the write DQ0 to the write DQ7 is correctly written, when the sending delay of the write DQS is a minimum DQS sending delay, an intersection point of the write DQS may be represented by an intersection point 1*a*, and a straight line corresponding to the intersection point 1*a* represents a time point at which the intersection point 1*a* is located. When the sending delay of the write DQS is a maximum DQS sending delay, an intersection point of the write DQS may be represented by an intersection point 1*b*, and a straight line corresponding to the intersection point 1*b* represents a time point at which the intersection point 1*b* is located. All straight lines corresponding to intersection points (or intermediate points) in subsequent drawings may represent time points at which the intersection points (or the intermediate points) are located. Details are not described herein again.

If the sending delay of the write DQS is less than the minimum DQS sending delay, a setup time of one or more write DQs is not long enough, and thus a data write error occurs. If the sending delay of the write DQS is greater than the maximum DQS sending delay, a hold time of one or more write DQs is not long enough, and thus a data write error also occurs.

S602: The memory controller 111 keeps sending delays of the N write DQs, and adjusts a sending delay of the write DQS to a target DQS sending delay between the maximum DQS sending delay and the minimum DQS sending delay. An interval between the target DQS sending delay and the maximum DQS sending delay is not less than a target hold time H1 applicable to the memory chip 12. An interval between the target DQS sending delay and the minimum DQS sending delay is not less than a target setup time S1 applicable to the memory chip 12.

The target hold time H1 applicable to the memory chip 12 may be equal to a minimum hold time applicable to the memory chip 12, or may be greater than a minimum hold time applicable to the memory chip 12. The target setup time S1 applicable to the memory chip 12 may be equal to a minimum setup time applicable to the memory chip 12, or may be greater than a minimum setup time applicable to the memory chip 12. Specific implementations of the target hold time H1 and the target setup time S1 may be determined based on a performance requirement for data transmission between the memory controller 111 and the memory chip 12. This is not limited in embodiments of this application.

It should be noted that since the memory controller 111 determines one or two of the maximum DQS sending delay and the minimum DQS sending delay of the write DQS in S601, the target DQS sending delay in S602 also needs to be described by case.

Case 1: The memory controller 111 determines the maximum DQS sending delay of the write DQS, but does not determine the minimum DQS sending delay of the write DQS. In this case, an interval between the target DQS sending delay and the maximum DQS sending delay may be the target hold time H1 applicable to the memory chip 12.

In embodiments of this application, memory training may be performed after memory initialization, that is, memory retraining. Therefore, an offset between write DQs is usually small. In other words, a time interval between the maximum DQS sending delay and the minimum DQS sending delay is large, and is close to period duration of the write DQs. In addition, since periods of the write DQs are usually far greater than the target hold time H1 applicable to the memory chip 12, when an interval between the target DQS sending delay and the maximum DQS sending delay is the target hold time H1 applicable to the memory chip 12, an interval between the target DQS sending delay and the minimum DQS sending delay is usually greater than the target setup time S1 applicable to the memory chip 12.

Case 2: The memory controller 111 determines the minimum DQS sending delay of the write DQS, but does not determine the maximum DQS sending delay of the write DQS. In this case, an interval between the target DQS sending delay and the minimum DQS sending delay may be the target setup time S1 applicable to the memory chip 12.

As described above, a time interval between the maximum DQS sending delay and the minimum DQS sending delay is large, and is close to period duration of write DQs. In addition, since periods of the write DQs are usually far greater than the target setup time S1 applicable to the memory chip 12, when an interval between the target DQS sending delay and the minimum DQS sending delay is the target setup time S1 applicable to the memory chip 12, an interval between the target DQS sending delay and the maximum DQS sending delay is usually greater than the target hold time H1 applicable to the memory chip 12.

Case 3: The memory controller 111 determines the minimum DQS sending delay and the maximum DQS sending delay of the write DQS. In this case, an interval between the target DQS sending delay and the maximum DQS sending delay may be the target hold time H1 applicable to the memory chip 12, or an interval between the target DQS sending delay and the minimum DQS sending delay may be the target setup time S1 applicable to the memory chip 12, or the target DQS sending delay may be located at an intermediate position between the maximum DQS sending delay and the minimum DQS sending delay.

As described above, a time interval between the maximum DQS sending delay and the minimum DQS sending delay is large, and is close to period duration of write DQs. The target DQS sending delay is located at the intermediate position between the maximum DQS sending delay and the minimum DQS sending delay, so that a time interval between the target DQS sending delay and the minimum DQS sending delay may be greater than the target setup time S1 applicable to the memory chip 12, and a time interval between the target DQS sending delay and the maximum DQS sending delay may be greater than the target hold time H1 applicable to the memory chip 12.

In embodiments of this application, the memory controller 111 may align relative timing positions between the write DQ0 to the write DQ7 and the write DQS by adjusting the sending delay of the write DQS. Compared with the memory training process shown in FIG. 4a to FIG. 4e, in embodiments of this application, the memory controller 111 does not need to adjust the sending delays of the write DQ0 to the write DQ7. Therefore, memory training duration is shortened.

It should be noted that when the memory controller 111 performs S601, the memory controller 111 may determine the maximum DQS sending delay and the minimum DQS sending delay of the write DQS, respectively. When an offset between an initial DQS sending delay of the write DQS and the minimum DQS sending delay is large, it indicates that each write DQ has a sufficient setup time under the initial DQS sending delay. In this case, only the maximum DQS sending delay may be determined. Similarly, when an offset between the initial DQS sending delay of the write DQS and the maximum DQS sending delay is large, it indicates that each current write DQ has a sufficient hold time. In this case, only the minimum DQS sending delay may be determined.

The initial DQS sending delay of the write DQS may be understood as a sending delay of the write DQS before the memory controller 111 starts to perform this memory training or when the memory controller starts to perform this memory training. The initial DQS sending delay of the write DQS may also be understood as a sending delay of the write DQS before the memory controller 111 receives the foregoing trigger instruction. For example, the sending delay of the write DQS is the initial DQS sending delay, and an intersection point of the write DQS may be shown as an intersection point 0 in FIG. 7.

In a possible implementation, the memory controller 111 may gradually reduce the sending delay of the write DQS starting from the initial DQS sending delay until an error occurs in writing of data carried in at least one write DQ. In this case, the sending delay of the write DQS may be used as the minimum DQS sending delay.

The memory controller 111 may further gradually increase the sending delay of the write DQS starting from the initial DQS sending delay until an error occurs in writing of data carried in at least one write DQ. In this case, the sending delay of the write DQS may be used as the maximum DQS sending delay.

Figure 8:
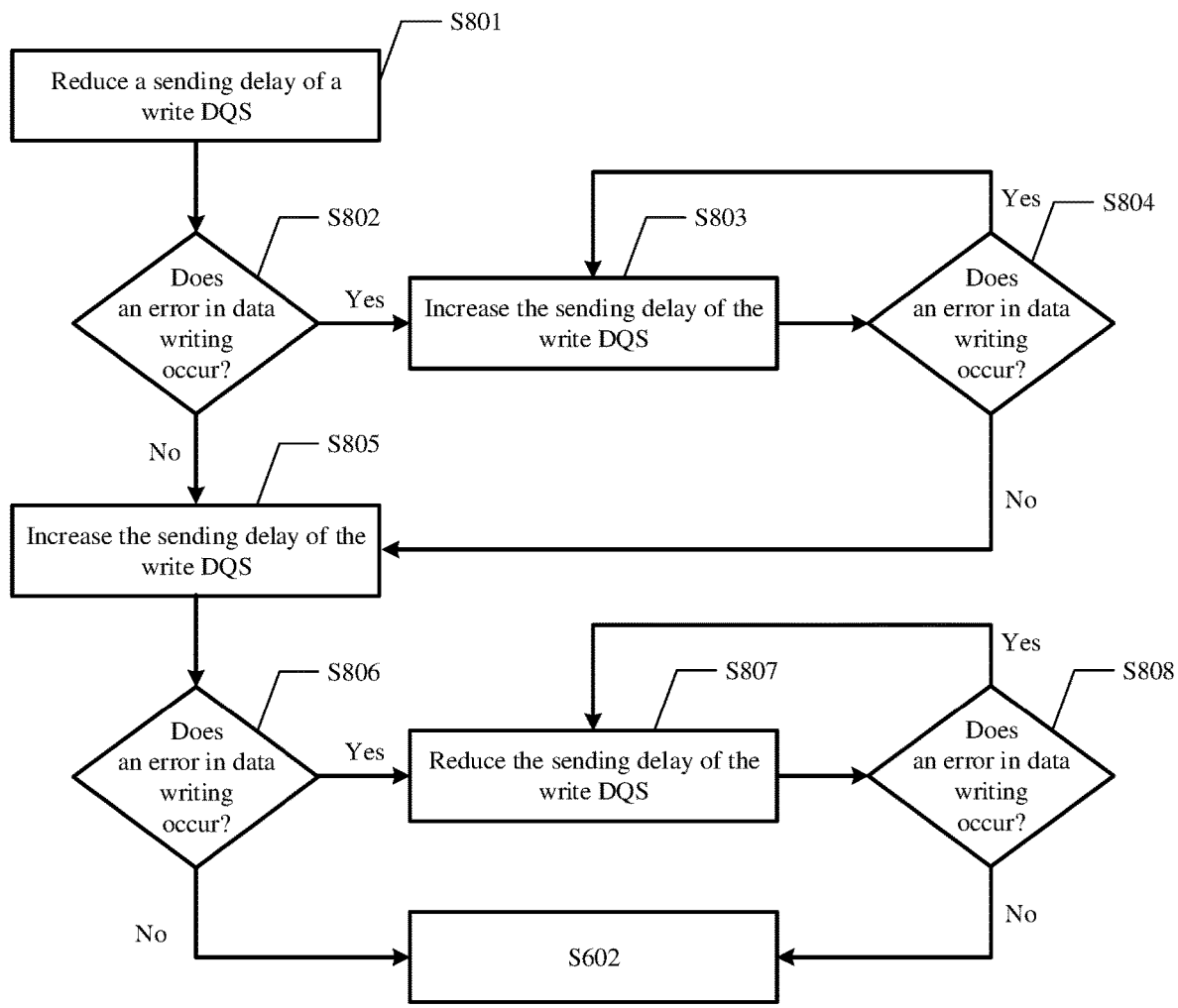
FIG. 8 is a schematic flowchart of a method for determining a maximum DQS sending delay and/or a minimum DQS sending delay according to an embodiment of this application.

In another possible implementation, the memory controller 111 may further determine the maximum DQS sending delay and/or the minimum DQS sending delay by using the method shown in FIG. 8. The method mainly includes the following steps:

S801: The memory controller 111 reduces, on the basis of the initial DQS sending delay, the sending delay of the write DQS according to the target setup time S1 applicable to the memory chip 12. In other words, the memory controller 111 may reduce the sending delay of the write DQS from the initial DQS sending delay to a first DQS sending delay. An interval between the first DQS sending delay and the initial DQS sending delay is the target setup time applicable to the memory chip 12.

Figure 9A:
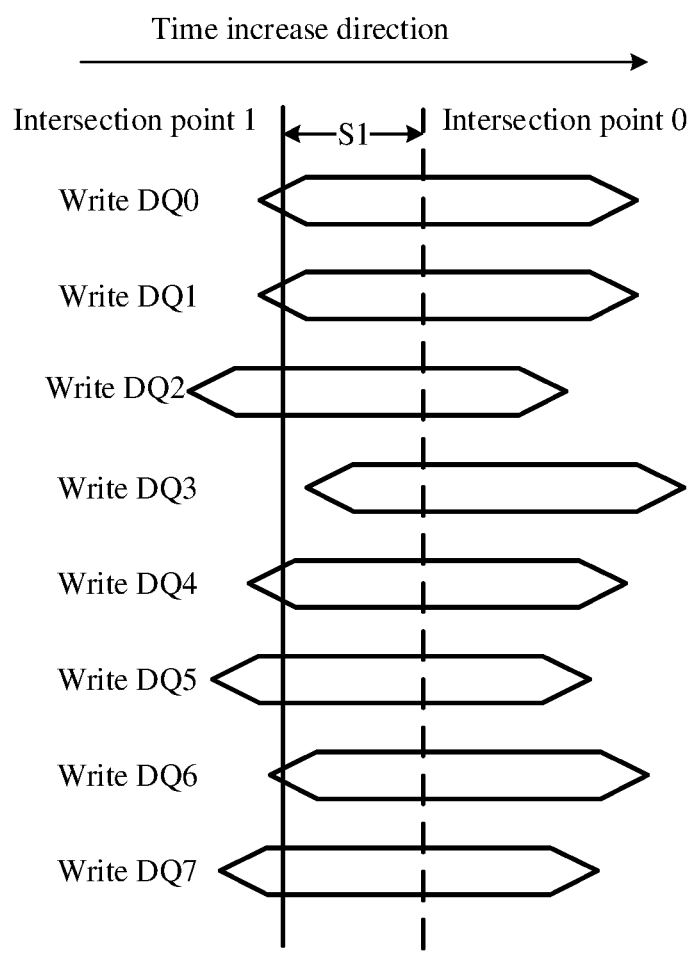
FIG. 9a and FIG. 9b are schematic diagrams of adjusting a transmission delay of a DQS in a memory training process according to an embodiment of this application.

For example, as shown in FIG. 9a, when the sending delay of the write DQS is the initial DQS sending delay, an intersection point of the write DQS may be shown as an intersection point 0 in FIG. 9a. The memory controller 111 keeps the sending delays of the write DQ0 to the write DQ7, so that time at which a period of each write DQ is transmitted to the memory chip 12 keeps stable. The memory controller 111 reduces the sending delay of the write DQS. Compared with the period of the write DQ corresponding to the intersection point of the write DQS, time at which the intersection point of the write DQS is transmitted to the memory chip 12 is advanced. In other words, as shown in FIG. 9a, the intersection point of the write DQS moves in an opposite direction to a direction indicated by an arrow in FIG. 9a.

When the sending delay of the write DQS is the first DQS sending delay, the intersection point of the write DQS may be shown as an intersection point 1 in FIG. 9a. A time interval between the intersection point 1 and the intersection point 0 is a time interval between the first DQS sending delay and the initial DQS sending delay, and is the target setup time S1 applicable to the memory chip 12.

S802: If an error occurs in writing of data carried in at least one write DQ, the memory controller 111 continues to perform S803. If all data carried in the write DQ0 to the write DQ7 is correctly written, the memory controller 111 continues to perform S805.

It may be understood that if all data carried in the write DQ0 to the write DQ7 is correctly written, it indicates that a time interval between the initial DQS sending delay and the minimum DQS sending delay is large, the setup time of the write DQ0 to the write DQ7 is long enough under the initial DQS sending delay, and no calibration is required. Therefore, the memory controller 111 may continue to perform S805 without determining the minimum DQS sending delay, and increase the sending delay of the write DQS, to determine the maximum DQS sending delay of the write DQS.

If an error occurs in writing of data carried in at least one write DQ, it indicates that the setup time of the at least one write DQ under the initial DQS sending delay is not long enough to meet a requirement for transmission performance (stability), and calibration is required. For example, assuming that the sending delay of the write DQS is the first DQS sending delay, the intersection point of the write DQS may be shown as an intersection point 1 in FIG. 9a. It can be learned from FIG. 9a that the setup time of the write DQ3 and the write DQ6 is not long enough. In this case, an error occurs in writing of data carried in the write DQ3 and the write DQ6, and the memory controller 111 continues to perform S803.

S803: The memory controller 111 increases the sending delay of the write DQS according to a first adjustment amplitude. It should be noted that the first adjustment amplitude is less than the target setup time S1 applicable to the memory chip 12. Generally, the first adjustment amplitude may be a minimum adjustment amplitude that can be used by the memory controller 111 to adjust the sending delay of the write DQS, and the minimum adjustment amplitude may also be referred to as a step.

S804: If an error occurs in writing of data carried in at least one write DQ, the memory controller 111 returns to continue performing S803.

The memory controller 111 performs S803 and S804 for one or more times, and gradually increases the sending delay of the write DQS until all data carried in the write DQ0 to the write DQ7 is correctly written. In this case, the sending delay of the write DQS may be used as the minimum DQS sending delay, and an intersection point of the write DQS may be shown as an intersection point 1a in FIG. 7.

It may be understood that, in a working process of the electronic device 10, even if the intersection point of the write DQS is offset from an intermediate position of a corresponding write DQ period, the intersection point of the write DQS is still located near the intermediate position of the corresponding write DQ period. In this case, if the memory controller 111 gradually reduces the sending delay of the write DQS from the initial DQS sending delay, the memory controller 111 can determine the minimum DQS sending delay by adjusting the sending delay of the write DQS for a plurality of times and checking whether data carried in the write DQ0 to the write DQ7 is correctly written.

In S801 to S804 provided in embodiments of this application, the target setup time S1 applicable to the memory chip 12 is usually less than duration of a half-period of the write DQ. However, an adjustment amplitude from the first DQS sending delay to the minimum DQS sending delay does not exceed the target setup time S1 applicable to the memory chip 12. Therefore, S803 is performed for a small number of times, and thus the minimum DQS sending delay may be quickly determined.

S805: The memory controller 111 increases, on the basis of the initial DQS sending delay, the sending delay of the write DQS according to the target hold time H1 applicable to the memory chip 12. In other words, the memory controller 111 may increase the sending delay of the write DQS from the initial DQS sending delay to a second DQS sending delay. An interval between the second DQS sending delay and the initial DQS sending delay is the target hold time H1 applicable to the memory chip 12.

Figure 9B:
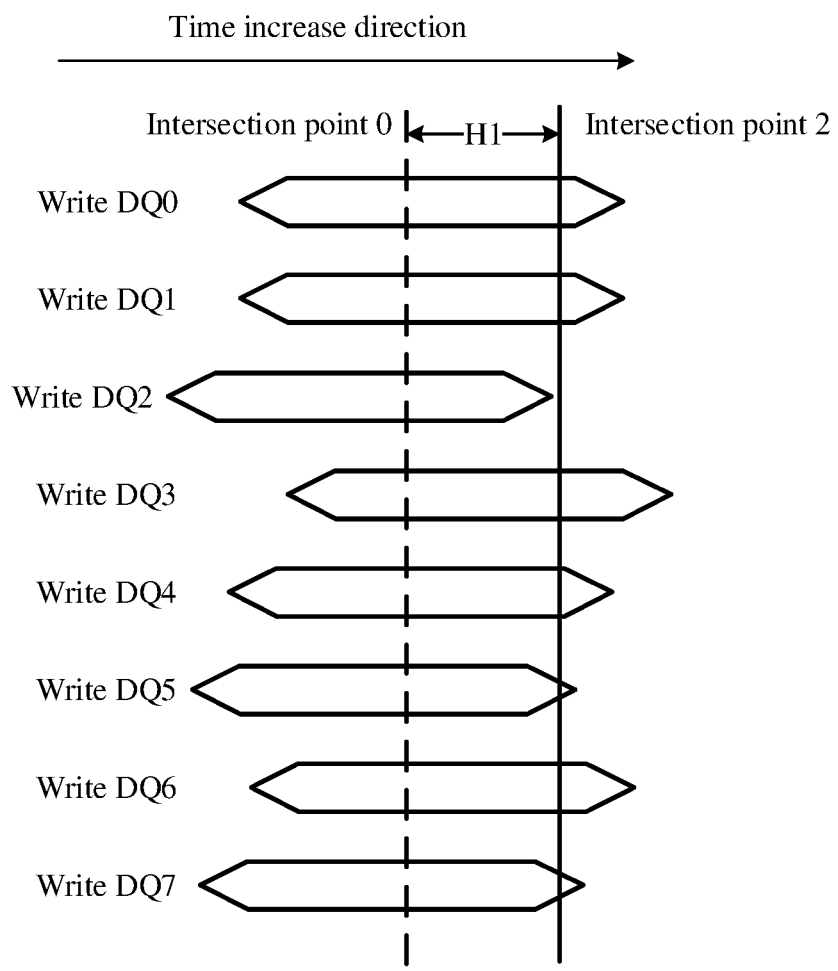

For example, as shown in FIG. 9b, when the sending delay of the write DQS is the initial DQS sending delay, an intersection point of the write DQS may be shown as an intersection point 0 in FIG. 9b. The memory controller 111 keeps the sending delays of the write DQ0 to the write DQ7, so that time at which a period of each write DQ is transmitted to the memory chip 12 keeps stable. The memory controller 111 increases the sending delay of the write DQS. Compared with the period of the write DQ corresponding to the intersection point of the write DQS, time at which the intersection point of the write DQS is transmitted to the memory chip 12 is delayed. In other words, as shown in FIG. 9b, the intersection point of the write DQS moves in a direction indicated by an arrow in FIG. 9b.

When the sending delay of the write DQS is the second DQS sending delay, the intersection point of the write DQS may be shown as an intersection point 2 in FIG. 9b. A time interval between the intersection point 2 and the intersection point 0 is a time interval between the second DQS sending delay and the initial DQS sending delay, and is the target hold time H1 applicable to the memory chip 12.

S806: If an error occurs in writing of data carried in at least one write DQ, the memory controller 111 continues to perform S807. If all data carried in the write DQ0 to the write DQ7 is correctly written, the memory controller 111 continues to perform S808.

It may be understood that if all data carried in the write DQ0 to the write DQ7 is correctly written, it indicates that a time interval between the initial DQS sending delay and the maximum DQS sending delay is large, the hold time of the write DQ0 to the write DQ7 is long enough, and no calibration is required. Therefore, the memory controller 111 does not need to determine the maximum DQS sending delay, and may continue performing S602.

In some scenarios, there may be some cases in which data carried in the write DQ0 to the write DQ7 is correctly written in S802 and S806. In other words, on the basis of the initial DQS sending delay, after the sending delay of the write DQS is reduced according to the target setup time S1 applicable to the memory chip 12, data carried in the write DQ0 to the write DQ7 is correctly written. In other words, the write DQ0 to the write DQ7 have a long enough setup time under the initial DQS sending delay. On the basis of the initial DQS sending delay, after the sending delay of the write DQS is increased according to the target hold time H1 applicable to the memory chip 12, data carried in the write DQ0 to the write DQ7 is correctly written. In other words, the write DQ0 to the write DQ7 have a long enough hold time under the initial DQS sending delay. In this case, the memory controller 111 may directly use the initial DQS sending delay as the target DQS sending delay.

If an error occurs in writing of data carried in at least one write DQ, it indicates that a hold time of the at least one write DQ is not long enough, and calibration is required. In this case, an intersection point of the write DQS may be shown as an intersection point 2 in FIG. 9b. Therefore, the memory controller 111 may continue to perform S807.

S807: The memory controller 111 reduces the sending delay of the write DQS according to a second adjustment amplitude. It should be noted that the second adjustment amplitude is less than the target hold time H1 applicable to the memory chip 12. Generally, the second adjustment amplitude may also be a minimum adjustment amplitude that can be used by the memory controller 111 to adjust the sending delay of the write DQS, that is, an amplitude of one step.

S808: If an error occurs in writing of data carried in at least one write DQ, the memory controller 111 returns to continue performing S807.

The memory controller 111 performs S807 and S808 for one or more times, and gradually reduces the sending delay of the write DQS until all data carried in the write DQ0 to the write DQ7 is correctly written. In this case, the sending delay of the write DQS may be used as the maximum DQS sending delay, and an intersection point of the write DQS may be shown as an intersection point 1b in FIG. 7.

The memory controller 111 may determine the maximum DQS sending delay and/or the minimum DQS sending delay of the write DQS by performing the method shown in FIG. 8. Then, the memory controller 111 may continue performing S602 based on the maximum DQS sending delay and/or the minimum DQS sending delay.

It may be understood that, in the process of determining, by the memory controller 111, the maximum DQS sending delay and/or the minimum DQS sending delay of the write DQS, the memory controller 111 may increase, on the basis of the initial DQS sending delay, the sending delay of the write DQS according to the target hold time H1 applicable to the memory chip 12, to determine the maximum DQS sending delay of the write DQS, and then reduce, on the basis of the initial DQS sending delay, the sending delay of the write DQS according to the target setup time S1 applicable to the memory chip 12, to determine the minimum DQS sending delay of the write DQS. The foregoing process should also be included in embodiments of this application, and specific implementation details are not described again.

Embodiment 2: A Receiving Delay of a Read DQS is Adjusted to Align Relative Timing Positions Between a Read DQ and the Read DQS Based on a technical concept similar to that in Embodiment 1, in Embodiment 2 provided in embodiments of this application, the relative timing positions between the read DQ and the read DQS may be aligned.

Figure 10:
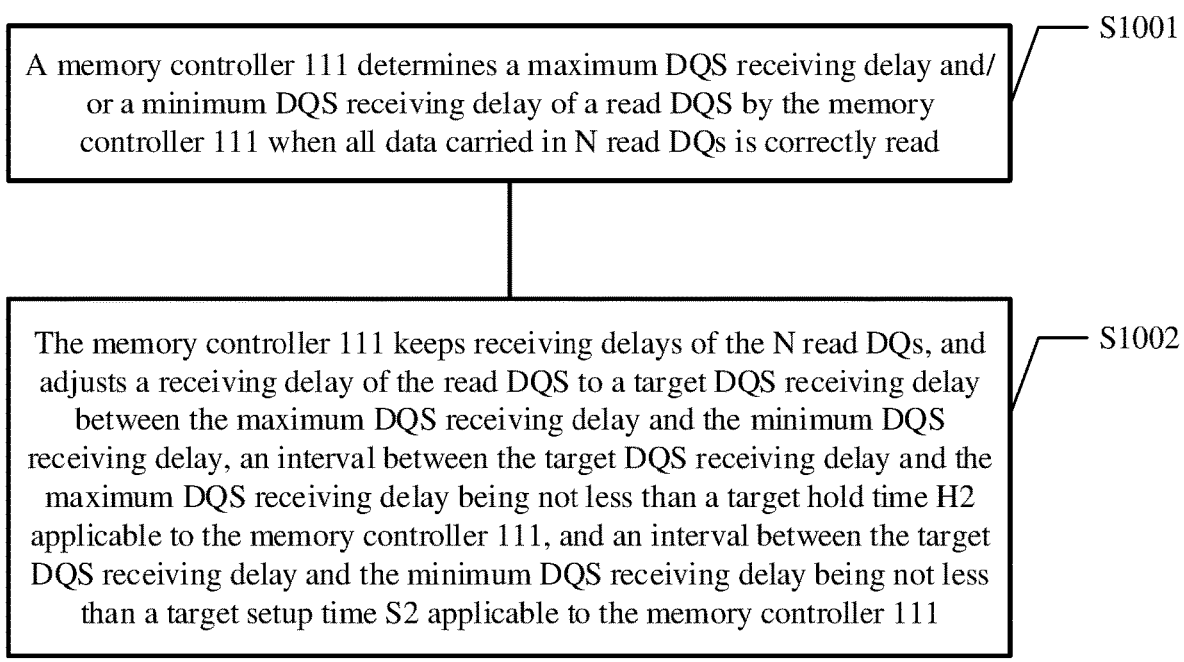
FIG. 10 is a schematic flowchart of a memory training method according to an embodiment of this application.

Specifically, as shown in FIG. 10, Embodiment 2 mainly includes the following steps:

S1001: The memory controller 111 determines a maximum DQS receiving delay and/or a minimum DQS receiving delay of a read DQS when all data carried in N read DQs is correctly read.

This process is similar to S602. A difference lies in that the memory chip 12 outputs N read DQs and a read DQS corresponding to the N read DQs, and the memory controller 111 receives the N read DQs and the read DQS corresponding to the N read DQs. Generally, an intermediate point between intersection points in the read DQS is used as a trigger point, and the memory controller 111 is triggered to identify level statuses of the N read DQs.

Specifically, in a possible implementation, the memory controller 111 may gradually reduce a receiving delay of the read DQS starting from an initial DQS receiving delay until an error occurs in reading of data carried in at least one read DQ. In this case, the receiving delay of the read DQS may be used as the minimum DQS receiving delay. The memory controller 111 may further gradually increase the receiving delay of the read DQS starting from the initial DQS receiving delay until an error occurs in reading of data carried in at least one read DQ. In this case, the receiving delay of the read DQS may be used as a maximum DQS receiving delay.

The initial DQS receiving delay of the read DQS may be understood as a receiving delay of the read DQS before the memory controller 111 starts to adjust the receiving delay of the read DQS. The initial DQS receiving delay of the read DQS may also be understood as a receiving delay of the read DQS before the memory controller 111 receives the foregoing trigger instruction.

In another possible implementation, the memory controller 111 may further determine the maximum DQS receiving delay and the minimum DQS receiving delay of the read DQS by using a process similar to that in FIG. 8. Specifically, the memory controller 111 may determine the maximum DQS receiving delay and/or the minimum DQS receiving delay, respectively.

1. Determine the Minimum DQS Receiving Delay

On the basis of the initial DQS receiving delay, the memory controller 111 reduces the receiving delay of the read DQS according to a target setup time S2 applicable to the memory controller 111. In other words, the memory controller 111 reduces the receiving delay of the read DQS from the initial DQS receiving delay to a first DQS receiving delay, and an interval between the first DQS receiving delay and the initial DQS receiving delay is the target setup time S2 applicable to the memory controller 111.

The target setup time S2 applicable to the memory controller 111 may be equal to a minimum setup time applicable to the memory controller 111, or may be greater than a minimum setup time applicable to the memory controller 111. A specific implementation of the target setup time S2 may be determined based on a performance requirement for data transmission between the memory controller 111 and the memory chip 12. This is not limited in embodiments of this application.

Figure 11A:
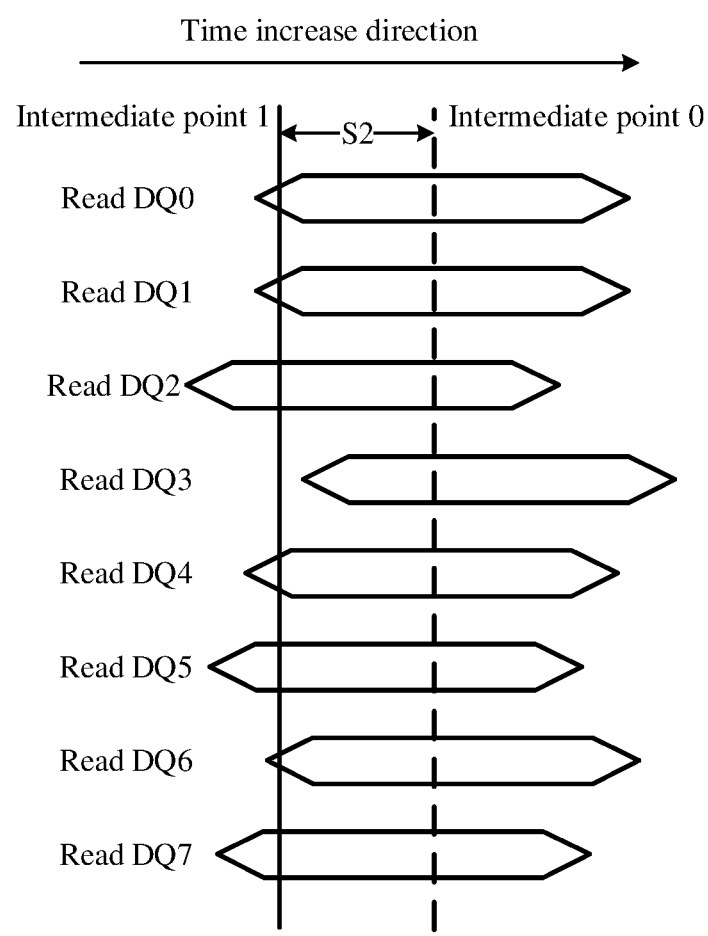
FIG. 11a to FIG. 11d are schematic diagrams of adjusting transmission delays of a DQ and a DQS in a memory training process according to an embodiment of this application.

For example, as shown in FIG. 11a, when the receiving delay of the read DQS is the initial DQS receiving delay, an intermediate point of the read DQS may be shown as an intermediate point 0 in FIG. 11a. The memory controller 111 keeps receiving delays of the read DQ0 to the read DQ7, and reduces the receiving delay of the read DQS. Compared with a period of a read DQ corresponding to an intermediate point of the read DQS, the memory controller 111 identifies a timing advance of the intermediate point of the read DQS. In other words, as shown in FIG. 11a, the intermediate point of the read DQS moves in an opposite direction to a direction indicated by an arrow in FIG. 11a.

When the receiving delay of the read DQS is the first DQS receiving delay, the intermediate point of the read DQS may be shown as an intermediate point 1 in FIG. 11a. A time interval between the intermediate point 1 and the intermediate point 0 is a time interval between the first DQS receiving delay and the initial DQS receiving delay, and is the target setup time S2 applicable to the memory controller 111.

If all data carried in the read DQ0 to the read DQ7 is correctly read under the first DQS receiving delay, it indicates that a time interval between an initial receiving delay and a minimum receiving delay is large. Under the initial DQS receiving delay, a setup time between the read DQ0 and the read DQ7 is long enough, and no calibration is required. In this case, the maximum DQS receiving delay may continue to be determined without determining the minimum DQS receiving delay. If an error occurs in reading of data carried in at least one read DQ, it indicates that the setup time of the at least one read DQ under the initial DQS receiving delay is not long enough to meet a requirement for transmission performance (stability), and calibration is required. In this case, the intermediate point of the read DQS may be shown in FIG. 11a.

Figure 11B:
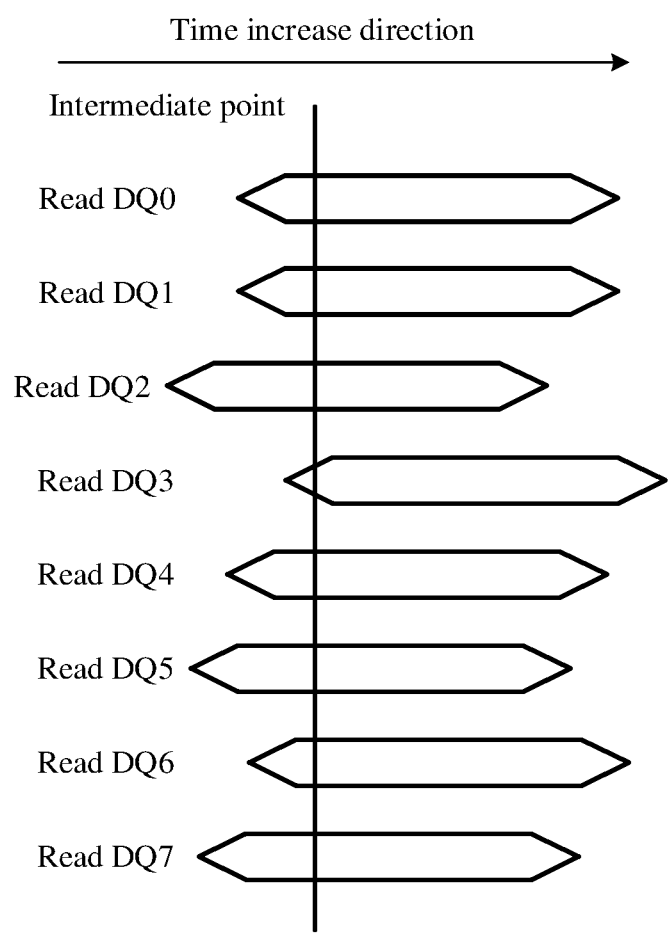

If an error occurs in reading of data carried in at least one read DQ under the first DQS receiving delay, the memory controller 111 may gradually increase the receiving delay of the read DQS, so that the intermediate point of the read DQS moves in a direction shown by an arrow in FIG. 11a until all data carried in the read DQ0 to the read DQ7 is correctly read. In this case, the receiving delay of the read DQS is the minimum DQS receiving delay. Under the minimum DQS receiving delay, an intersection point of the read DQS may be shown in FIG. 11b.

It should be understood that the foregoing process is merely a brief description. For specific implementation, reference may be made to the process of determining, by the memory controller 111, the minimum DQS sending delay of the write DQS shown in S801 to S804 in FIG. 8. Details are not described herein again.

2. Determine the Maximum DQS Receiving Delay

On the basis of the initial DQS receiving delay, the memory controller 111 increases the receiving delay of the read DQS according to a target hold time H2 applicable to the memory controller 111. In other words, the memory controller 111 increases the read DQS receiving delay from the initial DQS receiving delay to a second DQS receiving delay, and an interval between the second DQS receiving delay and the initial DQS receiving delay is the target hold time H2 applicable to the memory controller 111.

The target hold time H2 applicable to the memory controller 111 may be equal to a minimum hold time applicable to the memory controller 111, or may be greater than a minimum hold time applicable to the memory controller 111. A specific implementation of the target hold time H2 may be determined based on a performance requirement for data transmission between the memory controller 111 and the memory chip 12. This is not limited in embodiments of this application.

Figure 11C:
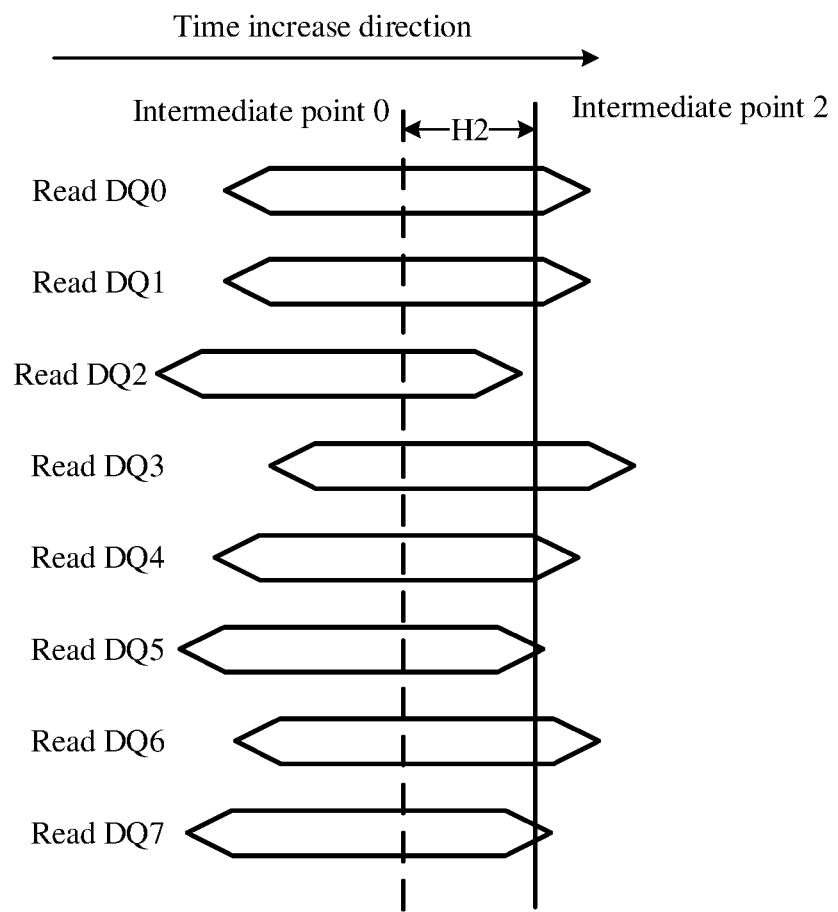

For example, as shown in FIG. 11c, when the receiving delay of the read DQS is the initial DQS receiving delay, an intermediate point of the read DQS may be shown as an intermediate point 0 in FIG. 9a. The memory controller 111 keeps receiving delays of the read DQ0 to the read DQ7, and increases the receiving delay of the read DQS. Compared with a period of a read DQ corresponding to an intermediate point of the read DQS, the memory controller 111 identifies a timing delay of the intermediate point of the read DQS. In other words, as shown in FIG. 11c, the intermediate point of the read DQS moves in a direction indicated by an arrow in FIG. 11c.

When the receiving delay of the read DQS is the second DQS receiving delay, the intermediate point of the read DQS may be shown as an intermediate point 2 in FIG. 11c. A time interval between the intermediate point 2 and the intermediate point 0 is a time interval between the second DQS receiving delay and the initial DQS receiving delay, and is the target hold time H2 applicable to the memory controller 111.

If all data carried in the read DQ0 to the read DQ7 is correctly read under the second DQS receiving delay, it indicates that a time interval between the initial DQS receiving delay and the maximum DQS receiving delay is large. A hold time between the read DQ0 and the read DQ7 is long enough, and no calibration is required. In this case, S1002 may continue to be performed without determining the maximum DQS receiving delay.

It may be understood that, there may also be a case in which the time interval between the initial DQS receiving delay and the maximum DQS receiving delay and the time interval between the initial DQS receiving delay and the minimum DQS receiving delay are large. In other words, on the basis of the initial DQS receiving delay, after the receiving delay of the read DQS is reduced according to the target setup time S2 applicable to the memory controller 111, all data carried in the read DQ0 to the read DQ7 is correctly read. In other words, the read DQ0 to the read DQ7 have a long enough setup time under the initial DQS receiving delay. On the basis of the initial DQS receiving delay, after the receiving delay of the read DQS is increased according to the target hold time H2 applicable to the memory controller 111, all data carried in the read DQ0 to the read DQ7 is correctly read. In other words, the read DQ0 to the read DQ7 have a long enough hold time under the initial DQS receiving delay. In this case, the memory controller 111 may directly use the initial DQS receiving delay as the target DQS receiving delay.

If an error occurs in reading of data carried in at least one read DQ under the second DQS receiving delay, it indicates that the hold time of the at least one read DQ under the initial DQS receiving delay is not long enough to meet a requirement for transmission performance (stability), and calibration is required. In this case, the intermediate point of the read DQS may be shown as an intermediate point 2 in FIG. 11c.

Figure 11D:
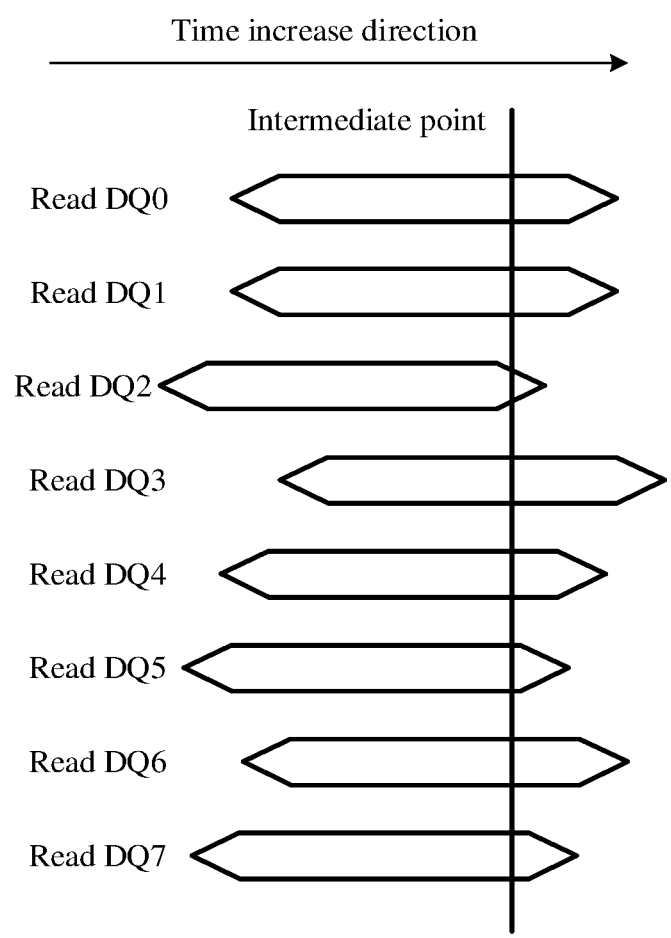

If an error occurs in reading of data carried in at least one read DQ, the memory controller 111 may gradually reduce the receiving delay of the read DQS, so that the intermediate point of the read DQS moves in an opposite direction to a direction shown by an arrow in FIG. 11c until all data carried in the read DQ0 to the read DQ7 is correctly read. In this case, the receiving delay of the read DQS is the maximum DQS receiving delay. Under the maximum DQS receiving delay, the intermediate point of the read DQS may be shown in FIG. 11d.

It should be understood that the foregoing process is merely a brief description. For specific implementation, reference may be made to the process of determining, by the memory controller 111, the maximum DQS sending delay of the write DQS shown in S805 to S808 in FIG. 8. Details are not described herein again.

S1002: The memory controller 111 keeps receiving delays of the N read DQs, and adjusts a receiving delay of the read DQS to a target DQS receiving delay between the maximum DQS receiving delay and the minimum DQS receiving delay. An interval between the target DQS receiving delay and the maximum DQS receiving delay is not less than a target hold time H2 applicable to the memory controller 111. An interval between the target DQS receiving delay and the minimum DQS receiving delay is not less than a target setup time S2 applicable to the memory controller 111.

It should be noted that since the memory controller 111 determines one or two of the maximum DQS receiving delay and the minimum DQS receiving delay in S1001, the target DQS receiving delay in S1002 also needs to be described by case.

Case 1: The memory controller 111 determines the maximum DQS receiving delay, but does not determine the minimum DQS receiving delay. In this case, an interval between the target DQS receiving delay and the maximum DQS receiving delay may be the target hold time H2 applicable to the memory controller 111.

In embodiments of this application, memory training may be performed after memory initialization. Therefore, an offset between read DQs is usually small. In other words, a time interval between the maximum DQS receiving delay and the minimum DQS receiving delay is large, and is close to period duration of the read DQs. In addition, since periods of the read DQs are usually far greater than the target hold time H2 applicable to the memory controller 111, when an interval between the target DQS receiving delay and the maximum DQS receiving delay is the target hold time H2 applicable to the memory controller 111, an interval between the target DQS receiving delay and the minimum DQS receiving delay is usually greater than the target setup time S2 applicable to the memory controller 111.

Case 2: The memory controller 111 determines the minimum DQS receiving delay, but does not determine the maximum DQS receiving delay. In this case, an interval between the target DQS receiving delay and the minimum DQS receiving delay may be the target setup time S2 applicable to the memory controller 111.

As described above, a time interval between the maximum DQS receiving delay and the minimum DQS receiving delay is large, and is close to period duration of read DQs. In addition, since periods of the read DQs are usually far greater than the target setup time S2 applicable to the memory controller 111, when an interval between the target DQS receiving delay and the minimum DQS receiving delay is the target setup time applicable to the memory controller 111, an interval between the target DQS receiving delay and the maximum DQS receiving delay is usually greater than the target hold time H2 applicable to the memory controller 111.

Case 3: The memory controller 111 determines the minimum DQS receiving delay and the maximum DQS receiving delay. In this case, an interval between the target DQS receiving delay and the maximum DQS receiving delay may be the target hold time H2 applicable to the memory controller 111, or an interval between the target DQS receiving delay and the minimum DQS receiving delay may be the target setup time S2 applicable to the memory controller 111, or the target DQS receiving delay may be located at an intermediate position between the maximum DQS receiving delay and the minimum DQS receiving delay.

As described above, a time interval between the maximum DQS receiving delay and the minimum DQS receiving delay is large, and is close to period duration of read DQs. The target DQS receiving delay is located at the intermediate position between the maximum DQS receiving delay and the minimum DQS receiving delay, so that a time interval between the target DQS receiving delay and the minimum DQS receiving delay may be greater than the target setup time S2 applicable to the memory controller 111, and a time interval between the target DQS receiving delay and the maximum DQS receiving delay may be greater than the target hold time H2 applicable to the memory controller 111.

In embodiments of this application, the memory controller 111 may align relative timing positions between the read DQ0 to the read DQ7 and the read DQS by adjusting the receiving delay of the read DQS. Compared with the memory training process shown in FIG. 4a to FIG. 4e, in embodiments of this application, the memory controller 111 does not need to adjust the receiving delays of the read DQ0 to the read DQ7. Therefore, memory training duration is shortened.

Embodiment 3: A Receiving Delay of a Write DQ is Adjusted to Align Relative Timing Positions Between the Write DQ and a Write DQS In both Embodiment 1 and Embodiment 2, memory training is implemented by adjusting a receiving delay or a sending delay of a DQS. It may be understood that, since there is a corresponding timing position relationship between a DQ and a DQS, relative timing positions between the DQ and the DQS may also be aligned by adjusting a receiving delay or a sending delay of the DQ.

Figure 12:
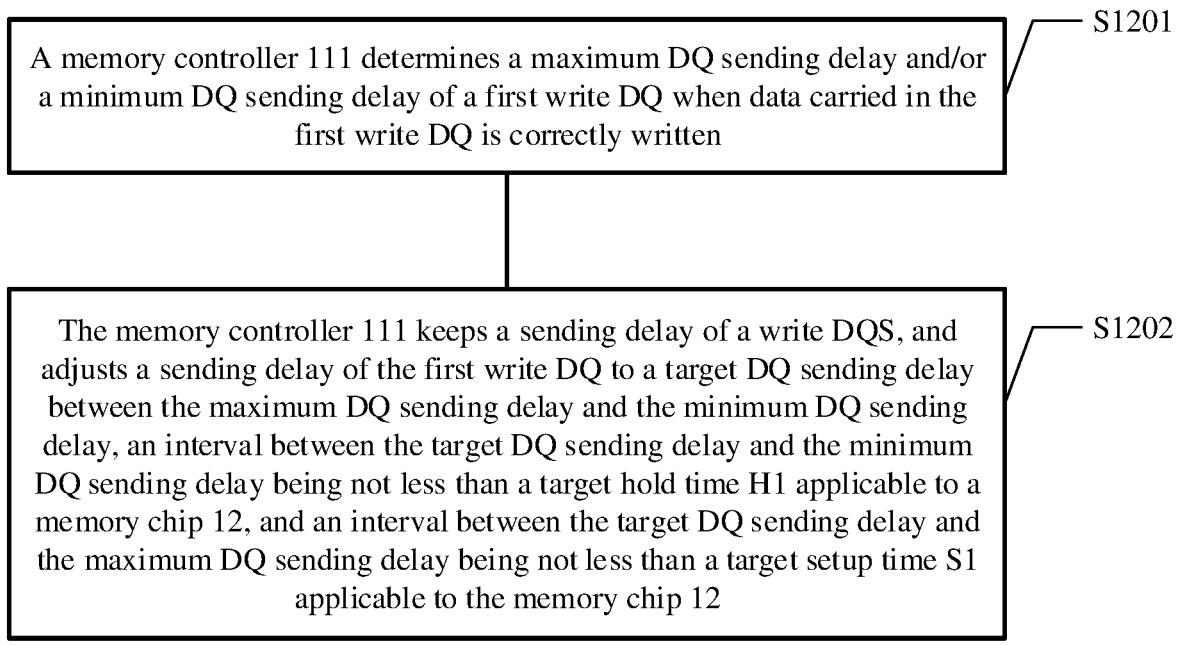
FIG. 12 is a schematic flowchart of a memory training method according to an embodiment of this application.

In Embodiment 3, the memory controller 111 may keep a sending delay of the write DQS, and adjust sending delays of a write DQ0 to a write DQ7 respectively, so that relative timing positions of each write DQ and the write DQS are aligned. For example, for any write DQ, Embodiment 3 mainly includes the following steps shown in FIG. 12:

S1201: The memory controller 111 determines a maximum DQ sending delay and/or a minimum DQ sending delay of a first write DQ when data carried in the first write DQ is correctly written.

The first write DQ may be any one of DQ0 to DQ7. It may be understood that, when the memory controller 111 keeps a sending delay of a write DQS unchanged, a time point at which an intersection point of the write DQS is transmitted to the memory chip 12 is stable. Compared with a time point at which the memory controller 111 sends an intersection point of the write DQS, a time point at which the memory controller 111 sends a period of a first write DQ corresponding to the intersection point of the write DQS will be delayed by increasing the sending delay of the first write DQ, so that a setup time of the first write DQ is reduced while a hold time is increased. Conversely, a time point at which the memory controller 111 sends a period of a first write DQ corresponding to the intersection point of the write DQS will be advanced by reducing the sending delay of the first write DQ, so that a hold time of the first write DQ is reduced while a setup time is increased.

Figure 13:
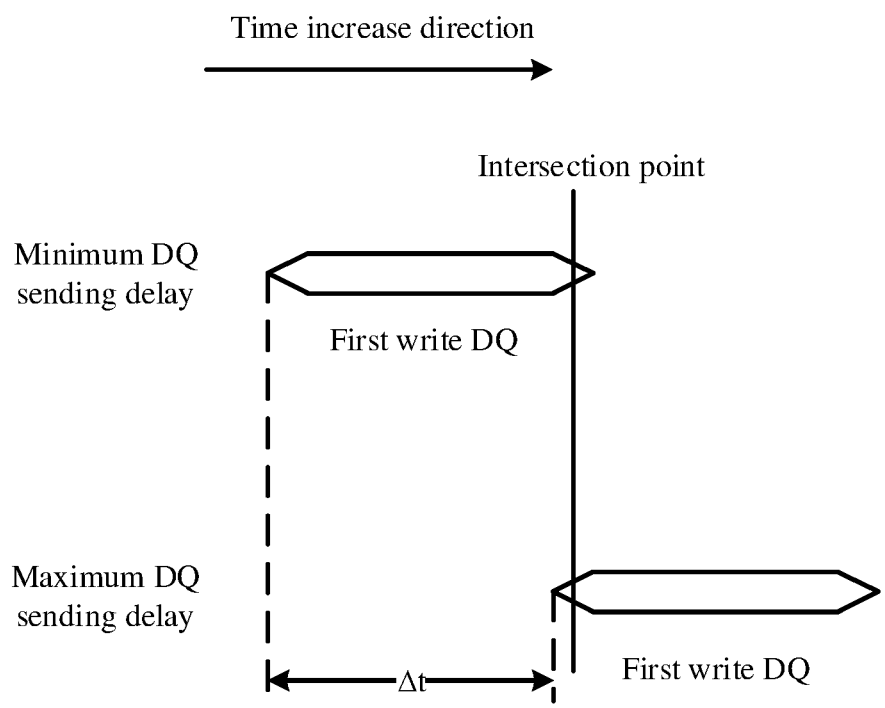
FIG. 13 is a schematic diagram of a maximum DQ sending delay and a minimum DQ sending delay according to an embodiment of this application.

In Embodiment 3, as shown in FIG. 13, when the sending delay of the first write DQ is greater than the maximum DQ sending delay, the memory chip 12 cannot correctly identify the level status of the first write DQ since the setup time of the first write DQ is too short. Thus, data carried in the first write DQ cannot be correctly written to the memory chip 12. When the sending delay of the first write DQ is less than the minimum DQ sending delay, the memory chip 12 cannot correctly identify the level status of the first write DQ since the hold time of the first write DQ is too short. Thus, data carried in the first write DQ cannot be correctly written to the memory chip 12.

S1202: The memory controller 111 keeps a sending delay of a write DQS, and adjusts a sending delay of the first write DQ to a target DQ sending delay between the maximum DQ sending delay and the minimum DQ sending delay. An interval between the target DQ sending delay and the minimum DQ sending delay is not less than a target hold time H1 applicable to the memory chip 12. An interval between the target DQ sending delay and the maximum DQ sending delay is not less than a target setup time S1 applicable to the memory chip 12.

For both the target hold time H1 and the target setup time S1 applicable to the memory chip 12, reference may be made to Embodiment 1. Details are not described herein again. It should be noted that since the memory controller 111 determines one or two of the maximum DQ sending delay and the minimum DQ sending delay of the first write DQ in S1201, the target DQ sending delay in S1202 also needs to be described by case.

Case 1: The memory controller 111 determines the maximum DQ sending delay of the first write DQ, but does not determine the minimum DQ sending delay of the first write DQ. In this case, an interval between the target DQ sending delay and the maximum DQ sending delay may be the target setup time S1 applicable to the memory chip 12.

As shown in FIG. 13, a time interval \t between the maximum DQ sending delay and the minimum DQ sending delay is close to period duration of the first write DQ, and a period of the first write DQ is usually far greater than the target setup time S1 applicable to the memory chip 12. Therefore, when an interval between the target DQ sending delay and the maximum DQ sending delay is the target setup time S1 applicable to the memory chip 12, an interval between the target DQ sending delay and the minimum DQ sending delay is usually greater than the target hold time H1 applicable to the memory chip 12.

Case 2: The memory controller 111 determines the minimum DQ sending delay of the first write DQ, but does not determine the maximum DQ sending delay of the first write DQ. In this case, an interval between the target DQ sending delay and the minimum DQ sending delay may be the target hold time H1 applicable to the memory chip 12.

As described above, the time interval \t between the maximum DQ sending delay and the minimum DQ sending delay is close to period duration of the first write DQ, and the period of the first write DQ is usually far greater than the target hold time H1 applicable to the memory chip 12. Therefore, when an interval between the target DQ sending delay and the minimum DQ sending delay is the target hold time H1 applicable to the memory chip 12, an interval between the target DQ sending delay and the maximum DQ sending delay is usually greater than the target setup time S1 applicable to the memory chip 12.

Case 3: The memory controller 111 determines the minimum DQ sending delay and the maximum DQ sending delay. In this case, an interval between the target DQ sending delay and the maximum DQ sending delay may be the target setup time S1 applicable to the memory chip 12, or an interval between the target DQ sending delay and the minimum DQ sending delay may be the target hold time H1 applicable to the memory chip 12, or the target DQ sending delay may be located at an intermediate position between the maximum DQ sending delay and the minimum DQ sending delay.

As described above, the time interval \t between the maximum DQ sending delay and the minimum DQ sending delay is close to the period duration of the first write DQ. The target DQ sending delay is located at the intermediate position between the maximum DQ sending delay and the minimum DQ sending delay, so that a time interval between the target DQ sending delay and the minimum DQ sending delay may be greater than the target hold time H1 applicable to the memory chip 12, and a time interval between the target DQ sending delay and the maximum DQ sending delay may be greater than the target setup time S1 applicable to the memory chip 12.

In Embodiment 3, the memory controller 111 adjusts the sending delay of the first write DQ, so that relative timing positions between the first write DQ and the write DQS may be aligned. The memory controller 111 may successively adjust the sending delays of the write DQ0 to the write DQ7 by using the method shown in FIG. 12, to respectively align relative timing positions between the write DQ0 to the write DQ7 and the write DQS.

In Embodiment 3, the memory controller 111 adjusts a sending delay of only one write DQ (first write DQ) in each memory training process. Compared with the memory training process shown in FIG. 4a to FIG. 4e, in Embodiment 3, the memory controller 111 does not need to adjust sending delays of other write DQs and the write DQS. Therefore, memory training duration is shortened.

It should be noted that, it is assumed that the first write DQ is a write DQ0 transmitted by the data signal line L0 in FIG. 1. Then, when the memory controller 111 adjusts the sending delay of the write DQ0, the memory controller 111 may still access the memory chip 12 through the data signal line L1 to the data signal line L7. In other words, in Embodiment 3, when the relative timing positions between the write DQ0 to the write DQ7 and the write DQS are aligned, the memory chip 12 may be further accessed in parallel, to further reduce influence of memory training on continuous running of the processor core 112.

It should be noted that when the memory controller 111 performs S1201, the memory controller 111 may determine the maximum DQ sending delay and the minimum DQ sending delay of the first write DQ, respectively. When an offset between an initial DQ sending delay of the first write DQ and the minimum DQ sending delay is large, it indicates that the first write DQ has a long enough hold time under the initial DQ sending delay. In this case, only the maximum DQ sending delay may be determined. Similarly, when an offset between the initial DQ sending delay of the first write DQ and the maximum DQ sending delay is large, it indicates that the first write DQ has a long enough setup time under the initial DQ sending delay. In this case, only the minimum DQ sending delay may be determined.

The initial DQ sending delay of the first write DQ may be understood as a sending delay of the first write DQ before the memory controller 111 starts to perform memory training or when the memory controller starts to perform memory training. The initial DQ sending delay of the first write DQ may also be understood as a sending delay of the first write DQ before the memory controller 111 receives the foregoing trigger instruction.

In a possible implementation, the memory controller 111 may gradually reduce the sending delay of the first write DQ starting from the initial DQ sending delay until an error occurs in writing of data carried in the first write DQ. In this case, the sending delay of the first write DQ may be used as the minimum DQ sending delay. The memory controller 111 may further gradually increase the sending delay of the first write DQ starting from the initial DQ sending delay until an error occurs in writing of data carried in the first write DQ. In this case, the sending delay of the first write DQ may be used as the maximum DQ sending delay.

Figure 14:
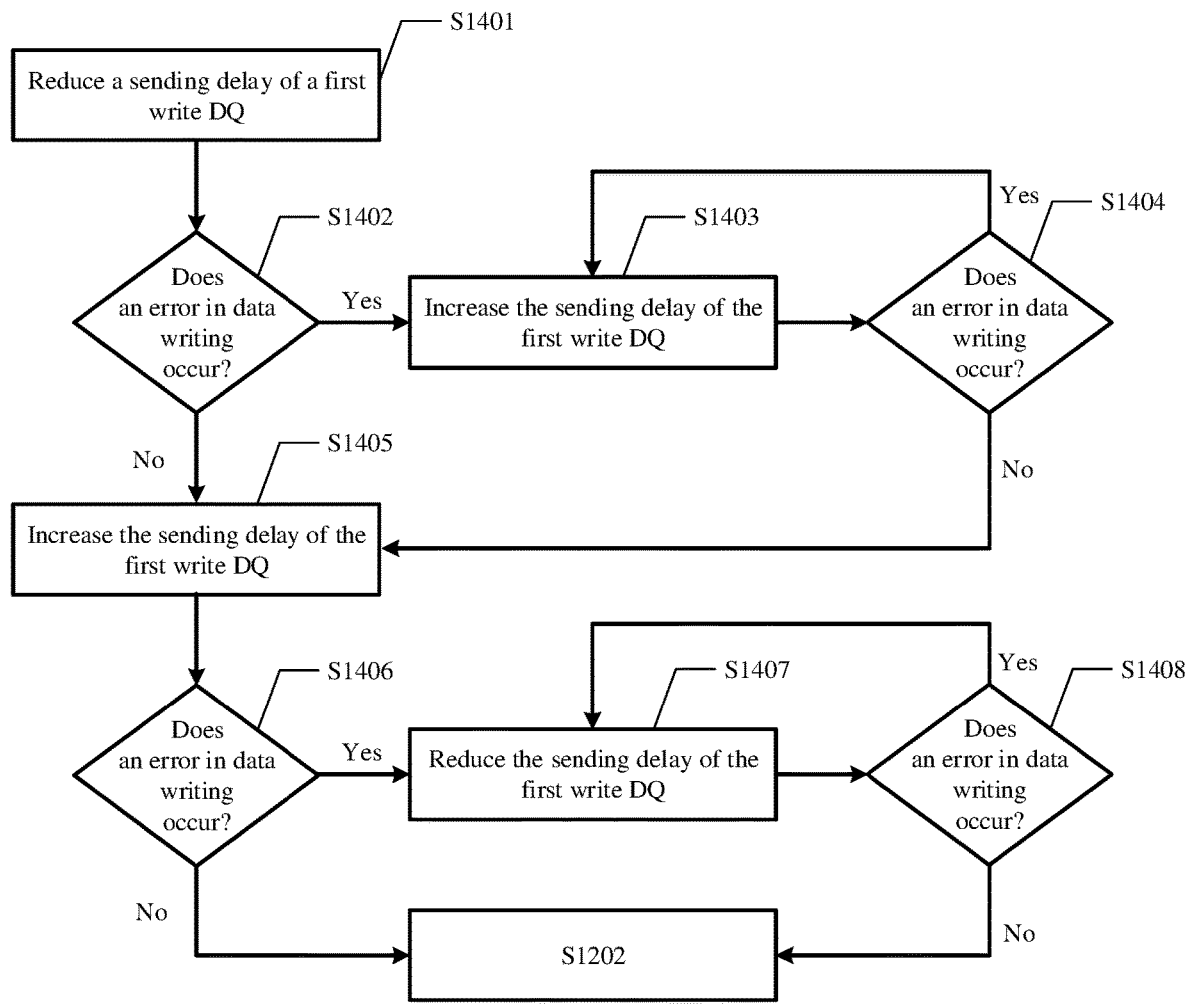
FIG. 14 is a schematic flowchart of a method for determining a maximum DQ sending delay and/or a minimum DQ sending delay according to an embodiment of this application.

In another possible implementation, the memory controller 111 may further determine the maximum DQ sending delay and/or the minimum DQ sending delay by using the method shown in FIG. 14. The method mainly includes the following steps:

S1401: The memory controller 111 reduces, on the basis of the initial DQ sending delay, the sending delay of the first write DQ according to the target hold time H1 applicable to the memory chip 12. In other words, the memory controller 111 may reduce the sending delay of the first write DQ from the initial DQ sending delay to a first DQ sending delay. An interval between the first DQ sending delay and the initial DQ sending delay is the target hold time applicable to the memory chip 12.

S1402: If an error occurs in writing of data carried in the first write DQ, the memory controller 111 continues to perform S1403. If data carried in the first write DQ is correctly written, the memory controller 111 continues to perform S1405.

It may be understood that if data carried in the first write DQ is correctly written, it indicates that a time interval between the initial DQ sending delay and the minimum DQ sending delay is large, a hold time of the first write DQ is long enough under the initial DQ sending delay, and no calibration is required. Therefore, the memory controller 111 may continue to perform S1405 without determining the minimum DQ sending delay, and increase the sending delay of the first write DQ, to determine the maximum DQ sending delay of the first write DQ.

If an error occurs in writing of data carried in the first write DQ, it indicates that the hold time of the first write DQ under the initial DQ sending delay is not long enough to meet a requirement for transmission performance (stability), and calibration is required. For example, as shown in FIG. 15, an intersection point of the write DQS under the initial DQ sending delay is located at a late position of a period of the first write DQ, that is, the hold time of the first write DQ is short under the initial DQ sending delay.

On the basis of the initial DQ sending delay, the memory controller 111 reduces the sending delay of the first DQ from the initial DQ sending delay to the first DQ sending delay according to the target hold time H1 applicable to the memory chip 12. Since the memory controller 111 keeps the sending delay of the write DQS, time at which a corresponding period of the first write DQ is transmitted to the memory chip 12 is advanced compared with the intersection point of the write DQS, and an advanced time amplitude is the target hold time H1 applicable to the memory chip 12.

Figure 15:
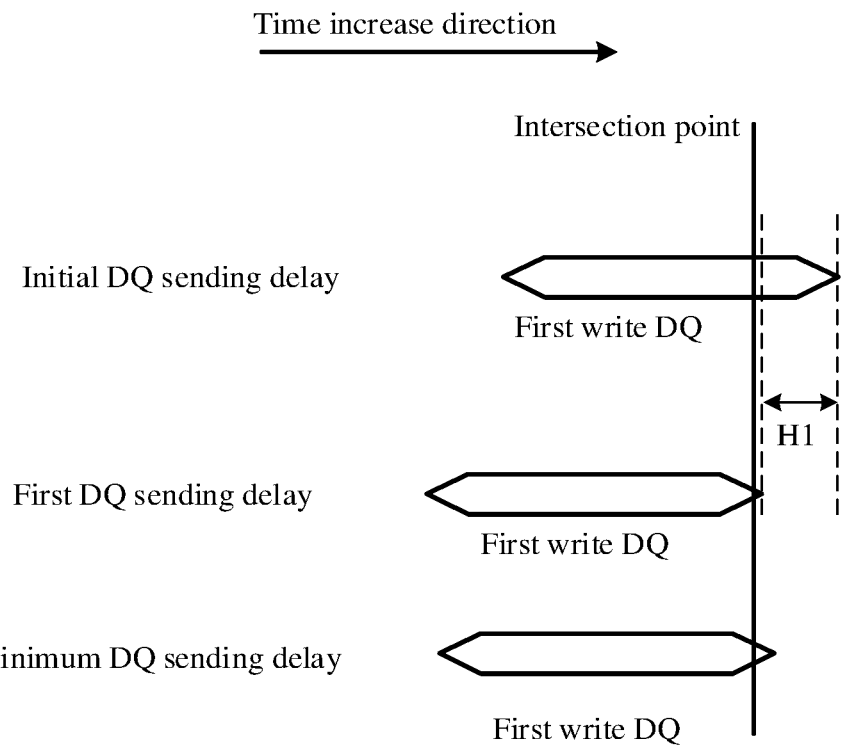
FIG. 15 is a schematic diagram of adjusting a transmission delay of a DQ in a memory training process according to an embodiment of this application.

It can be learned from FIG. 15 that the hold time of the first write DQ is not long enough under the first DQ sending delay, thereby causing an error in writing of data carried in the first write DQ.

S1403: The memory controller 111 increases the sending delay of the first write DQ according to a third adjustment amplitude. It should be noted that the third adjustment amplitude is less than the target hold time H1 applicable to the memory chip 12. Generally, the third adjustment amplitude may be a minimum adjustment amplitude that can be used by the memory controller 111 to adjust the sending delay of the first write DQ.

S1404: If an error occurs in writing of data carried in the first write DQ, the memory controller 111 returns to continue performing S1403.

The memory controller 111 performs S1403 and S1404 for one or more times, and gradually increases the sending delay of the first write DQ until data carried in the first write DQ is correctly written. In this case, the sending delay of the first write DQ may be used as the minimum DQ sending delay, as shown in FIG. 15.

It may be understood that, in a working process of the electronic device 10, even if the intersection point of the write DQS is offset from an intermediate position of a corresponding first write DQ period, the intersection point of the write DQS is still located near the intermediate position of the corresponding write DQ period. In this case, if the memory controller 111 gradually reduces the sending delay of the first write DQ from an initial DQ time point, the memory controller 111 can determine the minimum DQ sending delay by adjusting the sending delay of the first write DQ for a plurality of times and checking whether data carried in the first write DQ is correctly written.

In S1401 to S1404 provided in embodiments of this application, the target hold time H1 applicable to the memory chip 12 is usually less than a half-period of the first write DQ. However, an adjustment amplitude from the first DQ sending delay to the minimum DQ sending delay does not exceed the target hold time H1 applicable to the memory chip 12. Therefore, S1403 is performed for a small number of times, and thus the minimum DQ sending delay may be quickly determined.

Figure 16:
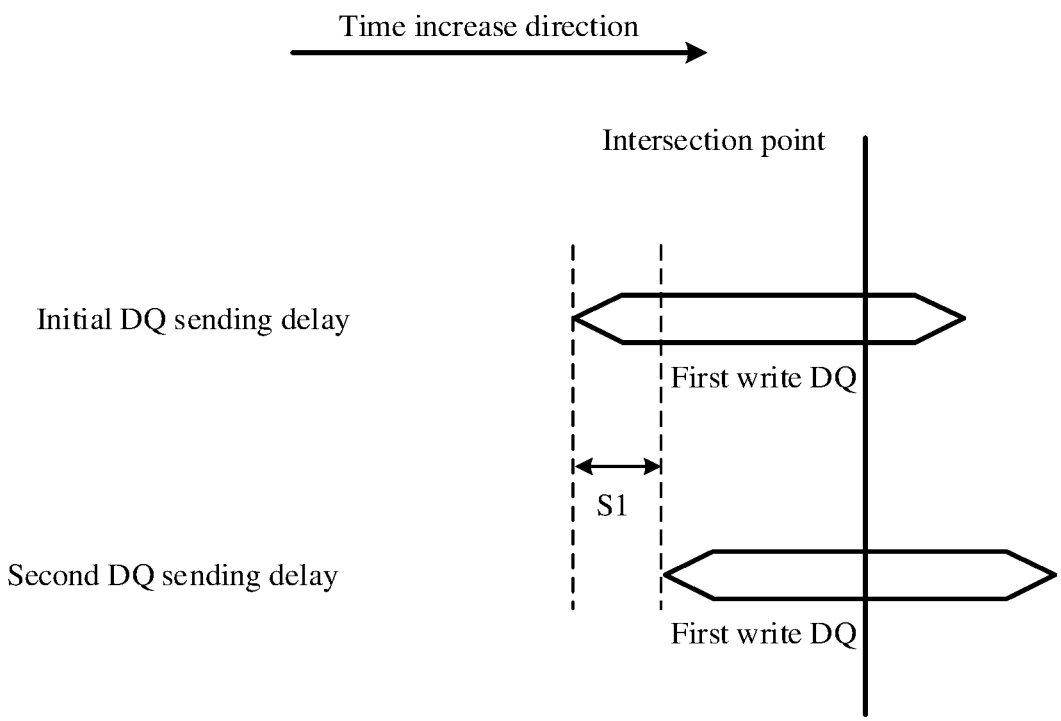
FIG. 16 is a schematic diagram of adjusting a transmission delay of a DQ in a memory training process according to an embodiment of this application.

S1405: The memory controller 111 increases, on the basis of the initial DQ sending delay, the sending delay of the first write DQ according to the target setup time S1 applicable to the memory chip 12. In other words, as shown in FIG. 16, the memory controller 111 may increase the sending delay of the first write DQ from the initial DQ sending delay to a second DQ sending delay. An interval between the second DQ sending delay and the initial DQ sending delay is the target setup time S1 applicable to the memory chip 12.

The memory controller 111 keeps the sending delay of the write DQS, and increases the sending delay of the first write DQ. Therefore, compared with the intersection point of the write DQS, time at which a corresponding period of the first write DQ is transmitted to the memory chip 12 is delayed. In other words, the period of the first write DQ moves in a direction shown by an arrow in FIG. 16. In addition, a moving distance is the target setup time S1 applicable to the memory chip 12.

S1406: If an error occurs in writing of data carried in the first write DQ, the memory controller 111 continues to perform S1407. If data carried in the first write DQ is correctly written, the memory controller 111 continues to perform S1408.

It may be understood that if data of the first write DQ is correctly written under the second DQ sending delay, it indicates that a time interval between the initial DQ sending delay and the maximum DQ sending delay is large, a hold time of the first write DQ is long enough under the initial DQ sending delay, and no calibration is required. As shown in FIG. 16, an intersection point of the write DQS under the initial DQ sending delay is located at a late position of a corresponding period of the first write DQ. In other words, the setup time of the first write DQ is long under the initial DQ sending delay.

After the memory controller 111 increases the sending delay of the first write DQ to the second DQ sending delay, the first write DQ still has a large setup time, and data carried in the first write DQ may still be correctly written to the memory chip 12. Therefore, the memory controller 111 does not need to determine the maximum DQ sending delay, and may continue performing S1202.

In some scenarios, there may be some cases in which data carried in the first write DQ is correctly written in S1402 and S1406. In other words, on the basis of the initial DQ sending delay, after the sending delay of the first write DQ is reduced according to the target hold time H1 applicable to the memory chip 12, data carried in the first write DQ is correctly written. In other words, the first write DQ has a long enough hold time under the initial DQ sending delay. On the basis of the initial DQ sending delay, after the sending delay of the first write DQ is increased according to the target setup time S1 applicable to the memory chip 12, data carried in the first write DQ is correctly written. In other words, the first write DQ has a long enough setup time under the initial DQ sending delay. In this case, the memory controller 111 may directly use the initial DQ sending delay as the target DQ sending delay.

If an error occurs in writing of data carried in the first write DQ under the second DQ sending delay, it indicates that the setup time of the first write DQ is not long enough to maintain a requirement for transmission performance (stability), and calibration is required.

Generally, neither the target setup time S1 nor the target hold time H1 of the memory chip 12 is greater than duration of a half-period of the first write DQ. In other words, if the memory controller 111 determines the minimum DQ sending delay of the first write DQ, the memory controller 111 does not need to determine the maximum DQ sending delay of the first write DQ. If the memory controller 111 determines the maximum DQ sending delay of the first write DQ, the memory controller 111 does not need to determine the minimum DQ sending delay of the first write DQ.

S1407: The memory controller 111 reduces the sending delay of the first write DQ according to a fourth adjustment amplitude. It should be noted that the fourth adjustment amplitude is less than the target setup time applicable to the memory chip 12. Generally, the fourth adjustment amplitude may also be a minimum adjustment amplitude that can be used by the memory controller 111 to adjust the sending delay of the first write DQ.

S1408: If an error occurs in writing of data carried in the first write DQ, the memory controller 111 returns to continue performing S1407.

The memory controller 111 performs S1407 and S1408 for one or more times, and gradually reduces the sending delay of the first write DQ until data carried in the first write DQ is correctly written. In this case, the sending delay of the first write DQ may be used as the maximum DQ sending delay.

The memory controller 111 may determine the maximum DQ sending delay and/or the minimum DQ sending delay of the first write DQ by performing the method shown in FIG. 14. Then, the memory controller 111 may continue performing S1202 based on the maximum DQ sending delay and/or the minimum DQ sending delay.

It may be understood that, in the process of determining, by the memory controller 111, the maximum DQ sending delay and/or the minimum DQ sending delay of the first write DQ, the memory controller 111 may increase, on the basis of the initial DQ sending delay, the sending delay of the first write DQ according to the target setup time S1 applicable to the memory chip 12, to determine the maximum DQ sending delay of the first write DQ, and then reduce, on the basis of the initial DQ sending delay, the sending delay of the first write DQ according to the target hold time H1 applicable to the memory chip 12, to determine the minimum DQ sending delay of the first write DQ. The foregoing process should also be included in embodiments of this application, and specific implementation details are not described again.

Embodiment 4: A Receiving Delay of a Read DQ is Adjusted to Align Relative Timing Positions Between the Read DQ and a Read DQS Based on a technical concept similar to that in Embodiment 3, in Embodiment 4 provided in embodiments of this application, the relative timing positions between the read DQ and the read DQS may be aligned.

Figure 17:
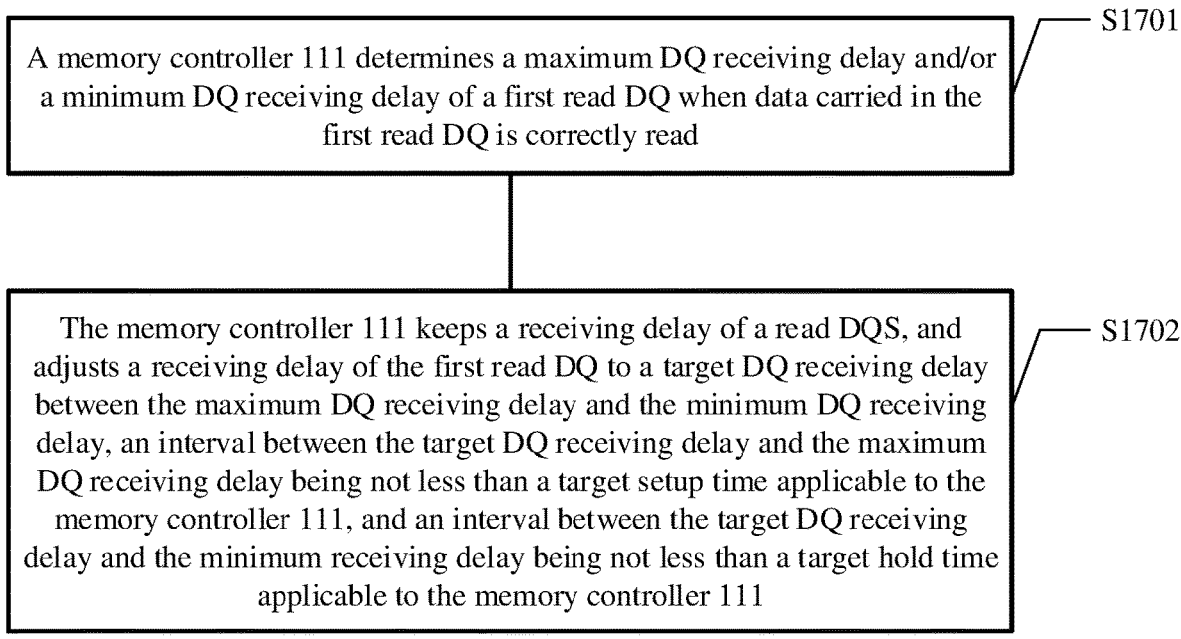
FIG. 17 is a schematic flowchart of a memory training method according to an embodiment of this application.

Specifically, as shown in FIG. 17, Embodiment 4 mainly includes the following steps:

S1701: The memory controller 111 determines a maximum DQ receiving delay and/or a minimum DQ receiving delay of a first read DQ when data carried in the first read DQ is correctly read.

This process is similar to S1202. A difference lies in that the memory chip 12 outputs the first read DQ and a read DQS, and the memory controller 111 receives the first read DQ and the read DQS. Generally, an intermediate point between adjacent intersection points in the read DQS is used as a trigger point, and the memory controller 111 is triggered to identify a level status of the first read DQ.

Specifically, in a possible implementation, the memory controller 111 may gradually reduce a receiving delay of the first read DQ starting from an initial DQ receiving delay until an error occurs in reading of data carried in the first read DQ. In this case, the receiving delay of the first read DQ may be used as the minimum DQ receiving delay. The memory controller 111 may further gradually increase the receiving delay of the first read DQ starting from the initial DQ receiving delay until an error occurs in reading of data carried in the first read DQ. In this case, the receiving delay of the first read DQ may be used as the maximum DQ receiving delay.

In another possible implementation, the memory controller 111 may further determine the maximum DQ receiving delay and the minimum DQ receiving delay of the first read DQ by using a process similar to that in FIG. 14. Specifically, the memory controller 111 may determine the maximum DQ receiving delay and/or the minimum DQ receiving delay, respectively.

1. Determine the Minimum DQ Receiving Delay

Figure 18:
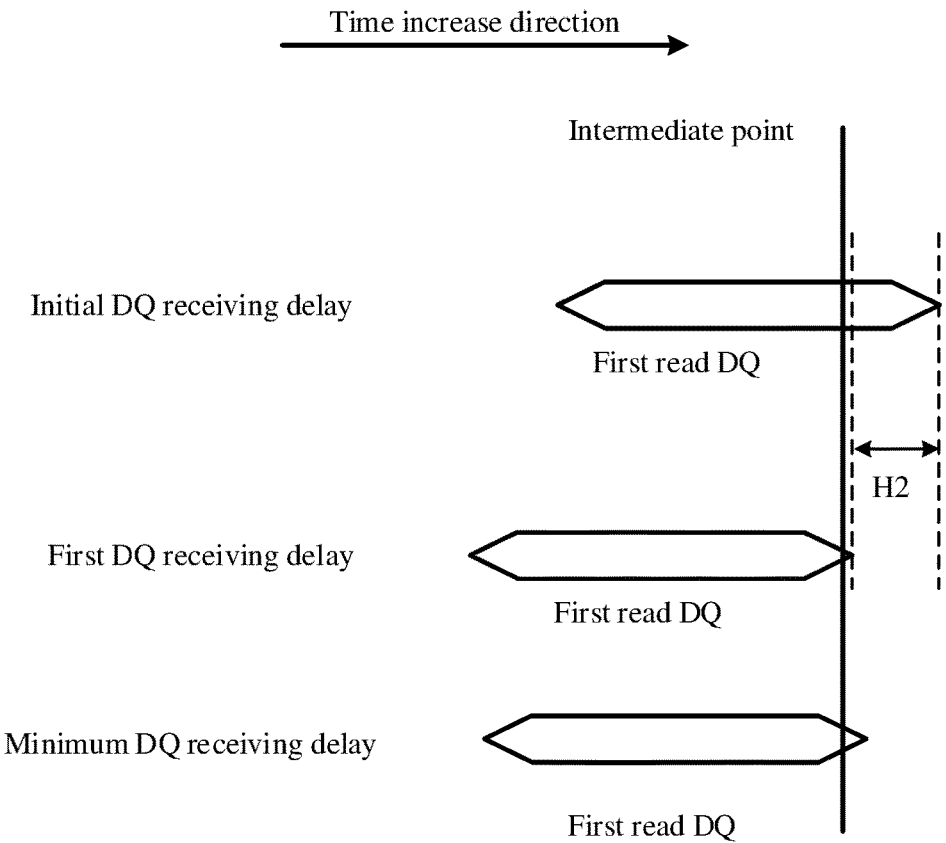
FIG. 18 is a schematic diagram of adjusting a transmission delay of a DQ in a memory training process according to an embodiment of this application.

On the basis of the initial DQ receiving delay, the memory controller 111 reduces the receiving delay of the first read DQ according to a target hold time applicable to the memory controller 111. As shown in FIG. 18, the memory controller 111 reduces the receiving delay of the first read DQ from the initial DQ receiving delay to a first DQ receiving delay, and an interval between the first DQ receiving delay and the initial DQ receiving delay is the target hold time H2 applicable to the memory controller 111.

For a specific implementation of the target setup time S2 to which the memory controller 111 is applicable, reference may be made to Embodiment 2. Details are not described herein again.

If data carried in the first read DQ is correctly read under the first DQ receiving delay, it indicates that a time interval between the initial DQ receiving delay and the minimum DQ receiving delay is large. Under the initial DQ receiving delay, a setup time of the first read DQ is long enough, and no calibration is required. In this case, the maximum DQ receiving delay may continue to be determined without determining the minimum DQ receiving delay. If an error occurs in reading of data carried in the first read DQ, it indicates that the hold time of the first read DQ under the initial DQ receiving delay is not long enough to meet a requirement for transmission performance (stability), and calibration is required, as shown in FIG. 18.

If an error occurs in reading of data carried in the first read DQ under the first DQ receiving delay, the memory controller 111 may gradually increase the receiving delay of the first read DQ, so that an intermediate point of the first read DQ relative to the read DQS moves in a direction shown by an arrow in FIG. 18 until data carried in the first read DQ is correctly read. In this case, the receiving delay of the first read DQ is the minimum DQ receiving delay, as shown in FIG. 18.

It should be understood that the foregoing process is merely a brief description. For specific implementation, reference may be made to the process of determining, by the memory controller 111, the minimum DQ sending delay of the first write DQ shown in S1401 to S1404 in FIG. 14. Details are not described herein again.

2. Determine the Maximum DQ Receiving Delay

Figure 19:
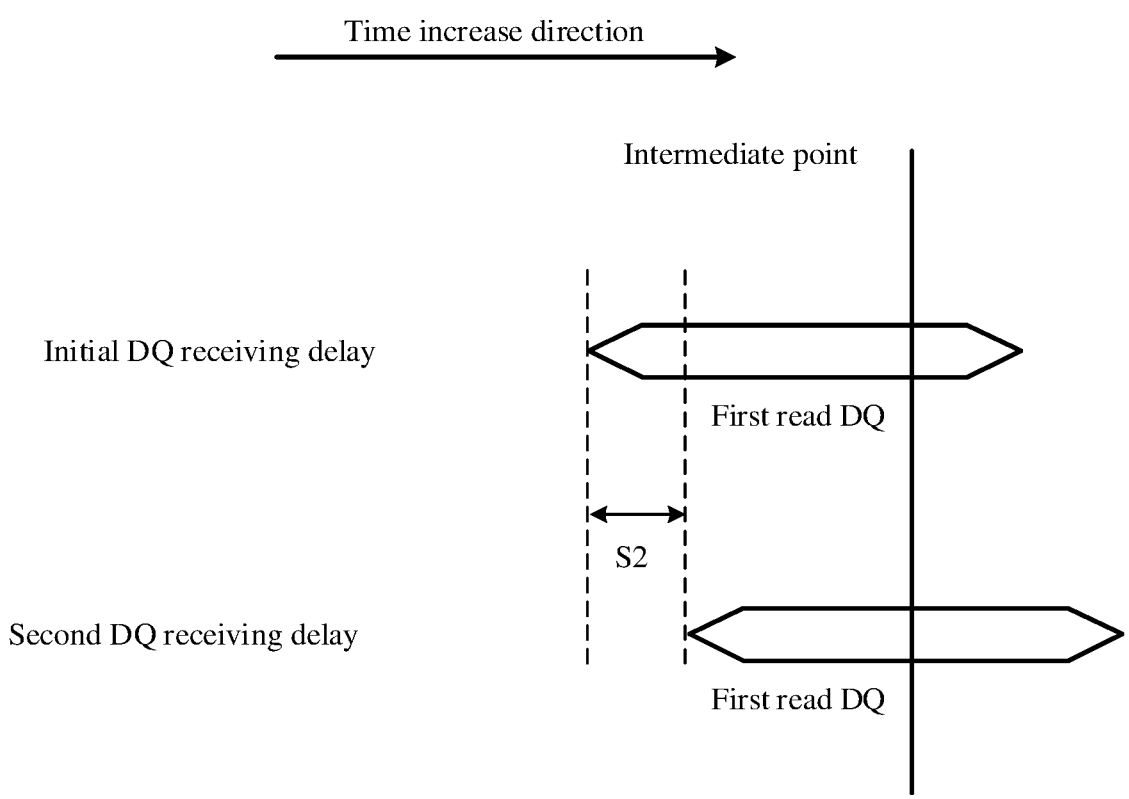
FIG. 19 is a schematic diagram of adjusting a transmission delay of a DQ in a memory training process according to an embodiment of this application.

On the basis of the initial DQ receiving delay, the memory controller 111 increases the receiving delay of the first read DQ according to a target setup time S2 applicable to the memory controller 111. As shown in FIG. 19, the memory controller 111 increases the receiving delay of the first read DQ from the initial DQ receiving delay to a second DQ receiving delay, and an interval between the second DQ receiving delay and the initial DQ receiving delay is the target setup time S2 applicable to the memory controller 111. For a specific implementation of the target setup time S2 to which the memory controller 111 is applicable, reference may be made to Embodiment 2. Details are not described herein again.

If data of the first read DQ is correctly read under the second DQ receiving delay, as shown in FIG. 19, it indicates that a time interval between the initial DQ receiving delay and the maximum DQ receiving delay is large. Under the initial DQ receiving delay, a setup time of the first read DQ is long enough, and no calibration is required. In this case, S1702 may continue to be performed without determining the maximum DQ receiving delay.

It may be understood that, there may also be a case in which the time interval between the initial DQ receiving delay and the maximum DQ receiving delay and the time interval between the initial DQ receiving delay and the minimum DQ receiving delay are large. In other words, on the basis of the initial DQ receiving delay, after the receiving delay of the first read DQ is increased according to the target setup time S2 applicable to the memory controller 111, data carried in the first read DQ is correctly read. In other words, the first read DQ has a long enough setup time under the initial DQ receiving delay. On the basis of the initial DQ receiving delay, after the receiving delay of the first read DQ is reduced according to the target hold time H2 applicable to the memory controller 111, data carried in the first read DQ is correctly read. In other words, the first read DQ has a long enough hold time under the initial DQ receiving delay. In this case, the memory controller 111 may directly use the initial DQ receiving delay as the target DQ receiving delay.

If an error occurs in reading of data carried in the first read DQ under the second DQ receiving delay, it indicates that the setup time of the first read DQ under the initial DQ receiving delay is not long enough to maintain transmission performance (stability), and calibration is required. The memory controller 111 may gradually reduce the receiving delay of the first read DQ starting from the second DQ receiving delay until data carried in the first read DQ is correctly read. In this case, the receiving delay of the first read DQ is the maximum DQ receiving delay.

It should be understood that the foregoing process is merely a brief description. For specific implementation, reference may be made to the process of determining, by the memory controller 111, the maximum DQ sending delay of the first write DQ shown in S1405 to S1408 in FIG. 8. Details are not described herein again.

Generally, neither the target setup time S2 nor the target hold time H2 of the memory controller 111 is greater than duration of a half-period of the first read DQ. In other words, if the memory controller 111 determines the minimum DQ receiving delay of the first read DQ, the memory controller 111 does not need to determine the maximum DQ receiving delay of the first read DQ. If the memory controller 111 determines the maximum DQ receiving delay of the first read DQ, the memory controller 111 does not need to determine the minimum DQ receiving delay of the first read DQ.

S1702: The memory controller 111 keeps a receiving delay of a read DQS, and adjusts a receiving delay of the first read DQ to a target DQ receiving delay between the maximum DQ receiving delay and the minimum DQ receiving delay. An interval between the target DQ receiving delay and the maximum DQ receiving delay is not less than a target setup time applicable to the memory controller 111. An interval between the target DQ receiving delay and the minimum receiving delay is not less than a target hold time applicable to the memory controller 111.

It should be noted that since the memory controller 111 determines one or two of the maximum DQ receiving delay and the minimum DQ receiving delay in S1701, the target DQ receiving delay in S1702 also needs to be described by case.

Case 1: The memory controller 111 determines the maximum DQ receiving delay, but does not determine the minimum DQ receiving delay. In this case, an interval between the target DQ receiving delay and the maximum DQ receiving delay may be the target setup time S2 applicable to the memory controller 111. Since a time interval between the maximum DQ receiving delay and the minimum DQ receiving delay is large, the interval is close to period duration of the first read DQ. In addition, since a period of the first read DQ is usually far greater than the target setup time S2 applicable to the memory controller 111, when an interval between the target DQ receiving delay and the maximum DQ receiving delay is the target setup time applicable to the memory controller 111, an interval between the target DQ receiving delay and the minimum DQ receiving delay is usually greater than the target hold time H2 applicable to the memory controller 111.

Case 2: The memory controller 111 determines the minimum DQ receiving delay, but does not determine the maximum DQ receiving delay. In this case, an interval between the target DQ receiving delay and the minimum DQ receiving delay may be the target hold time H2 applicable to the memory controller 111. As described above, a time interval between the maximum DQ receiving delay and the minimum DQ receiving delay is large, and is close to the period duration of the first read DQ. In addition, since the period of the first read DQ is usually far greater than the target hold time H2 applicable to the memory controller 111, when an interval between the target DQ receiving delay and the minimum DQ receiving delay is the target hold time H2 applicable to the memory controller 111, an interval between the target DQ receiving delay and the maximum DQ receiving delay is usually greater than the target setup time S2 applicable to the memory controller 111.

Case 3: The memory controller 111 determines the minimum DQ receiving delay and the maximum DQ receiving delay. In this case, an interval between the target DQ receiving delay and the maximum DQ receiving delay may be the target setup time S2 applicable to the memory controller 111, or an interval between the target DQ receiving delay and the minimum DQ receiving delay may be the target hold time H2 applicable to the memory controller 111, or the target DQ receiving delay may be located at an intermediate position between the maximum DQ receiving delay and the minimum DQ receiving delay.

As described above, a time interval between the maximum DQ receiving delay and the minimum DQ receiving delay is large, and is close to the period duration of the read DQ. The target DQ receiving delay is located at the intermediate position between the maximum DQ receiving delay and the minimum DQ receiving delay, so that a time interval between the target DQ receiving delay and the minimum DQ receiving delay may be greater than the target hold time H2 applicable to the memory controller 111, and a time interval between the target DQ receiving delay and the maximum DQ receiving delay may be greater than the target setup time S2 applicable to the memory controller 111.

In Embodiment 4, the memory controller 111 adjusts a receiving delay of only one read DQ (first read DQ) in each memory training process. Compared with the memory training process shown in FIG. 4*a* to FIG. 4*e*, in Embodiment 4, the memory controller 111 does not need to adjust receiving delays of other read DQs and the read DQS. Therefore, memory training duration is shortened.

It should be noted that, it is assumed that the first read DQ is a read DQ0 transmitted by the data signal line L0 in FIG. 1. Then, when the memory controller 111 adjusts the receiving delay of the write DQ0, the memory controller 111 may still access the memory chip 12 through the data signal line L1 to the data signal line L7. In other words, in Embodiment 4, when the relative timing positions between the read DQ0 to the read DQ7 and the read DQS are aligned, the memory chip 12 may be further accessed in parallel, to further reduce influence of memory training on continuous running of the processor core 112.

It should be noted that, in Embodiment 3 and Embodiment 4, the memory controller 111 may align relative timing positions between a write DQ and a write DQS on only one data transmission line in each memory training, and relative timing positions between a read DQ and a read DQS on the data transmission line. The memory controller 111 successively completes alignment between the write DQ0 to the write DQ7 and the write DQS, and alignment between the read DQ0 to the read DQ7 and the read DQS by using a round-robin rule. For example, the round-robin rule used by the memory controller 111 may be shown in FIG. 20, and mainly includes the following steps:

S2001: The memory controller 111 receives a trigger instruction.

S2002: The memory controller 111 determines, according to the round-robin rule, that a sending delay of a write DQ0 and a receiving delay of a read DQ0 need to be adjusted. The memory controller 111 further adjusts the sending delay of the write DQ0, so that relative timing positions between the write DQ0 and a write DQS are aligned. In addition, the memory controller 111 adjusts the receiving delay of the read DQ0, so that relative timing positions between the read DQ0 and a read DQS are aligned.

S2003: The memory controller 111 completes memory training.

S2004: The memory controller 111 receives a trigger instruction.

S2005: The memory controller 111 determines, according to the round-robin rule, that a sending delay of a write DQ1 and a receiving delay of a read DQ1 need to be adjusted. The memory controller 111 further adjusts the sending delay of the write DQ1, so that relative timing positions between the write DQ1 and the write DQS are aligned. In addition, the memory controller 111 adjusts the receiving delay of the read DQ1, so that relative timing positions between the read DQ1 and the read DQS are aligned.

S2006: The memory controller 111 completes memory training.

By analogy, the memory controller 111 successively adjusts sending delays of a write DQ2 to a write DQ7 and receiving delays of a read DQ2 to a read DQ7 according to the foregoing rule.

S2007: The memory controller 111 receives a trigger instruction.

S2008: The memory controller 111 determines, according to the round-robin rule, that a sending delay of a write DQ7 and a receiving delay of a read DQ7 need to be adjusted. The memory controller 111 further adjusts the sending delay of the write DQ7, so that relative timing positions between the write DQ7 and the write DQS are aligned. In addition, the memory controller 111 adjusts the receiving delay of the read DQ7, so that relative timing positions between the read DQ7 and the read DQS are aligned.

S2009: The memory controller 111 completes memory training.

Figure 20:
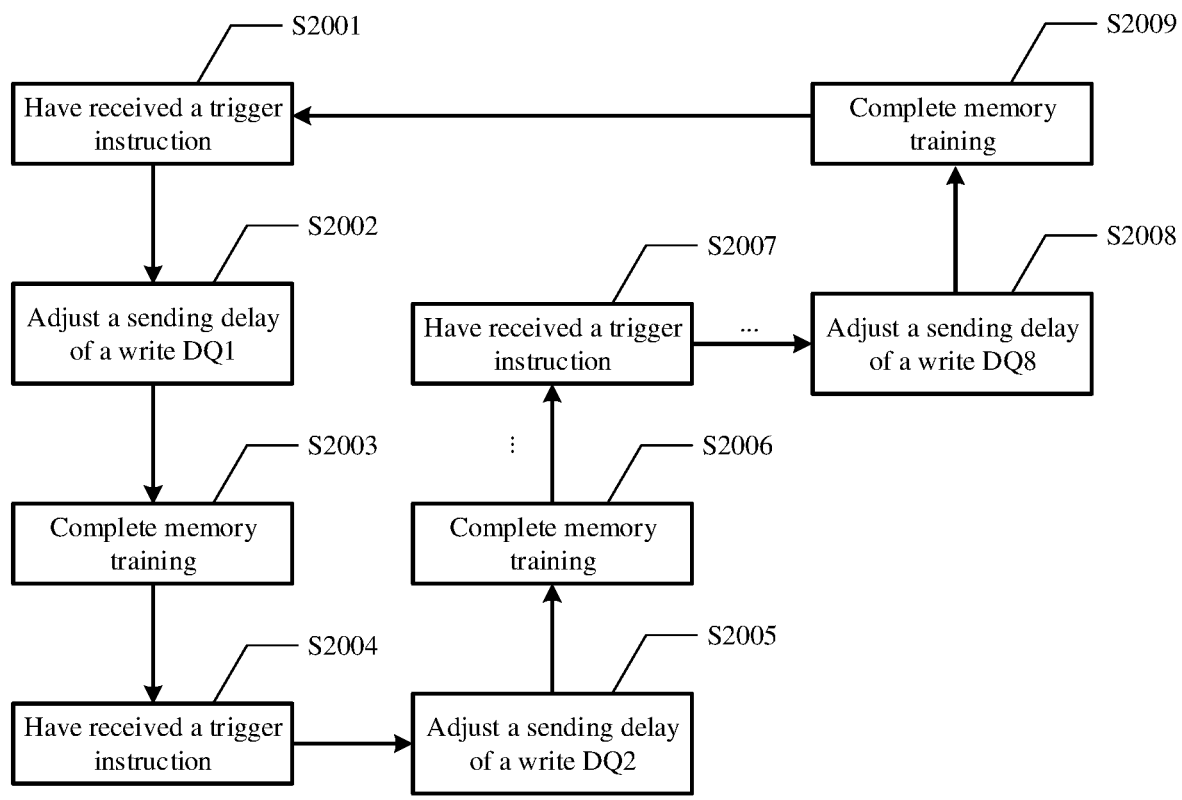
FIG. 20 is a schematic diagram of a round-robin rule according to an embodiment of this application.

After a trigger instruction is received next time (that is, returning from S2009 to S2001 as shown in FIG. 20), the memory controller 111 determines, according to the round-robin rule, that the sending delay of the write DQ0 and the receiving delay of the read DQ0 need to be adjusted, and further adjusts the sending delay of the write DQ0, so that relative timing positions between the write DQ0 and the write DQS are aligned. In addition, the memory controller 111 adjusts the receiving delay of the read DQ0, so that relative timing positions between the read DQ0 and the read DQS are aligned (S2002).

The foregoing describes the memory training method provided in this application from the perspective of method embodiments. It may be understood that, to implement the foregoing functions, the memory controller may include a hardware circuit and/or a software module for performing the corresponding functions. A person skilled in the art should easily be aware that, in combination with the steps of the examples described in embodiments disclosed in this specification, this application may be implemented by hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of the present invention.

Figure 21:
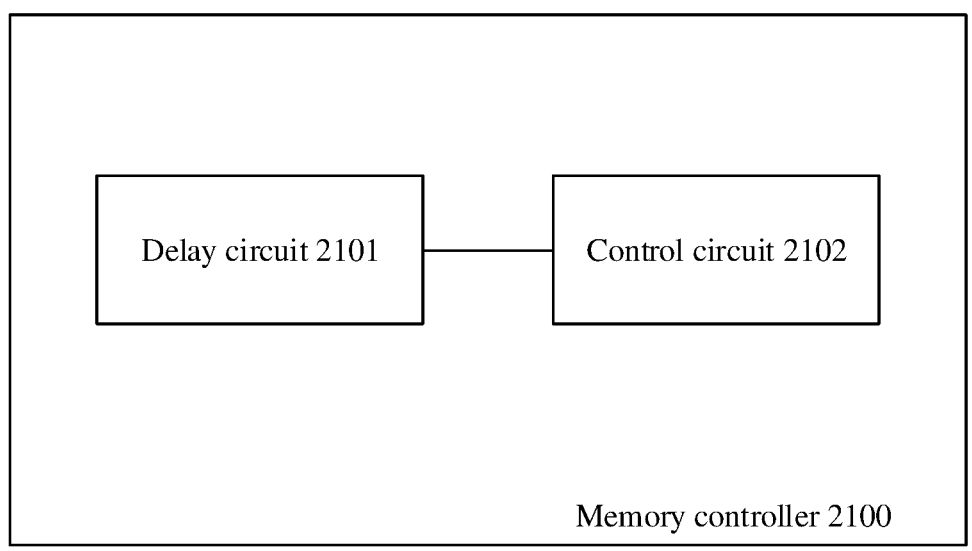
FIG. 21 is a schematic diagram of a structure of a memory controller according to an embodiment of this application.

For example, embodiments of this application provide a memory controller. The memory controller may implement the memory training method provided in any one of the foregoing embodiments. As shown in FIG. 21, the memory controller 2100 mainly includes a delay circuit 2101 and a control circuit 2102. The memory controller 2100 may be used as the memory controller 111 shown in FIG. 1.

In a possible implementation, the delay circuit 2101 may generate a transmission delay of a DQS under the control of the control circuit 2102. The delay circuit 2101 adjusts the transmission delay of the DQS, and may adjust a phase of the DQS.

For example, the delay circuit 2101 may include a register and a phase adjuster. The phase adjuster may generate the transmission delay of the DQS. The register may be used as a control interface for the control circuit 2102 to control the delay circuit 2101. In this way, the control circuit 2102 may adjust the transmission delay of the DQS by controlling the delay circuit 2101 through the register.

The control circuit 2102 may be a logic circuit that has a certain logic operation capability, and may control the delay circuit 2101 to adjust the transmission delay of the DQS, so that the memory controller 2100 can perform the method for performing memory training by adjusting a transmission delay of a DQS in embodiments of this application.

In a specific example, the control circuit 2102 may control the delay circuit 2101 to keep transmission delays of N DQs unchanged, control the delay circuit 2101 to adjust a transmission delay of a DQS, and thus determine a maximum DQS transmission delay and/or a minimum DQS transmission delay of the DQS when all data carried in the N DQs is correctly transmitted. The foregoing N DQs and DQS are all transmitted from the memory controller 2100 to the memory chip, or all transmitted from the memory chip to the memory controller 2100, and the DQS may trigger the receiving end of the N DQs to identify level statuses of the N DQs. When the N DQs and the DQS are transmitted from the memory controller 2100 to the memory chip, the receiving end of the N DQs is the memory chip. When the N DQs and the DQS are transmitted from the memory chip to the memory controller 2100, the receiving end of the N DQs is the memory controller 2100. The control circuit 2102 controls the delay circuit 2101 to adjust the transmission delay of the DQS to a target DQS transmission delay between the maximum DQS transmission delay and the minimum DQS transmission delay. An interval between the target DQS transmission delay and the maximum DQS transmission delay is not less than a target hold time applicable to the receiving end, and/or an interval between the target DQS transmission delay and the minimum DQS transmission delay is not less than a target setup time applicable to the receiving end.

Specifically, the N DQs and the DQS may be transmitted from the memory controller 2100, and the transmission delay of the DQS is a sending delay of the DQS. In this case, the control circuit 2102 may control the delay circuit 2101 to adjust the sending delay of the DQS to a target DQS sending delay between a maximum DQS sending delay and a minimum DQS sending delay.

The N DQs and the DQS may also be transmitted from the memory chip to the memory controller 2100, and the transmission delay of the DQS is a receiving delay of the DQS. In this case, the control circuit 2102 may control the delay circuit 2101 to adjust the receiving delay of the DQS to a target DQS receiving delay between a maximum DQS receiving delay and a minimum DQS receiving delay.

Next, a manner in which the control circuit 2102 determines a minimum DQS transmission delay is further described:

In a possible implementation, the control circuit 2102 may control the delay circuit 2101 to gradually reduce the transmission delay of the DQS starting from an initial DQS transmission delay until an error occurs in transmission of data carried in at least one DQ. In this case, the transmission delay of the DQS may be used as a minimum DQS transmission delay.

In another possible implementation, the control circuit 2102 may control the delay circuit 2101 to reduce the transmission delay of the DQS to a first DQS transmission delay. An interval between the first DQS transmission delay and the transmission delay of the DQS before reduction is a target setup time applicable to the receiving end. When an error occurs in transmission of data carried in at least one DQ, the control circuit 2102 controls the delay circuit 2101 to gradually increase the transmission delay of the DQS, and determine that the corresponding transmission delay of the DQS is a minimum DQS transmission delay of the DQS when all data carried in the N DQs is correctly transmitted.

The transmission delay of the DQS before reduction may be an initial DQS transmission delay, for example, may be the transmission delay of the DQS before the control circuit 2102 starts to perform this memory training or when the control circuit starts to perform this memory training.

For example, when controlling the delay circuit 2101 to gradually increase the transmission delay of the DQS, the control circuit 2102 may control the delay circuit 2101 to gradually increase the transmission delay of the DQS in a manner of increasing a first DQS adjustment amplitude each time. The first DQS adjustment amplitude is less than the target setup time applicable to the receiving end. For example, the first DQS adjustment amplitude may be a minimum adjustment amplitude of the transmission delay of the DQS by the delay circuit 2101.

Next, a manner in which the control circuit 2102 determines a maximum DQS transmission delay is further described:

In a possible implementation, the control circuit 2102 may control the delay circuit 2101 to gradually increase the transmission delay of the DQS starting from an initial DQS transmission delay until an error occurs in transmission of data carried in at least one DQ. In this case, the transmission delay of the DQS may be used as a maximum DQS transmission delay.

In another possible implementation, the control circuit 2102 may control the delay circuit 2101 to increase the transmission delay of the DQS to a second DQS transmission delay. An interval between the second DQS transmission delay and the transmission delay of the DQS before increase is a target hold time applicable to the receiving end. When an error occurs in transmission of data carried in at least one DQ, the control circuit 2102 controls the delay circuit 2101 to gradually reduce the transmission delay of the DQS, and determine that the corresponding transmission delay of the DQS is a maximum DQS transmission delay of the DQS when all data carried in the N DQs is correctly transmitted.

The transmission delay of the DQS before increase may be an initial DQS transmission delay, for example, may be the transmission delay of the DQS before the control circuit 2102 starts to perform this memory training or when the control circuit starts to perform this memory training.

For example, when controlling the delay circuit 2101 to gradually reduce the transmission delay of the DQS, the control circuit 2102 may control the delay circuit 2101 to gradually reduce the transmission delay of the DQS by reducing a second DQS adjustment amplitude each time. The second DQS adjustment amplitude is less than the target hold time applicable to the receiving end. For example, the second DQS adjustment amplitude may be a minimum adjustment amplitude of the transmission delay of the DQS by the delay circuit 2101.

In another possible implementation, the delay circuit 2101 may generate a transmission delay of a first DQ under the control of the control circuit 2102. The delay circuit 2101 adjusts the transmission delay of the first DQ, and may adjust a phase of the first DQ.

For example, the delay circuit 2101 may include a register and a phase adjuster. The phase adjuster may generate the transmission delay of the first DQ. The register may be used as a control interface for the control circuit 2102 to control the delay circuit 2101. In this way, the control circuit 2102 may adjust the transmission delay of the first DQ by controlling the delay circuit 2101 through the register.

The control circuit 2102 may be a logic circuit that has a certain logic operation capability, and may control the delay circuit 2101 to adjust the transmission delay of the first DQ, so that the memory controller 2100 can perform the method for performing memory training by adjusting a transmission delay of a first DQ in embodiments of this application.

In a specific example, the control circuit 2102 may control the delay circuit 2101 to keep a transmission delay of a DQS unchanged, control the delay circuit 2101 to adjust the transmission delay of the first DQ, and thus determine a maximum DQ transmission delay and/or a minimum DQ transmission delay of the first DQ when data carried in the first DQ is correctly transmitted. The DQS and the first DQ are both transmitted from the memory controller 2100 to the memory chip, or both transmitted from the memory chip to the memory controller 2100. The DQS may trigger the receiving end of the first DQ to identify a level status of the first DQ. When the first DQ and the DQS are transmitted from the memory controller 2100 to the memory chip, the receiving end of the first DQ is the memory chip. When the first DQ and the DQS are transmitted from the memory chip to the memory controller 2100, the receiving end of the first DQ is the memory controller 2100. The control circuit 2102 controls the delay circuit 2101 to adjust the transmission delay of the first DQ to a target DQ transmission delay between the maximum DQ transmission delay and the minimum DQ transmission delay. An interval between the target DQ transmission delay and the maximum DQ transmission delay is not less than a target setup time applicable to the receiving end, and/or an interval between the target DQ transmission delay and the minimum DQ transmission delay is not less than a target hold time applicable to the receiving end.

The DQS may correspond to N DQs, and the first DQ is located in the N DQs. Before controlling the delay circuit 2101 to keep the transmission delay of the DQS unchanged and controlling the delay circuit 2101 to adjust the transmission delay of the first DQ, the control circuit 2102 may further first determine, according to a round-robin rule, a next DQ following a DQ on which memory training is previously completed in the N DQs as the first DQ.

Specifically, the first DQ and the DQS may be both transmitted from the memory controller 2100 to the memory chip, and the transmission delay of the first DQ is a sending delay of the first DQ. In this case, the control circuit 2102 may control the delay circuit 2101 to adjust the sending delay of the first DQ to a target DQ sending delay between a maximum DQ sending delay and a minimum DQ sending delay.

The first DQ and the DQS may also be both transmitted from the memory chip to the memory controller 2100, and the transmission delay of the first DQ is a receiving delay of the first DQ. In this case, the control circuit 2102 may control the delay circuit 2101 to adjust the receiving delay of the first DQ to a target DQ receiving delay between a maximum DQ receiving delay and a minimum DQ receiving delay.

Next, a manner in which the control circuit 2102 determines a minimum DQ transmission delay is further described:

In a possible implementation, the control circuit 2102 may control the delay circuit 2101 to gradually reduce the transmission delay of the first DQ starting from an initial DQ transmission delay until an error occurs in transmission of data carried in the first DQ. In this case, the transmission delay of the first DQ may be used as a minimum DQ transmission delay.

In another possible implementation, the control circuit 2102 may control the delay circuit 2101 to reduce the transmission delay of the first DQ to a first DQ transmission delay. An interval between the first DQ transmission delay and the transmission delay of the first DQ before reduction is a target hold time applicable to the receiving end. When an error occurs in transmission of data carried in the first DQ, the control circuit 2102 may control the delay circuit 2101 to gradually increase the transmission delay of the first DQ, and determine that the corresponding transmission delay of the first DQ is a minimum DQ transmission delay when data carried in the first DQ is correctly transmitted.

The transmission delay of the first DQ before reduction may be an initial DQ transmission delay, for example, may be the transmission delay of the first DQ before the control circuit 2102 starts to perform this memory training or when the control circuit starts to perform this memory training.

For example, when gradually increasing the transmission delay of the first DQ, the control circuit 2102 may control the delay circuit 2101 to gradually increase the transmission delay of the first DQ in a manner of increasing a first DQ adjustment amplitude each time. The first DQ adjustment amplitude is less than the target hold time applicable to the receiving end. For example, the first DQ adjustment amplitude is a minimum adjustment amplitude of the transmission delay of the first DQ by the delay circuit 2101.

Next, a manner in which the control circuit 2102 determines a maximum DQ transmission delay is further described:

In a possible implementation, the control circuit 2102 may control the delay circuit 2101 to gradually increase the transmission delay of the first DQ starting from an initial DQ transmission delay until an error occurs in transmission of data carried in the first DQ. In this case, the transmission delay of the first DQ may be used as a maximum DQ transmission delay.

In another possible implementation, the control circuit 2102 may control the delay circuit 2101 to increase the transmission delay of the first DQ to a second DQ transmission delay. An interval between the second DQ transmission delay and the transmission delay of the first DQ before increase is a target hold time applicable to the receiving end. When an error occurs in transmission of data carried in the first DQ, the control circuit 2102 may control the delay circuit 2101 to gradually reduce the transmission delay of the first DQ, and determine that the corresponding transmission delay of the first DQ is a maximum DQ transmission delay when data carried in the first DQ is correctly transmitted.

The transmission delay of the first DQ before increase may be an initial DQ transmission delay, for example, may be the transmission delay of the first DQ before the control circuit 2102 starts to perform this memory training or when the control circuit starts to perform this memory training.

For example, the control circuit 2102 may control the delay circuit 2101 to gradually reduce the transmission delay of the first DQ by reducing a second DQ adjustment amplitude each time. The second DQ adjustment amplitude is less than the target setup time applicable to the receiving end. For example, the second DQ adjustment amplitude may be a minimum adjustment amplitude of the transmission delay of the first DQ by the delay circuit 2101.

Based on the same technical concept, embodiments of this application further provide a processor. The processor may be the processor 11 shown in FIG. 1. For example, the processor 11 includes a processor core 112 and a memory controller 111. For specific implementations of the processor core 112 and the memory controller 111, reference may be made to the foregoing embodiments. Details are not described herein again.

Based on a same technical concept, embodiments of this application further provide an electronic device. The electronic device may be the electronic device 10 shown in FIG. 1, and includes a processor 11 and a memory chip 12. The memory chip 12 is connected to a memory controller 111 in the processor 11. For specific implementation of the electronic device, reference may be made to the foregoing embodiments. Details are not described herein again.

Figure 22:
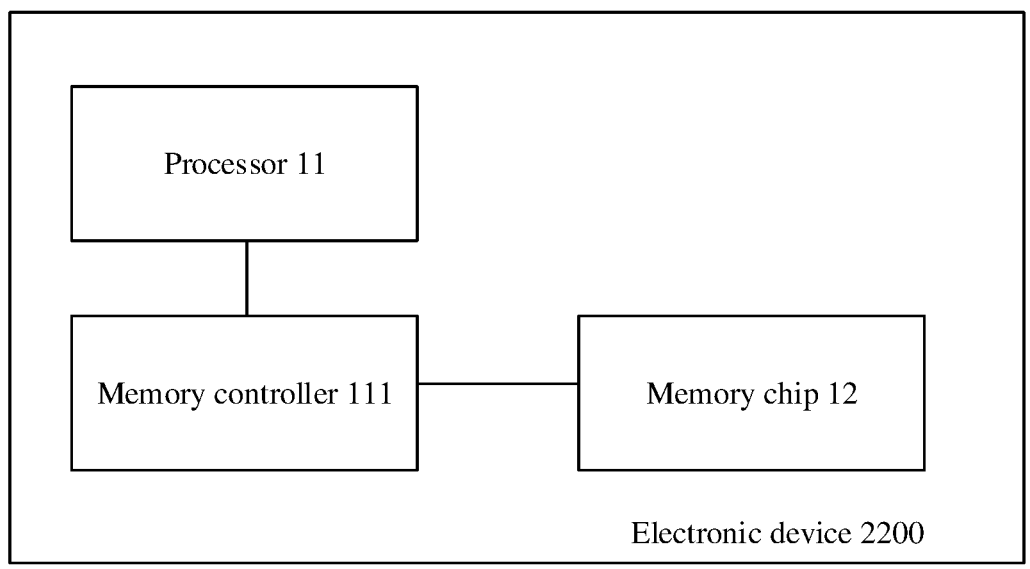
FIG. 22 is a schematic diagram of a structure of an electronic device according to an embodiment of this application.

Based on a same technical concept, embodiments of this application further provide an electronic device. As shown in FIG. 22, the electronic device 2200 mainly includes a processor 11, a memory chip 12, and a memory controller 111. The memory controller 111 may be the memory controller provided in any one of the foregoing embodiments. The memory controller 111 is connected to the processor 11 and the memory chip 12, respectively.

The processor 11 may send a trigger instruction to the memory controller 111. After receiving the trigger instruction, the memory controller 111 may perform the memory training method provided in embodiments of this application.

For example, the processor 11 may send a trigger instruction to the memory controller 111 when determining that a difference between a current ambient temperature and a historical ambient temperature exceeds a temperature fluctuation threshold. The historical ambient temperature is an ambient temperature at which the processor sends the trigger instruction previously.

For another example, the processor may send a trigger instruction to the memory controller 111 when determining that a time interval between a current time point and a time point at which the trigger instruction is previously sent exceeds a time threshold.

A person skilled in the art should understand that the embodiments of this application may be provided as a method, a system, or a computer program product. Therefore, this application may use a form of a hardware-only embodiment, a software-only embodiment, or an embodiment with a combination of software and hardware. In addition, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or processors of other programmable data processing devices to generate a machine, so that an apparatus for implementing functions specified in one or more flows of the flowcharts and/or one or more blocks of the block diagrams is generated via instructions executed by the computers or the processors of the other programmable data processing devices.

The computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

The computer program instructions may alternatively be loaded onto a computer or another programmable data processing device, so that a series of operations and steps are performed on the computer or the another programmable device, so that computer-implemented processing is generated. Therefore, the instructions executed on the computer or the another programmable device provide steps for implementing a specific function in one or more procedures in the flowcharts and/or in one or more blocks in the block diagrams.

It is clear that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A memory training method, comprising:
keeping, by a memory controller, transmission delays of N data signals (DQs) unchanged while adjusting a transmission delay of a data strobe signal (DQS), and determining a maximum DQS transmission delay and/or a minimum DQS transmission delay of the DQS when all data carried in the N DQs is correctly transmitted,
wherein in a first case, the memory controller determines the maximum DQS transmission delay but does not determine the minimum DQS transmission delay, in a second case, the memory controller determines the minimum DQS transmission delay but does not determine the minimum DOS transmission delay, and in a third case, the memory controller determines the minimum DQS transmission delay and the maximum DQS transmission delay,
wherein the N DQs and the DQS are all transmitted by the memory controller to a memory chip, or all transmitted by the memory chip to the memory controller, the DQS is configured to trigger a receiving end of the N DQs to identify level statuses of the N DQs, and when the N DQs and the DQS are transmitted by the memory controller to the memory chip, the receiving end of the N DQs is the memory chip, or when the N DQs and the DQS are transmitted by the memory chip to the memory controller, the receiving end of the N DQs is the memory controller; and adjusting, by the memory controller, the transmission delay of the DQS to a target DQS transmission delay, wherein in the first case, an interval between the target DQS transmission delay and the maximum DQS transmission delay is not less than a target hold time of the receiving end, in the second case, an interval between the target DQS transmission delay and the minimum DQS transmission delay is not less than a target setup time of the receiving end, and in the third case, the target DQS transmission delay is located at an intermediate position between the maximum DQS transmission delay and the minimum DQS transmission delay, wherein the time interval between the target DOS transmission delay and the minimum DOS transmission delay is greater than the target setup time of the receiving end, and the time interval between the target DQS transmission delay and the maximum DQS transmission delay is greater than the target hold time of the receiving end, wherein the target setup time is equal to or greater than a minimum setup time of the receiving end and the target hold time is equal to or greater than a minimum hold time of the receiving end.

2. The memory training method according to claim 1, wherein the N DQs and the DQS are transmitted by the memory controller to the memory chip, the transmission delay of the DQS is a sending delay of the DQS, and the memory controller adjusts the sending delay of the DQS to a target DQS sending delay between a maximum DQS sending delay and a minimum DQS sending delay.

3. The memory training method according to claim 1, wherein the N DQs and the DQS are transmitted by the memory chip to the memory controller, the transmission delay of the DQS is a receiving delay of the DQS, and the memory controller adjusts the receiving delay of the DQS to a target DQS receiving delay between a maximum DQS receiving delay and a minimum DQS receiving delay.

4. The memory training method according to claim 1, wherein the determining a maximum DQS transmission delay and/or a minimum DQS transmission delay of the DQS when all data carried in the N DQs is correctly transmitted comprises determining the minimum DQS transmission delay, and the determining, by the memory controller, the minimum DQS transmission delay of the DQS when all data carried in the N DQs is correctly transmitted comprises:

reducing, by the memory controller, the transmission delay of the DQS to a first DQS transmission delay, wherein an interval between the first DQS transmission delay and the transmission delay of the DQS before the reducing is the target setup time of the receiving end; and when an error occurs in transmission of data carried in at least one DQ of the N DQs, gradually increasing, by the memory controller, the transmission delay of the DQS, and determining that the corresponding transmission delay of the DQS is the minimum DQS transmission delay of the DQS when all data carried in the N DQs is correctly transmitted.

5. The memory training method according to claim 4, wherein the gradually increasing, by the memory controller, the transmission delay of the DQS comprises:

gradually increasing, by the memory controller, the transmission delay of the DQS by increasing a first DQS adjustment amplitude at each of a plurality of time instances, wherein the first DQS adjustment amplitude is less than the target setup time of the receiving end.

6. The memory training method according to claim 5, wherein the first DQS adjustment amplitude is a minimum adjustment amplitude of the transmission delay of the DQS.

7. The memory training method according to claim 1, wherein the determining a maximum DQS transmission delay and/or a minimum DQS transmission delay of the DQS when all data carried in the N DQs is correctly transmitted comprises determining the maximum DQS transmission delay, and the determining, by the memory controller, the maximum DQS transmission delay of the DQS when all data carried in the N DQs is correctly transmitted comprises:

increasing, by the memory controller, the transmission delay of the DQS to a second DQS transmission delay, wherein an interval between the second DQS transmission delay and the transmission delay of the DQS before the increasing is the target hold time of the receiving end; and when an error occurs in transmission of data carried in at least one DQ of the N DQs, gradually reducing, by the memory controller, the transmission delay of the DQS, and determining that the corresponding transmission delay of the DQS is the maximum DQS transmission delay of the DQS when all data carried in the N DQs is correctly transmitted.

8. The memory training method according to claim 7, wherein the gradually reducing, by the memory controller, the transmission delay of the DQS comprises:

gradually reducing, by the memory controller, the transmission delay of the DQS by reducing a second DQS adjustment amplitude at each of a plurality of time instances, wherein the second DQS adjustment amplitude is less than the target hold time of the receiving end.

9. The memory training method according to claim 8, wherein the second DQS adjustment amplitude is a minimum adjustment amplitude of the transmission delay of the DQS.

10. A memory controller, comprising a delay circuit and a control circuit, wherein the delay circuit is configured to generate a transmission delay of a data strobe signal (DQS) under a control of the control circuit; and the control circuit is configured to:

control the delay circuit to keep transmission delays of N data signals (DQs) unchanged while controlling the delay circuit to adjust the transmission delay of the DQS, and determine a maximum DQS transmission delay and/or a minimum DQS transmission delay of the DQS when all data carried in the N DQs is correctly transmitted, wherein in a first case, the memory controller determines the maximum DOS transmission delay but does not determine the minimum DQS transmission delay, in a second case, the memory controller determines the minimum DQS transmission delay but does not determine the minimum DQS transmission delay, and in a third case, the memory controller determines the minimum DOS transmission delay and the maximum DQS transmission delay, wherein the N DQs and the DQS are all transmitted by the memory controller to a memory chip, or all transmitted by the memory chip to the memory controller, the DQS is configured to trigger a receiving end of the N DQs to identify level statuses of the N DQs, and when the N DQs and the DQS are transmitted by the memory controller to the memory chip, the receiving end of the N DQs is the memory chip, or when the N DQs and the DQS are transmitted by the memory chip to the memory controller, the receiving end of the N DQs is the memory controller; and control the delay circuit to adjust the transmission delay of the DQS to a target DQS transmission delay, wherein in the first case, an interval between the target DQS transmission delay and the maximum DQS transmission delay is not less than a target hold time of the receiving end, in the second case, an interval between the target DQS transmission delay and the minimum DQS transmission delay is not less than a target setup time of the receiving end, and in the third case, the target DQS transmission delay is located at an intermediate position between the maximum DQS transmission delay and the minimum DQS transmission delay, wherein the time interval between the target DOS transmission delay and the minimum DOS transmission delay is greater than the target setup time of the receiving end, and the time interval between the target DQS transmission delay and the maximum DQS transmission delay is greater than the target hold time of the receiving end, wherein the target setup time is equal to or greater than a minimum setup time of the receiving end and the target hold time is equal to or greater than a minimum hold time of the receiving end.

11. The memory controller according to claim 10, wherein the N DQs and the DQS are transmitted by the memory controller to the memory chip, the transmission delay of the DQS is a sending delay of the DQS, and the control circuit is configured to:

control the delay circuit to adjust the sending delay of the DQS to a target DQS sending delay between a maximum DQS sending delay and a minimum DQS sending delay.

12. The memory controller according to claim 10, wherein the N DQs and the DQS are transmitted by the memory chip to the memory controller, the transmission delay of the DQS is a receiving delay of the DQS, and the control circuit is configured to:

control the delay circuit to adjust the receiving delay of the DQS to a target DQS receiving delay between a maximum DQS receiving delay and a minimum DQS receiving delay.

13. The memory controller according to claim 10, wherein the control circuit is configured to:

control the delay circuit to reduce the transmission delay of the DQS to a first DQS transmission delay, wherein an interval between the first DQS transmission delay and the transmission delay of the DQS before the reducing is the target setup time of the receiving end; and control, when an error occurs in transmission of data carried in at least one DQ of the N DQ, the delay circuit to gradually increase the transmission delay of the DQS, and determine that the corresponding transmission delay of the DQS is the minimum DQS transmission delay of the DQS when all data carried in the N DQs is correctly transmitted.

14. The memory controller according to claim 13, wherein the control circuit is configured to:

control the delay circuit to gradually increase the transmission delay of the DQS by increasing a first DQS adjustment amplitude at each of a plurality of time instances, wherein the first DQS adjustment amplitude is less than the target setup time of the receiving end.

15. The memory controller according to claim 14, wherein the first DQS adjustment amplitude is a minimum adjustment amplitude of the transmission delay of the DQS.

16. The memory controller according to claim 10, wherein the control circuit is configured to:

control the delay circuit to increase the transmission delay of the DQS to a second DQS transmission delay, wherein an interval between the second DQS transmission delay and the transmission delay of the DQS before the increase is the target hold time of the receiving end; and control, when an error occurs in transmission of data carried in at least one DQ of the N DQs, the delay circuit to gradually reduce the transmission delay of the DQS, and determine that the corresponding transmission delay of the DQS is the maximum DQS transmission delay of the DQS when all data carried in the N DQs is correctly transmitted.

17. The memory controller according to claim 16, wherein the control circuit is configured to:

control the delay circuit to gradually reduce the transmission delay of the DQS by reducing a second DQS adjustment amplitude at each of a plurality of time instances, wherein the second DQS adjustment amplitude is less than the target hold time of the receiving end.

18. The memory controller according to claim 17, wherein the second DQS adjustment amplitude is a minimum adjustment amplitude of the transmission delay of the DQS by the delay circuit.

19. A processor, comprising a processor core and a memory controller comprising a delay circuit and a control circuit, wherein the delay circuit is configured to generate a transmission delay of a data strobe signal (DQS) under the control of the control circuit; and the control circuit is configured to:

control the delay circuit to keep transmission delays of N data signals (DQs) unchanged while controlling the delay circuit to adjust the transmission delay of the DQS, and determine a maximum DQS transmission delay and/or a minimum DQS transmission delay of the DQS when all data carried in the N DQs is correctly transmitted, wherein in a first case, the memory controller determines the maximum DQS transmission delay but does not determine the minimum DOS transmission delay, in a second case, the memory controller determines the minimum DQS transmission delay but does not determine the minimum DQS transmission delay, and in a third case, the memory controller determines the minimum DQS transmission delay and the maximum DQS transmission delay, wherein the N DQs and the DQS are all transmitted by the memory controller to a memory chip, or all transmitted by the memory chip to the memory controller, the DQS is configured to trigger a receiving end of the N DQs to identify level statuses of the N DQs, and when the N DQs and the DQS are transmitted by the memory controller to the memory chip, the receiving end of the N DQs is the memory chip, or when the N DQs and the DQS are transmitted by the memory chip to the memory controller, the receiving end of the N DQs is the memory controller; and control the delay circuit to adjust the transmission delay of the DQS to a target DQS transmission delay, wherein in the first case, an interval between the target DQS transmission delay and the maximum DQS transmission delay is not less than a target hold time of the receiving end, in the second case, an interval between the target DQS transmission delay and the minimum DQS transmission delay is not less than a target setup time of the receiving end, and in the third case, the target DQS transmission delay is located at an intermediate position between the maximum DQS transmission delay and the minimum DQS transmission delay, wherein the time interval between the target DQS transmission delay and the minimum DQS transmission delay is greater than the target setup time of the receiving end, and the time interval between the target DOS transmission delay and the maximum DQS transmission delay is greater than the target hold time of the receiving end, wherein the target setup time is equal to or greater than a minimum setup time of the receiving end and the target hold time is equal to or greater than a minimum hold time of the receiving end, wherein the processor core is configured to send a trigger instruction to the memory controller; and the memory controller is configured to perform memory training after receiving the trigger instruction.

20. An electronic device, comprising a processor comprising a processor core and a memory controller, which comprises a delay circuit and a control circuit, wherein the delay circuit is configured to generate a transmission delay of a data strobe signal (DQS) under the control of the control circuit; and the control circuit is configured to:

control the delay circuit to keep transmission delays of N data signals (DQs) unchanged while controlling the delay circuit to adjust the transmission delay of the DQS, and determine a maximum DQS transmission delay and/or a minimum DQS transmission delay of the DQS when all data carried in the N DQs is correctly transmitted, wherein in a first case, the memory controller determines the maximum DQS transmission delay but does not determine the minimum DOS transmission delay, in a second case, the memory controller determines the minimum DQS transmission delay but does not determine the minimum DQS transmission delay, and in a third case, the memory controller determines the minimum DQS transmission delay and the maximum DQS transmission delay, wherein the N DQs and the DQS are all transmitted by the memory controller to a memory chip, or all transmitted by the memory chip to the memory controller, the DQS is configured to trigger a receiving end of the N DQs to identify level statuses of the N DQs, and when the N DQs and the DQS are transmitted by the memory controller to the memory chip, the receiving end of the N DQs is the memory chip, or when the N DQs and the DQS are transmitted by the memory chip to the memory controller, the receiving end of the N DQs is the memory controller; and control the delay circuit to adjust the transmission delay of the DQS to a target DQS transmission delay, wherein in the first case, an interval between the target DQS transmission delay and the maximum DQS transmission delay is not less than a target hold time of the receiving end, in the second case an interval between the target DQS transmission delay and the minimum DQS transmission delay is not less than a target setup time of the receiving end, and in the third case, the target DOS transmission delay is located at an intermediate position between the maximum DOS transmission delay and the minimum DQS transmission delay, wherein the time interval between the target DOS transmission delay and the minimum DOS transmission delay is greater than the target setup time of the receiving end, and the time interval between the target DQS transmission delay and the maximum DQS transmission delay is greater than the target hold time of the receiving end, wherein the target setup time is equal to or greater than a minimum setup time of the receiving end and the target hold time is equal to or greater than a minimum hold time of the receiving end, wherein the processor core is configured to send a trigger instruction to the memory controller; and the memory controller is configured to perform memory training after receiving the trigger instruction;

and a memory chip, wherein the memory chip is connected to a memory controller in the processor.

* * * * *

UNITED STATES PATENT AND TRADEMARK OFFICE
CERTIFICATE OF CORRECTION

PATENT NO. : 12,174,763 B2
APPLICATION NO. : 18/192019
DATED : December 24, 2024
INVENTOR(S) : Nianbing Li et al.

It is certified that error appears in the above-identified patent and that said Letters Patent is hereby corrected as shown below:

In the Specification

Column 16, Line 33, change "to" to -- $t0$ --;

Column 17, Line 56, change "to" to -- $t0$ --;

Column 37, Line 32, change "\t" to -- $\Delta t$ --;

Column 37, Line 49, change "\t" to -- $\Delta t$ --;

Column 38, Line 4, change "\t" to -- $\Delta t$ --;

In the Claims

Column 52, Claim 1, Line 53, change "DOS" to -- DQS --;

Column 53, Claim 1, Line 14, change "target DOS" to -- target DQS --;

Column 53, Claim 1, Line 15, change "minimum DOS" to -- minimum DQS --;

Column 54, Claim 10, Line 58, change "DOS" to -- DQS --;

Column 54, Claim 10, Line 64, change "DOS" to -- DQS --;

Column 55, Claim 10, Line 23, change "target DOS" to -- target DQS --;

Column 55, Claim 10, Line 24, change "minimum DOS" to -- minimum DQS --;

Column 56, Claim 19, Line 54, change "DOS" to -- DQS --;

Signed and Sealed this
Fourth Day of March, 2025

Coke Morgan Stewart
*Acting Director of the United States Patent and Trademark Office*

CERTIFICATE OF CORRECTION (continued)
U.S. Pat. No. 12,174,763 B2

Column 57, Claim 19, Line 21, change "DOS" to -- DQS --;

Column 57, Claim 20, Line 48, change "DOS" to -- DQS --;

Column 58, Claim 20, Line 27, change "DOS" to -- DQS --;

Column 58, Claim 20, Line 28, change "DOS" to -- DQS --; and

Column 58, Claim 20, Line 30, change "DOS" to -- DQS --.